(12) United States Patent
Paley et al.

(10) Patent No.: US 6,980,001 B2
(45) Date of Patent: Dec. 27, 2005

(54) METHODS & APPARATUS FOR MAGNETIC RESONANCE IMAGING

(75) Inventors: Martyn Paley, Keighly (GB); Kuan Lee, Sheffield (GB)

(73) Assignee: The University of Sheffield at Western Bank, South Yorkshire (GB)

( * ) Notice: Subject to any disclaimer, the term of this patent is extended or adjusted under 35 U.S.C. 154(b) by 54 days.

(21) Appl. No.: 10/441,999

(22) Filed: May 20, 2003

(65) Prior Publication Data

US 2004/0044280 A1 Mar. 4, 2004

Related U.S. Application Data

(63) Continuation-in-part of application No. 10/195,756, filed on Jul. 15, 2002.

(30) Foreign Application Priority Data

May 20, 2002 (GB) .............................. 0211516

(51) Int. Cl.$^7$ ............................... G01V 3/00
(52) U.S. Cl. ..................... 324/318; 324/322
(58) Field of Search ................ 324/320, 319, 324/313, 318, 309, 307, 322; 600/417

(56) References Cited

U.S. PATENT DOCUMENTS 4,843,322 A * 6/1989 Glover ....................... 324/309

(Continued)

FOREIGN PATENT DOCUMENTS

DE          4216969 A1   11/1993

(Continued)

OTHER PUBLICATIONS

Paper by P.M. Jakob, A. Vath, A. Haase entitled "SESAM: Simultaneous Excitation and Simultaneous Acquisition of Multiple MR Tomograms", Physikaiisches Institut, Universitat Wurzburg, D–8700 Wurzburg, FRG.

Primary Examiner—Brij B. Shrivastav
(74) Attorney, Agent, or Firm—Harness, Dickey & Pierce, PLC

(57) ABSTRACT

A parallel magnetic resonance imaging (MRI) apparatus configurable to image a physical entity comprises:

a main magnetic flux source for providing a uniform fixed magnetic field, $B_0$;

an RF array system comprising a plurality of RF coils and receivers, said RF system configured for:

generating rotating RF excitation magnetic fields $B_1$; and receiving RF signals due to precessing nuclear magnetization on multiple spatially distinct radio frequency coils and associated receiver channels, said RF system being configured to operate in accordance with a $B_1$ sensitivity encoding technique;

a control processor for controlling imaging functionality, collecting image data and effecting data processing of the captured image data the control processor being configured with post processing capability for the $B_1$ sensitivity encoding technique;

an image display means for displaying processed image data as resultant images; and an auxiliary magnetic field means capable of producing at least one auxiliary uniform $B_0$ step magnetic field imaging region within the main $B_0$ magnetic field;

wherein:

the auxiliary magnetic field, means is configured to operate in combination with the RF coil system and the $B_1$ sensitivity encoding technique, the imaging apparatus thereby providing faster image acquisition than that attributed to the speed up factor provided solely by the $B_1$ sensitivity encoding technique.

The invention also includes a method of imaging using this apparatus.

Furthermore, the invention also includes a method and apparatus for three-dimensional MR imaging using a 1D Multiple Acquisition Micro $B_0$ array coupled with a 2D Multiple Acquisition Micro $B_0$ array.

37 Claims, 58 Drawing Sheets

| U.S. PATENT DOCUMENTS | | | |
|---|---|---|---|
| 5,800,353 A | 9/1998 | McLaurin, Jr. | 600/417 |
| 6,054,858 A | 4/2000 | Dumoulin et al. | 324/322 |
| 6,184,684 B1 | 2/2001 | Dumoulin et al. | 324/318 |
| 6,291,998 B1 | 9/2001 | Heid | 324/320 |

| FOREIGN PATENT DOCUMENTS | | |
|---|---|---|
| DE | 4216969 | 11/1993 |
| EP | 0637756 | 2/1995 |

* cited by examiner (a)                    (b)

(a)            (b)

| a 11 | b 5 | c -14 | d -3 | e 24 |
|---|---|---|---|---|
| f -16 | g 19 | h 6 | i 21 | j -17 |
| k -5 | l -13 | m -18 | n -7 | o 0 |
| p 16 | q 2 | r 17 | s 20 | t 11 |
| u 5 | v 12 | w 23 | x -7 | y -7 |

Fig. 19

| coil | rank | calculated field (arbitrary units) |
|---|---|---|
| e | 1 | 25.7949 |
| i | 2 | 23.2786 |
| g | 3 | 21.5882 |
| w | 4 | 19.4596 |
| s | 5 | 17.9589 |
| p | 6 | 15.4608 |
| r | 7 | 13.5917 |
| a | 8 | 11.8704 |
| t | 9 | 9.5577 |
| v | 10 | 7.1625 |
| h | 11 | 5.2444 |
| b | 12 | 3.4140 |
| u | 13 | 1.1077 |
| o | 14 | -0.1183 |
| q | 15 | -2.6595 |
| k | 16 | -4.6044 |
| d | 17 | -6.6075 |
| y | 18 | -8.6557 |
| n | 19 | -10.7666 |
| x | 20 | -12.6394 |
| l | 21 | -14.2835 |
| c | 22 | -16.4831 |
| f | 23 | -19.1057 |
| m | 24 | -20.9826 |
| j | 25 | -22.5566 |

| coil | rank | measured peak position (pixel) | expected peak position |
|---|---|---|---|
| e | 1 | 220 | 222.845 |
| i | 2 | 205 | 213.211 |
| g | 3 | 205 | 206.739 |
| w | 4 | 204 | 198.589 |
| s | 5 | 189 | 192.843 |
| p | 6 | 188 | 183.278 |
| r | 7 | 179 | 176.122 |
| a | 8 | 172 | 169.531 |
| t | 9 | 157 | 160.676 |
| v | 10 | 158 | 151.506 |
| h | 11 | 144 | 144.162 |
| b | 12 | 141 | 137.150 |
| u | 13 | 136 | 128.323 |
| o | 14 | 114 | 123.629 |
| q | 15 | 123 | 113.899 |
| k | 16 | 106 | 106.453 |
| d | 17 | 98 | 98.783 |
| y | 18 | 82 | 90.941 |
| n | 19 | 83 | 82.859 |
| x | 20 | 74 | 75.688 |
| l | 21 | 70 | 69.393 |
| c | 22 | 57 | 60.971 |
| f | 23 | 55 | 50.930 |
| m | 24 | 43 | 43.744 |
| j | 25 | 37 | 37.717 |

| Example 7 Loop Interleaved MAMBA design Coil radius = 17.5 mm | | | | | | | |
|---|---|---|---|---|---|---|---|
| Set 1 | | | | | | | |
| Loop Number | 1 | 2 | 3 | 4 | 5 | 6 | 7 |
| Current Density j (a.u.) | 1 | 1.22 | 1.49 | 1.82 | 2.22 | 2.72 | 3.32 |
| Approximate Number of Turns | 5 | 6 | 7 | 9 | 11 | 13 | 16 |
| Axial Position (mm) | 0 | 24.3 | 48.6 | 72.9 | 97.2 | 121.5 | 145.8 |
| Set 2 | | | | | | | |
| Interleaved Loop Number | 1 | 2 | 3 | 4 | 5 | 6 | 7 |
| Current Density j (a.u.) | 1.09 | 1.33 | 1.63 | 1.99 | 2.43 | 2.97 | 3.62 |
| Approximate Number of Turns | 6 | 7 | 8 | 10 | 12 | 15 | 18 |
| Axial Position mm | 12.1 | 36.4 | 60.7 | 85 | 109.3 | 133.6 | 157.9 |

Fig. 36

Axial Distance (mm)

Axial Distance (mm)

dF$_0$ (kHz)

METHODS & APPARATUS FOR MAGNETIC RESONANCE IMAGING

This is a continuation-in-part of U.S. patent application Ser. No. 10/195,756, filed Jul. 15, 2002 and claims priority on GB 0211516.0 filed May 20, 2002.

FIELD OF THE INVENTION

The present invention relates to methods and apparatus for magnetic resonance imaging (MRI) of a physical entity. The invention more particularly relates to improved MRI methods and apparatus that provide fast imaging and particularly, but not exclusively the invention relates to parallel MRI and three-dimensional MRI.

BACKGROUND TO THE INVENTION

It is known in the field of nuclear magnetic resonance (NMR) imaging that it is desirable to reduce image scan times. In order to generate an NMR signal the net magnetic moment (M) of a sample comprising many nuclei is manipulated with suitable RF pulses. A variety of commonly used pulse sequences are known such as free induction decay (FID), inversion recovery and the well-known spin-echo sequence. In traditional magnetic resonance imaging systems a uniform magnetic field $B_0$ is applied across the physical entity being imaged. By physical entity it is meant any object or other entity that is the subject of imaging such as for example a part of the human or animal body, fluid flow in the human or animal body or an industrial fluid flow. Typically a super conducting magnet is employed and uniformity in the magnetic field is achieved using a plurality of shim coils, which superimpose small high-order magnetic fields on $B_0$, proportional to x, y, z, $z^2$, $z^2y$, etc.

The main components of a prior art magnetic resonance imaging system, as used in the medical field, are illustrated schematically in FIG. 1. The x, y, z gradient coils 101 and power supply 102 are provided to apply a gradient field along the length of an imaging chamber positioned in the field of the super conducting magnet 103, the magnet being powered by a dedicated power supply means 104. The gradient field thereby changes the field along the length (z axis) of the imaging chamber. A radio-frequency (RF) coil system 105 is provided along with transmitter circuitry and a power supply 106 to generate a second, lower magnitude, magnetic field of flux density $B_1$ oriented in the x y plane and rotating at the Larmor angular frequency ($\omega_0$) The net magnetic moment (M) of a region, along the length of the imaging chamber, corresponding to the resonance frequency at the given region will thus experience a second torque. The angle that M moves through from the z-axis will depend on the magnitude and duration of $B_1$ The flux density $B_1$ has a frequency in the radio frequency range for NMR measurements and a 90° RF pulse is one that turns M through 90° into the x y plane. The x y component of M is a rotating RF field that can be detected with a suitable coil (e.g. coil 104 or a further coil) and appropriately configured electronic signal detection circuitry 107. Additionally in the known MRI apparatus there are provided shim coils 108 powered by power supply means 109.

The known imaging apparatus comprising components 101 to 109 is controlled by a central processing unit 110 (CPU). However a special processor, the sequence controller 111, is configured to effect given imaging sequences to be undertaken in respect of a particular physical entity being imaged. Sequence controller 111 thus affects control over the gradient coils 101, shim coils 108 and the RF coil (or system of coils) 105. The RF coil system may suitably comprise a multiple channel $B_1$ coil array with post-processing software for reconstructing from reduced k-space data. Upon an image of a physical entity being captured the central processing unit 110 is configured to process the received image data in accordance with the predetermined-processing regime implemented. Typically a Fourier transformation is performed upon the data and the resultant image displayed on a display such as display 112. Alternatives to Fourier transformation processing exist such as, for example, the method of 'projection reconstruction' which has become used less and less since the first commercial scanners were in use.

FIG. 2 schematically illustrates a known magnetic resonance imaging chamber 201, comprising sample placement region 202, super conducting coil arrangement 203 and super conducting magnet power supply connection means 204. As shown in FIG. 2 a uniform magnetic field $B_0$ exists along the longitudinal axis (z axis) of the super conducting magnet coil arrangement 203.

To obtain an MR image of a slice through a given physical entity, the physical entity must be positioned in the uniform magnetic field to enable resonance to occur. Following placement in the magnetic field a radio frequency pulse is applied at the frequency that corresponds to the given location for which an image slice is required. The physical entity, upon being exposed to the radio frequency pulse, thereby absorbs and re-emits the signal, the signal being detected by the electronic detection circuitry 107 shown schematically in FIG. 1. As discussed above, the frequency at which resonance occurs depends on the magnetic field at a particular location. Thus if the magnetic field changes linearly along its length then the resonant frequency for the protons of a given sample also changes linearly. Thus to excite a particular slice in a given sample physical entity a RF pulse must be generated at the correct offset from the resonant frequency (F) for the protons (0, F, 2F, 3F, 4F etc.) which corresponds to the particular slice of the physical entity for which an image is required. FIG. 3 schematically illustrates a uniform magnetic field generated by the prior art-imaging chamber shown in FIG. 1 and FIG. 2 and additionally depicts an applied gradient 302; the position of a slice in the object being imaged is indicated at 303 as being equivalent to an RF pulse of resonance frequency 3F.

In order to detect a nuclear magnetic resonance signal it is essential that several conditions are met as follows:

1. A sample containing nuclei is polarised in a static magnetic field known as the $B_0$ field creating a net nuclear magnetization.
2. A radio frequency field pulse is applied with a certain frequency, amplitude and duration orthogonally to $B_0$ in order to perturb the nuclear magnetization away from alignment with the main magnetic field. This field is conventionally known as the $B_1$ field and is an oscillating field at a specific frequency determined by the property of the specific nuclear spin species under investigation, known as the magnetogyric ratio. The specific frequency required is related to the static magnetic field strength through a linear relationship known as the Larmor equation, the proportionality constant between frequency and field being the magnetogyric ratio.
3. The $B_1$ field is generated by a resonant transmitter coil tuned exactly to the Larmor frequency and with its field direction perpendicular to $B_0$.
4. The amplitude or duration of the $B_1$ radio frequency pulse is adjusted typically to tip the nuclear magnetisation through 90 degrees from alignment with the direction of $B_0$.

5. Following termination of the pulse, the nuclear magnetisation is in a plane orthogonal to the main magnetic field and is precessing at the Larmor frequency. The rotating nuclear magnetisation induces a weak signal in a resonant detection receiver coil (which can be the same coil as the transmitter coil) also tuned to the Larmor frequency. This signal from the nuclei is about a million times weaker than the signal originally transmitted by the radio frequency system.
6. The nuclear magnetisation undergoes a process of dephasing that results in a signal loss characterised by a decay time constant known as T2 (T2*).
7. Over a longer period the nuclear magnetization, free from the driving torque of the radio frequency pulse, re-aligns to its equilibrium position parallel to the direction of $B_0$. This process is known as longitudinal magnetisation recovery and is characterised by a typical time constant T1.

In traditional 2D Fourier Transform MR imaging with phase encoding, following selection of a given slice, the next step is to encode the selected slice in order to obtain required in plane resolution and thereby to enable an image to be generated. To enable the slice to be encoded further gradients therefore have to by applied, these being known as the read (frequency) encode gradient and the phase encode gradient, these gradients being orthogonal to each other. Gradient switching, that is switching from read encode to phase encode and so on, of this kind is time consuming since it involves switching the read gradient on and then off and then switching the phase gradient on and then off etc. until the required image is acquired, processed and displayed accordingly.

In the known MR imaging approach described above there is therefore a problem in that if more than one frequency range is excited at a given time the detector 107 receives signals which the central processing unit 110 is unable to unscramble. In other words a superposition of images arises if an attempt is made to try and image more than one slice at a given time. However it is known to attempt to excite multiple slices simultaneously.

A first group of methods of acquiring slices in parallel, which have been widely used, is based around the idea of Hadamard encoding. Relevant disclosures in this respect include:

Souza S P, Szumowski J, Dumoulin C L, Plewes D P, Glover G. SIMA: Simultaneous multi-slice acquisition of MR images by Hadamard—encoded excitation, J Comput Assist Tomogr 1988;12:1026–30;

Muller S. Multifrequency selective RF pulses for multi-slice MR imaging, Magn Reson Med; 1988, 6:364:71; and Glover G, Shimawaka A POMP (Phase offset multi-planar) imaging: a new high efficiency technique. Proc SMRM7[th] Annual Meeting, 1988, 241).

These Hadamard methods use phase cycling over multiple excitations to present aliasing artefacts, thus lengthening overall scan time when signal to noise ratio is adequate to avoid averaging. Thus use of Hadamard pulses in this way usually requires a number of averages for phase cycling due to the need for image additions and subtractions to remove aliasing. These methods have been found to result in longer overall scan times and motion sensitivity. By motion sensitivity it is meant, in a medical imaging context for example, patient movement, since it is difficult in many circumstances to expect a patient to remain still for a sufficient time period whilst a given image is being acquired.

A further prior art method of obtaining multiple image slices is described by Larkman D J et al, J. Magn. Reson. Imaging 2001; 13(2): 313–317. Larkman's method concerns use of multicoil arrays for separation of signals from multiple slices excited simultaneously and although it permits simultaneous slice-imaging it utilizes a number of RF coils and a number of expensive receiver channels resulting in complex computer processing requirements.

A further prior art simultaneous slice method is disclosed by J B Weaver under the title "Simultaneous multislice acquisition of MR images", in the journal Magn. Reson. Med. 1988; 8: 275–284. Weaver's method uses a slice selection gradient applied during readout to separate slices with frequency over sampling, but the method suffers from severe image distortion and blurring artefact due to oblique angulation of the image readout gradient.

A further parallel slice method concerns using a stepped magnetic field as is disclosed by Jakob P, Vath A and Haase A in German patent publication number DE 4216969. This method concerns a Simultaneous Excitation Simultaneous Acquisition Method known by the acronym "SESAM". However the method disclosed does not incorporate any other form of parallel imaging.

Other well researched methods of reducing scan time are the parallel $B_1$ coil array methods such as SMASH or SENSE (SENSitivity Encoding) developed recently by Sodickson et al. and Pruessman et al. based on earlier work. SENSE, for example, is a type of parallel imaging method concerning radio frequency sensitivity encoding with reduced phase views. Relevant references include:

1. Ra J B, Rim C Y. Fast imaging using sub-encoding using data sets from multiple detectors. Magn Reson Med. 1993; 30: 142–5.
2. Hutchison M, Raff U. Fast MRI data acquisition using multiple detectors. Magn Reson Med 1988; 6: 87–91.
3. Sodickson D K, Manning W J. Simultaneous acquisition of spatial harmonics (SMASH): fast imaging with radio frequency coil arrays. Magn Reson Med. 1997; 38(4): 591–603.
4. Pruessmann K P, Weiger M, Scheidegger M B, Boesiger P. SENSE: sensitivity encoding for fast MRI. Magn Reson Med. 1999 November; 42(5): 952–62.
5. Pruessmann K P, Weiger M, Bornert P, Boesiger P. Advances in sensitivity encoding with arbitrary k-space trajectories. Magn Reson Med. 2001; 46(4): 638–51.

These SMASH/SENSE type prior art methods use phase under sampling to reduce scan time in combination with reconstruction based on receiver coil sensitivity profiles to remove resulting fold-over phase encode aliasing artefacts. SENSE can also be used to produce parallel slice images, but with the need for many more receiver channels if in-plane encoding is also required (Larkman D J, Hajnal J V, Herlihy A H, Couts G A, Young I R and Ehnholm G. Use of multicoil arrays for separation of signal from multiple slices simultaneously excited. J Magn Reson Imaging. 2001; 13(2): 313–317).

In view of the above there is clearly a need to improve the known magnetic resonance apparatus and methods of MRI imaging so as to enable multiple slices through a given physical entity being imaged to be obtained simultaneously and thereby increase the speed of obtaining required images.

Similarly in some applications concerning multi-dimensional MR imaging there is a need to be able to read out images in a single imaging operation wherein time consuming switching of the one or more gradient fields is no longer required or at least is substantially reduced.

SUMMARY OF THE INVENTION

One object of the present invention is to provide an improved parallel MRI method and apparatus to enable multi-slice magnetic resonance images to be obtained substantially simultaneously whilst decreasing image acquisition time as compared with existing MRI systems that employ a $B_1$ sensitivity encoding technique such as SMASH or SENSE.

Another object of the present invention is to provide a parallel MRI method and apparatus that uses a combined $B_0$ and $B_1$ encoding system.

A further object of the present invention is to provide an MRI method and apparatus for use in providing three-dimensional imaging.

In accordance with a first aspect of the present invention there is provided a parallel magnetic resonance imaging (MRI) apparatus configurable to image a physical entity, said apparatus comprising:

a main magnetic flux source for providing a uniform fixed magnetic field, $B_0$;

an RF array system comprising a plurality of RF coils and receivers, said RF system configured for:

generating at least one rotating RF excitation magnetic field $B_1$; and receiving RF signals due to precessing nuclear magnetization on multiple spatially distinct radio frequency coils and associated receiver channels, said RF system being configured to operate in accordance with a $B_1$ sensitivity encoding technique;

a control processor for controlling imaging functionality, collecting image data and effecting data processing of said captured image data said control processor being configured with post processing capability for said $B_1$ sensitivity encoding technique;

an image display means for displaying processed image data as resultant images; and an auxiliary magnetic field means capable of producing at least one auxiliary uniform $B_0$ step magnetic field imaging region within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique.

Preferably said RF array system is configured outside said auxiliary $B_0$ magnetic field means.

Alternatively said RF array may be configured inside said auxiliary $B_0$ magnetic field means.

Preferably said said auxiliary $B_0$ magnetic field means is configured to generate a plurality of auxiliary uniform $B_0$ step magnetic field imaging regions within said main $B_0$ magnetic field, said auxiliary magnetic field means configured to operate in combination with said $B_1$ RF system and said $B_1$ sensitivity encoding technique.

Preferably Said Apparatus Comprises Means for Performing the Steps:

(1) selecting the number of parallel slices required and selecting the slice locations;

(2) selecting an acceleration factor for the reduced data set scheme of said $B_1$ sensitivity encoding technique;

(3) substantially simultaneously acquiring the reduced data set for said selected slices by applying $B_1$ excitation scheme and collecting resultant data signals from said receiver channels;

(4) processing said acquired data from each said channel in said $B_1$ system; and (5) applying $B_1$ parallel reconstruction for each said slice.

Preferably said $B_1$ sensitivity encoding technique comprises the SENSE technique.

Preferably said $B_1$ sensitivity encoding technique comprises the SMASH technique.

Preferably said apparatus comprises means for performing the steps:

(1) selecting the number of parallel slices required and selecting the slice locations;

(2) selecting an acceleration factor for the reduced data set scheme of said $B_1$ sensitivity encoding technique;

(3) substantially simultaneously acquiring the reduced data set for said selected slices by applying $B_1$ excitation scheme and collecting resultant data signals from said receiver channels;

(4) processing said acquired data from each said channel in said $B_1$ system; and (5) applying $B_1$ parallel reconstruction for each said slice, said steps being for providing required calibration data from the set comprising:

[a $B_1$ array sensitivity map; and a $B_1$ response function].

Preferably a slice selector is provided, said slice selector comprising using a conventional imaging gradient and a multiple band excitation pulse.

Preferably said apparatus is configured to generate a pulsed MAMBA $B_0$ field is and during application of said $B_1$ excitation scheme said pulsed MAMBA $B_0$ field is configured to be switched off.

According to a second aspect of the present invention there is provided a parallel magnetic resonance imaging (MRI) apparatus configurable to image a physical entity, said apparatus comprising:

a main magnetic flux source for providing a uniform fixed magnetic field, $B_0$;

a combined parallel RF and auxiliary $B_0$ magnetic field system comprising:

a plurality of RF coils and receivers for generating at least one rotating RF excitation magnetic field $B_1$ and for receiving fields due to precessing nuclear magnetization, said RF system being configured to operate in accordance with a $B_1$ sensitivity encoding technique; and an auxiliary magnetic field means capable of producing at least one auxiliary uniform $B_0$ step magnetic field imaging region within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;

a control processor for controlling imaging functionality, collecting image data and effecting data processing of said captured image data said control processor being configured with post processing capability for said $B_1$ sensitivity encoding technique; and an image display means for displaying processed data as resultant images.

According to a third aspect of the present invention there is provided, in a parallel magnetic resonance imaging (MRI) apparatus configurable to image a physical entity, said apparatus comprising:

a main magnetic flux source for providing a uniform fixed magnetic field, $B_0$;

an RF system comprising an array of RF coils and receivers, said RF system configured for:

generating at least one rotating RF excitation magnetic field $B_1$; and receiving RF signals due to precessing nuclear magnetization on multiple spatially distinct radio frequency coils and associated receiver channels, said RF system being configured to operate in accordance with a $B_1$ sensitivity encoding technique;

an auxiliary magnetic field means capable of producing at least one auxiliary uniform $B_0$ step magnetic field imaging region within said main $B_1$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;

a control processor for controlling imaging functionality, collecting image data and effecting data processing of said captured image data said control processor being configured with post processing capability for said $B_1$ sensitivity encoding technique; and an image display means for displaying processed image data as resultant images, a method of imaging comprising the steps of:

in relation to said imaging apparatus positioning said physical entity in an imaging position;

subjecting said physical entity to said uniform main $B_0$ magnetic field;

selecting the number of parallel slices required and selecting the slice locations;

creating auxiliary $B_0$ step fields to enable simultaneous data acquisition for each of said slices;

selecting an acceleration factor for the reduced data set scheme of said $B_1$ sensitivity encoding technique;

substantially simultaneously acquiring the reduced data set for said selected slices by applying a $B_1$ excitation scheme and collecting resultant data signals from said receiver channels;

processing said acquired data from each said channel in said $B_1$ system;

applying $B_1$ parallel reconstruction for each said slice; and displaying the frequency separated images of said selected slices.

Preferably said RF array system is configured outside said auxiliary $B_0$ magnetic field means.

Preferably said RF array is configured inside said auxiliary $B_0$ magnetic field means.

Preferably said auxiliary $B_0$ magnetic field means is configured to generate a plurality of auxiliary uniform $B_0$ step magnetic field imaging regions within said main $B_0$ magnetic field, said auxiliary magnetic field means configured to operate in combination with said RF coil system and said $B_1$ sensitivity encoding technique.

Preferably said $B_1$ sensitivity encoding technique comprises the SENSE technique.

Preferably said $B_1$ sensitivity encoding technique comprises the SMASH technique.

Preferably said step of processing said acquired data from each channel in said $B_1$ RF system comprises applying a two-dimensional Fourier Transform.

Preferably said steps of:

selecting an acceleration factor for the reduced data set scheme of said $B_1$ sensitivity encoding technique;

substantially simultaneously acquiring the reduced data set for said selected slices;

processing said acquired data from each channel in said $B_1$ system; and applying $B_1$ parallel reconstruction for each said slice;

are undertaken to provide required calibration data.

In a particularly preferred embodiment said steps of:

selecting an acceleration factor for the reduced data set scheme of said $B_1$ sensitivity encoding technique;

substantially simultaneously acquiring the reduced data set for said selected slices;

processing said acquired data from each channel in said $B_1$ system; and applying $B_1$ parallel reconstruction for each said slice;

are undertaken to provide required calibration data in the form of a $B_1$ array sensitivity map. In an alternative preferred embodiment these steps may be undertaken to provide required calibration data in the form of a $B_1$ array response function.

Preferably said step of selecting an acceleration factor for the reduced data set scheme of said $B_1$ sensitivity encoding technique comprises selecting a reduced k-space factor common to all said slices; and said step of substantially simultaneously acquiring the reduced data set for said selected slices comprises acquiring the reduced k-space.

Preferably said slice selection step comprises use of a conventional imaging gradient and a multiple band excitation pulse.

In a preferred embodiment a pulsed MAMBA $B_0$ field is applied and during application of said $B_1$ excitation scheme said pulsed MAMBA $B_0$ field is switched off.

Suitably in some preferred embodiments said step of selecting the number of parallel slices required comprises selecting two and the step of creating auxiliary $B_0$ step fields to enable simultaneous data acquisition for each of said slices comprises establishing one $B_0$ step field.

According to a fourth aspect of the present invention there is provided a parallel MRI apparatus comprising:

a multiple $B_1$ RF array system used in combination with a one-dimensional MAMBA system, said RF system being configured to operate in accordance with a $B_1$ sensitivity encoding technique.

According to a fifth aspect of the present invention there is provided a parallel magnetic resonance imaging (MRI) apparatus configurable to image a physical entity, said apparatus comprising:

a main magnetic flux source for providing a uniform fixed magnetic field, $B_0$;

a combined parallel RF and auxiliary $B_1$ magnetic field system comprising:

a plurality of RF coils and receivers for generating at least one rotating RF excitation magnetic field $B_1$ and for receiving fields due to precessing nuclear magnetization, said RF system being configured to operate in accordance with a $B_1$ sensitivity encoding technique; and an auxiliary magnetic field means capable of producing a plurality of interleaved auxiliary uniform $B_0$ step magnetic field imaging regions within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;

a control processor for controlling imaging functionality, collecting image data and effecting data processing of said captured image data said control processor being configured with post processing capability for said $B_1$ sensitivity encoding technique; and an image display means for displaying processed data as resultant images.

According to a sixth aspect of the present invention, in a parallel magnetic resonance imaging (MRI) apparatus configurable to image a physical entity, said apparatus comprising:

a main magnetic flux source for providing a uniform fixed magnetic field, $B_0$;

an RF system comprising an array of RF coils and receivers, said RF system configured for:

generating at least one rotating RF excitation magnetic field $B_1$; and receiving RF signals due to precessing nuclear magnetization on multiple spatially distinct radio frequency coils and associated receiver channels, said RF system being configured to operate in accordance with a $B_1$ sensitivity encoding technique;

an auxiliary magnetic field means capable of producing a plurality of interleaved uniform auxiliary $B_0$ step magnetic field imaging regions within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;

a control processor for controlling imaging functionality, collecting image data and effecting data processing of said captured image data said control processor being configured with post processing capability for said $B_1$ sensitivity encoding technique; and an image display means for displaying processed image data as resultant images, there is provided a method of imaging comprising the steps of:

in relation to said imaging apparatus positioning said physical entity in an imaging position;

subjecting said physical entity to said uniform main $B_0$ magnetic field;

selecting the number of parallel slices required and selecting the slice locations;

creating auxiliary $B_0$ step fields to enable simultaneous data acquisition for each of said slices;

selecting an acceleration factor for the reduced data set scheme of said $B_1$ sensitivity encoding technique;

substantially simultaneously acquiring the reduced data set for said selected slices by applying a $B_1$ excitation scheme and collecting resultant data signals from said receiver channels;

processing said acquired data from each said channel in said $B_1$ system;

applying $B_1$ parallel reconstruction for each said slice; and displaying the frequency separated images of said selected slices.

According to a seventh aspect of the present invention there is provided a computer program configured for use with a parallel magnetic resonance imaging (MRI) apparatus wherein said apparatus comprises:

a main magnetic flux source for providing a uniform fixed magnetic field, $B_0$;

an RF system comprising an array of RF coils and receivers, said RF system configured for:

generating at least one rotating RF excitation magnetic field $B_1$; and receiving RF signals due to precessing nuclear magnetization on multiple spatially distinct radio frequency coils and associated receiver channels, said RF system being configured to operate in accordance with a $B_1$ sensitivity encoding technique;

an auxiliary magnetic field means capable of producing at least one auxiliary uniform $B_0$ step magnetic field imaging region within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;

a control processor for controlling imaging functionality, collecting image data and effecting data processing of said captured image data said control processor being configured with post processing capability for said $B_1$ sensitivity encoding technique; and an image display means for displaying processed image data as resultant images, said computer program configured to interactively control imaging in relation to the imaging method steps of:

positioning said physical entity in an imaging position;

subjecting said physical entity to said uniform main $B_0$ magnetic field;

selecting the number of parallel slices required and selecting the slice locations;

creating auxiliary $B_0$ step fields to enable simultaneous data acquisition for each of said slices;

selecting an acceleration factor for the reduced data set scheme of said $B_1$ sensitivity encoding technique;

substantially simultaneously acquiring the reduced data set for said selected slices by applying a $B_1$ excitation scheme and collecting resultant data signals from said receiver channels;

processing said acquired data from each said channel in said $B_1$ system;

applying $B_1$ parallel reconstruction for each said slice; and displaying the frequency separated images of said selected slices.

According to an eigth aspect of the present invention there is provided an MRI apparatus configured to provide three-dimensional MR imaging, said apparatus comprising:

a 1D Multiple Acquisition Micro $B_0$ (MAMBA) array of imaging elements configured to provide a plurality of main auxiliary $B_0$ step field regions within the main $B_0$ magnetic field, said main auxiliary $B_0$ step field regions being spatially configured along the direction of the main magnetic field; and a plurality of 2D Multiple Acquisition Micro $B_0$ arrays of imaging elements, each said 2D Multiple Acquisition Micro $B_0$ array being configured to operate in conjunction with a said main auxiliary $B_0$ step field region, wherein:

said imaging elements of said arrays are each associated with a different absolute resonance frequency.

Preferably each said 2D array is configured to operate in relation to a different imaging element of said 1D MAMBA array.

Preferably each said 2D array is located substantially within a 1D array imaging element.

Preferably said 1D array is formed from a coil configured to conduct electric current.

Preferably said imaging elements of a said 2D array each comprise an electric current carrying coil.

Preferably said plurality of main auxiliary $B_0$ step field regions is interleaved.

According to a ninth aspect of the present invention there is provided a method of three dimensional MR imaging comprising the steps of:

configuring a 1D Multiple Acquisition Micro $B_0$ (MAMBA) array of imaging elements to provide a plurality of main auxiliary $B_0$ step field regions within the main $B_0$ magnetic field, said main auxiliary $B_0$ step field regions being spatially configured along the direction of the main magnetic field;

configuring a plurality of 2D Multiple Acquisition Micro $B_0$ arrays of imaging elements, each said 2D Multiple Acquisition Micro $B_0$ array being configured to operate in conjunction with a said main auxiliary $B_0$ step field region; and ensuring that said imaging elements of said arrays are each associated with a different absolute resonance frequency.

According to a tenth aspect of the present invention there is provided a three-dimensional imaging apparatus for use in conjunction with an MRI scanner in imaging a physical entity, said apparatus comprising:

a first array of 1D MAMBA imaging elements configured to provide a plurality of main auxiliary uniform $B_0$ step magnetic field imaging regions within the main $B_0$ magnetic field of said scanner; and a plurality of 2D imaging element arrays, wherein:

each said 2D array is associated with a said 1D MAMBA imaging element, a said 2D array functioning to provide sub-auxiliary $B_0$ magnetic field steps within a said main auxiliary field step; and each said element of a said 2D array is associated with a unique magnetic resonance frequency corresponding to a pre-determined physical location of a particular imaging element of a said 2D array.

Preferably said $B_0$ sub-auxiliary magnetic field steps are distributed within the x-y imaging plane.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which.

Figure 1:
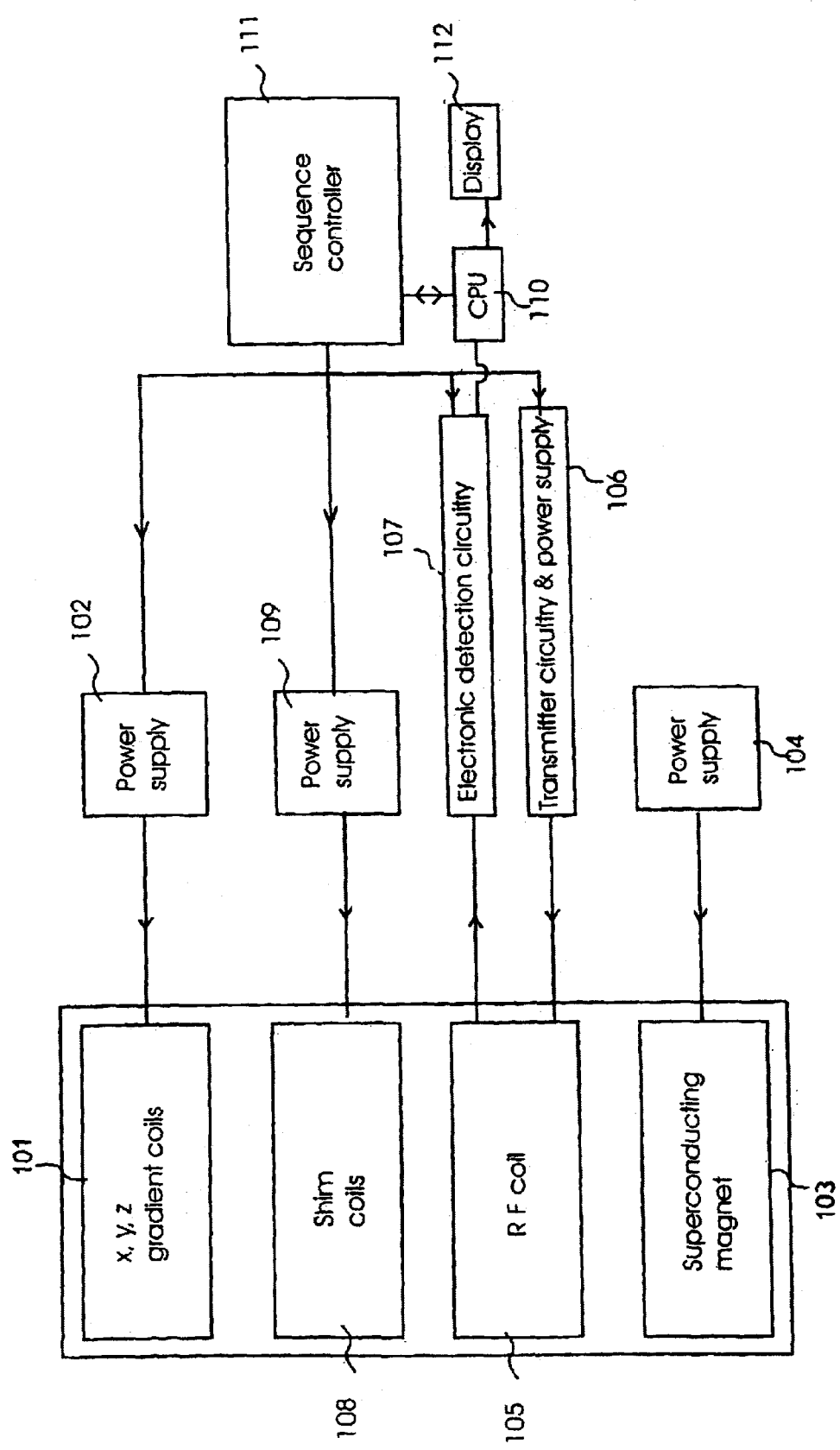
FIG. 1 is a block diagram schematically illustrating the main components of a prior art magnetic resonance imaging system.
Figure 2:
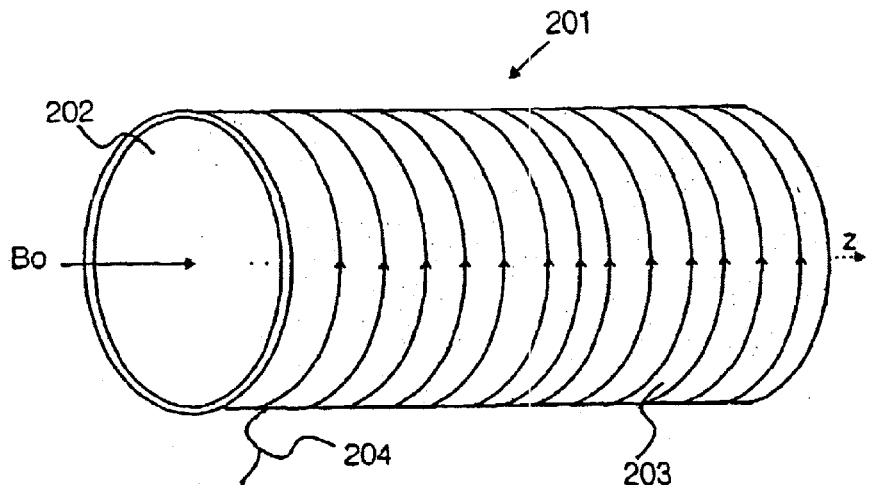
FIG. 2 is a perspective diagram schematically illustrating a magnetic resonance imaging chamber, coil and power supply arrangement.
Figure 3:
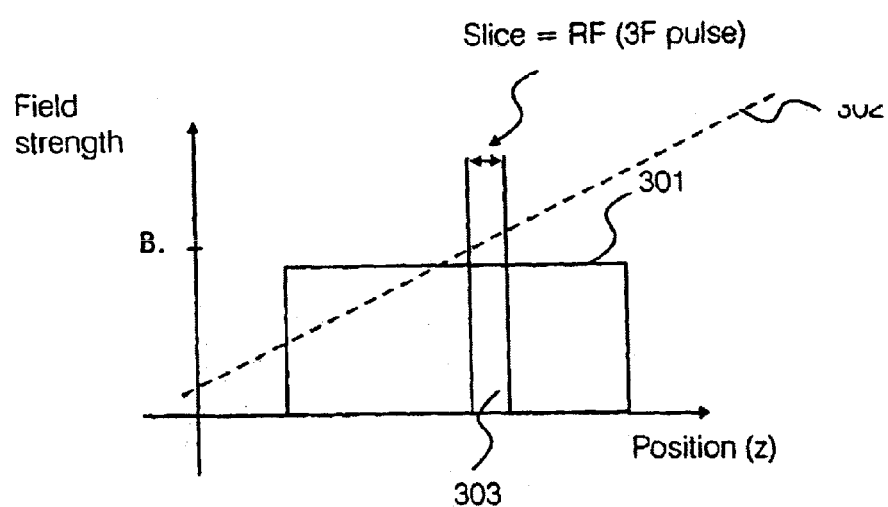
Figure 4:
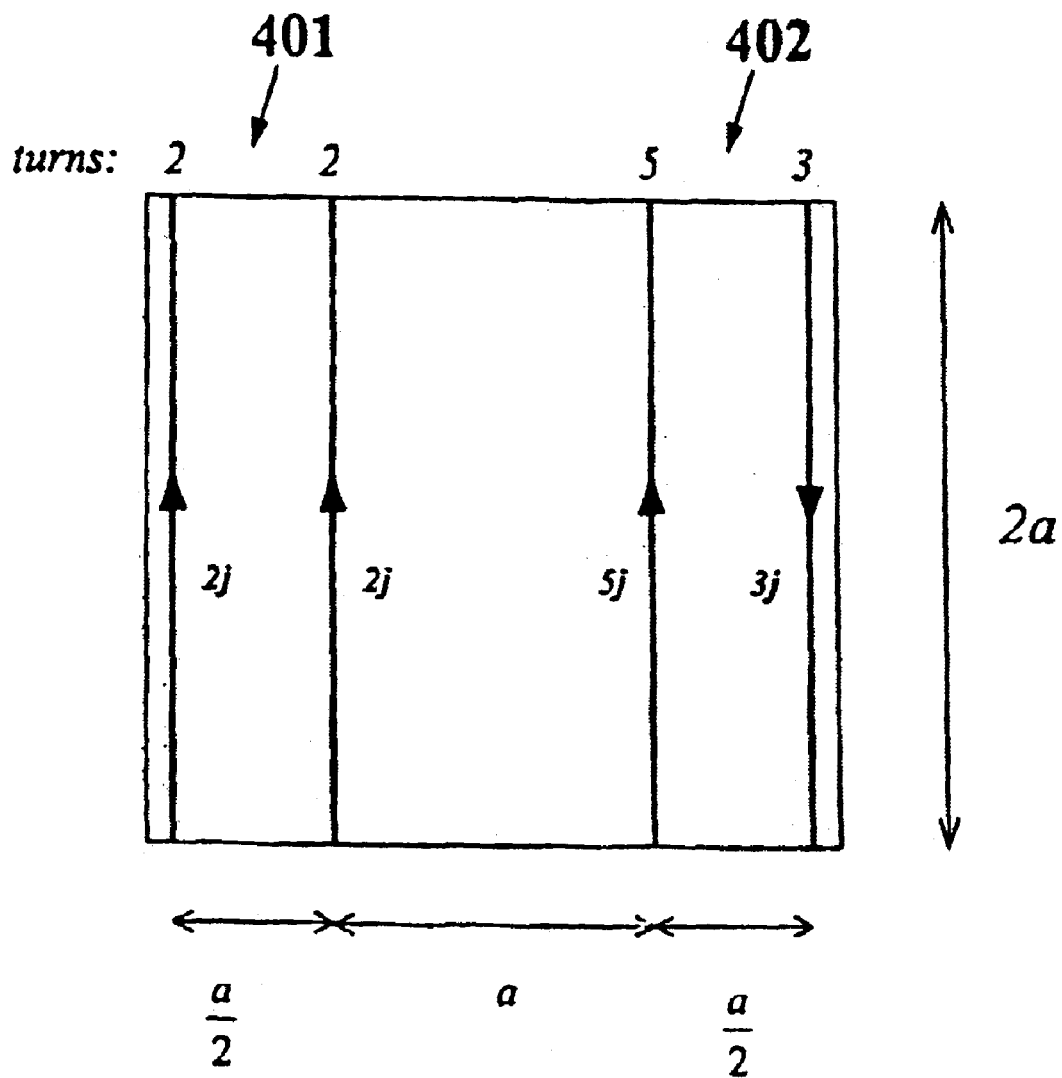
Figure 5:
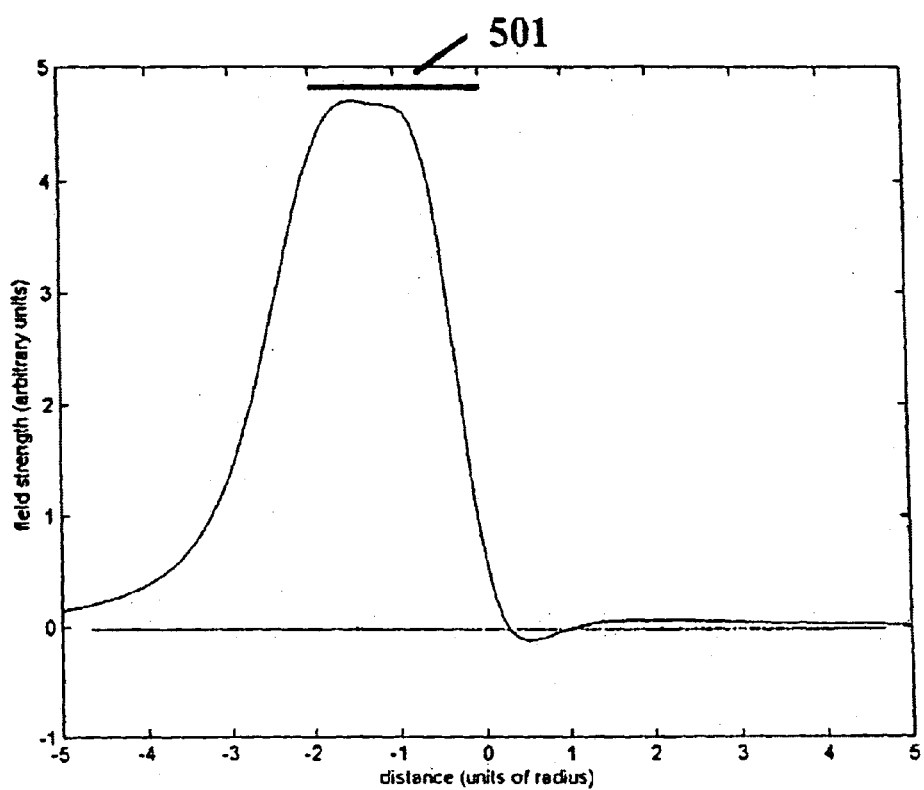
Figure 6:
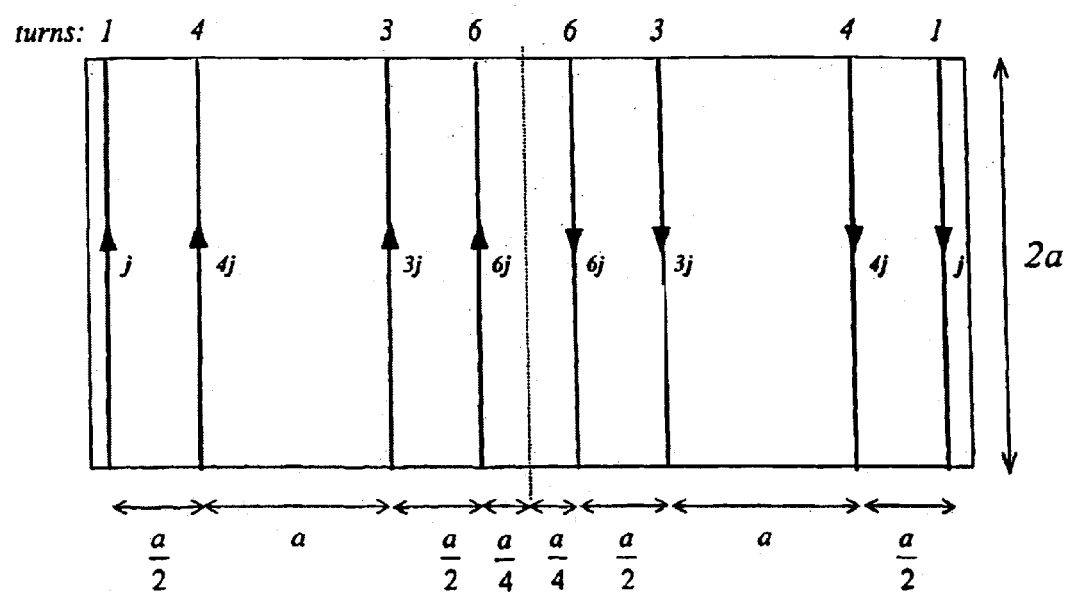
Figure 7:
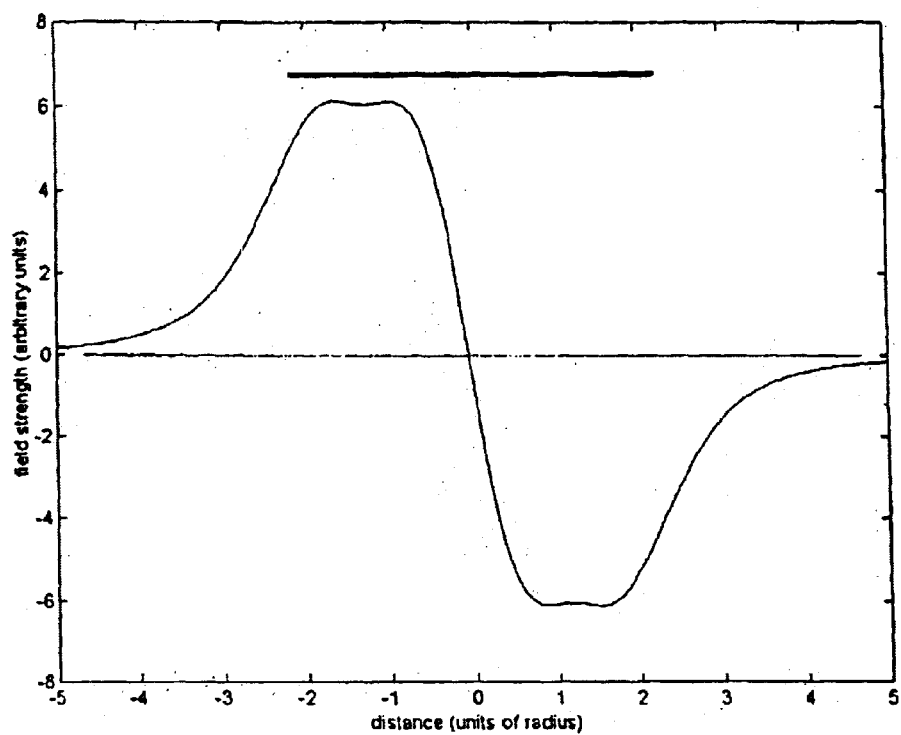
Figure 8:
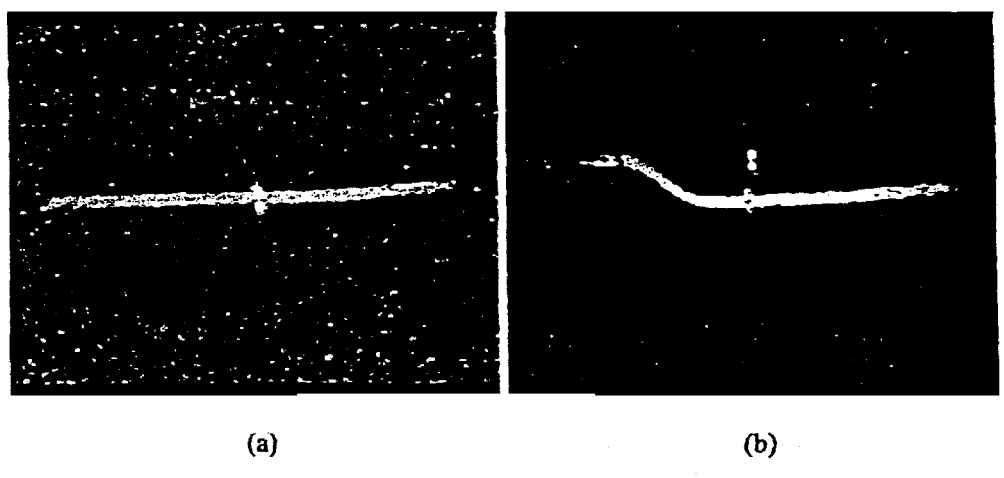
Figure 9:
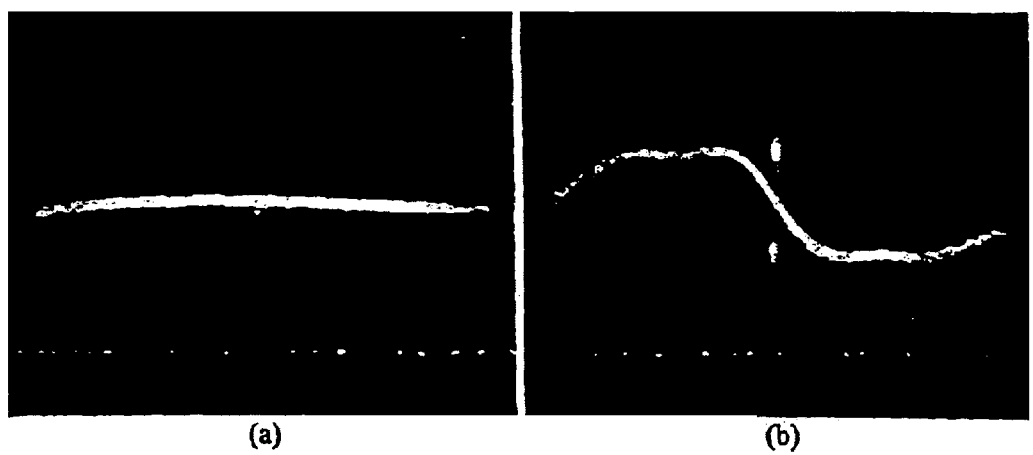
Figure 10:
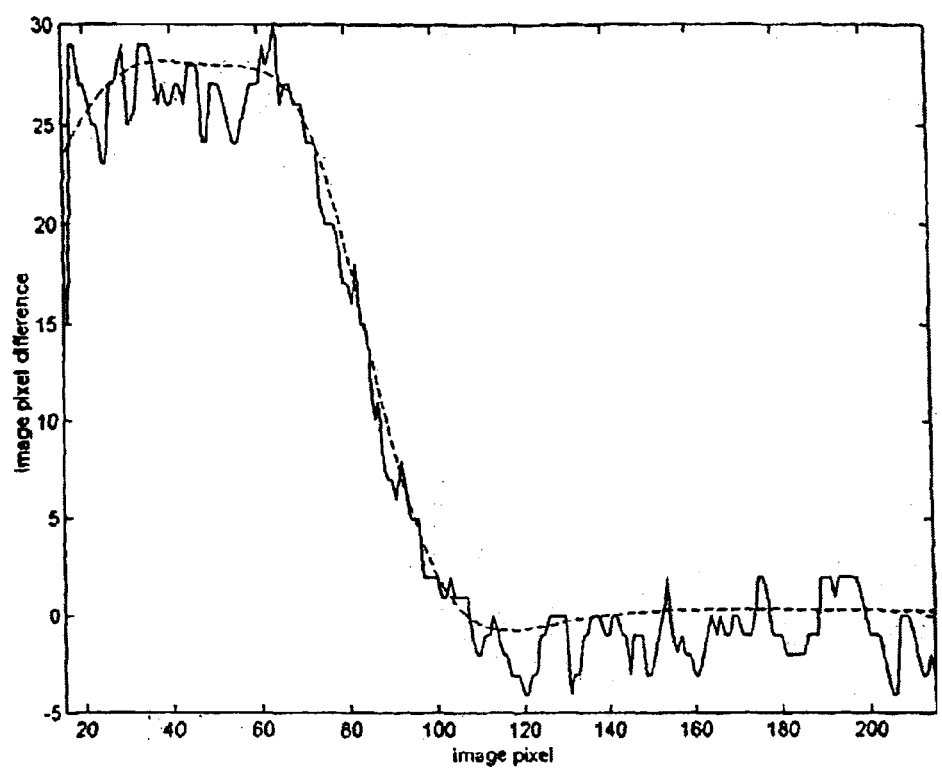
Figure 11:
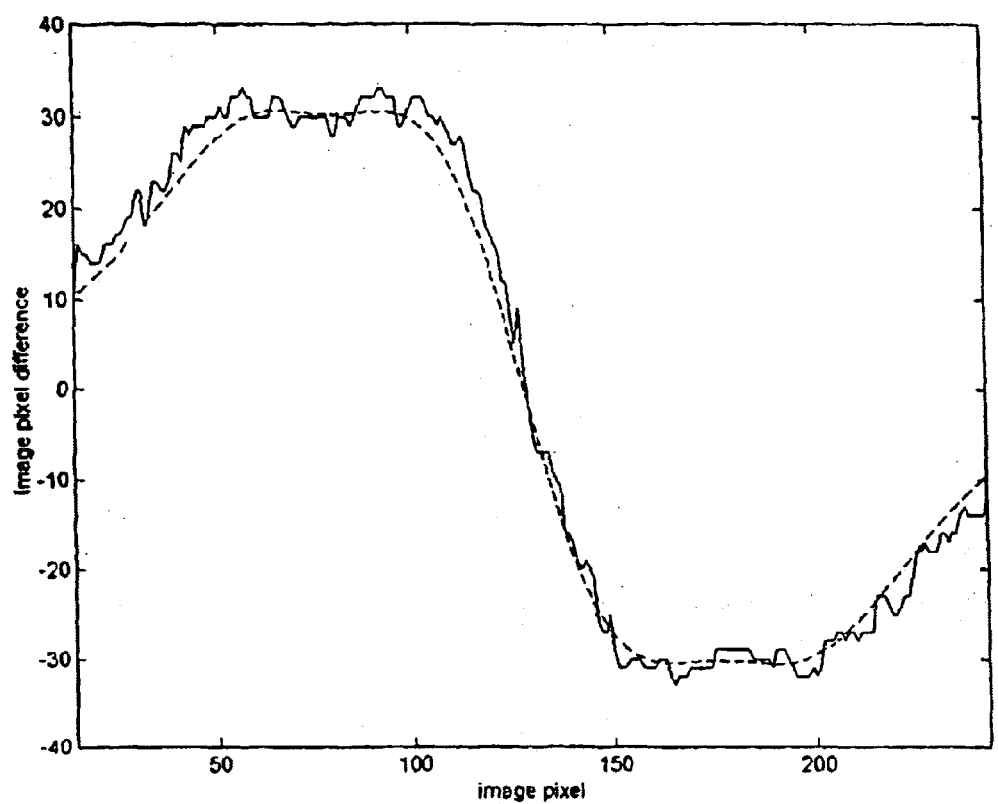
Figure 12:
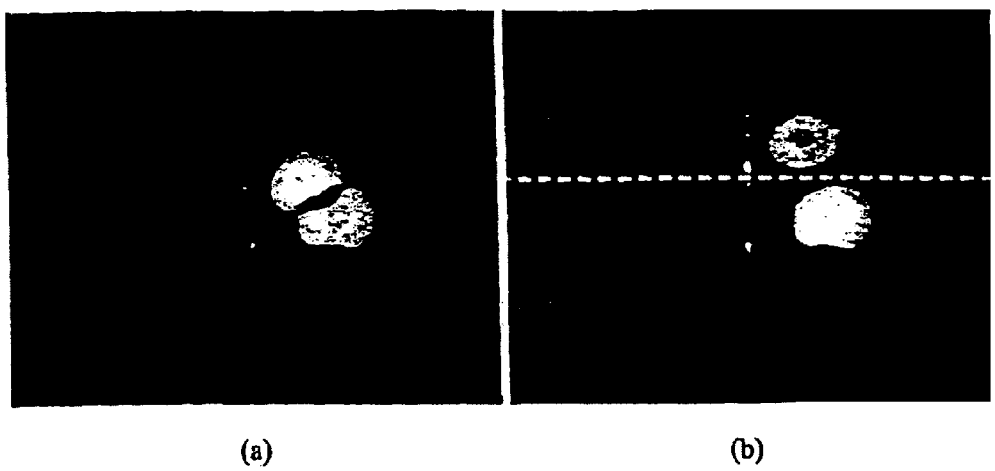
Figure 13:
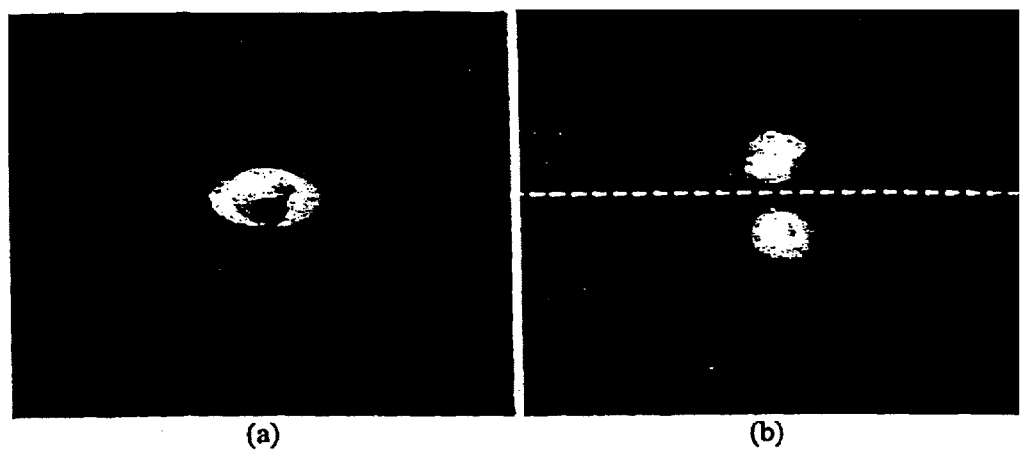
Figure 14:
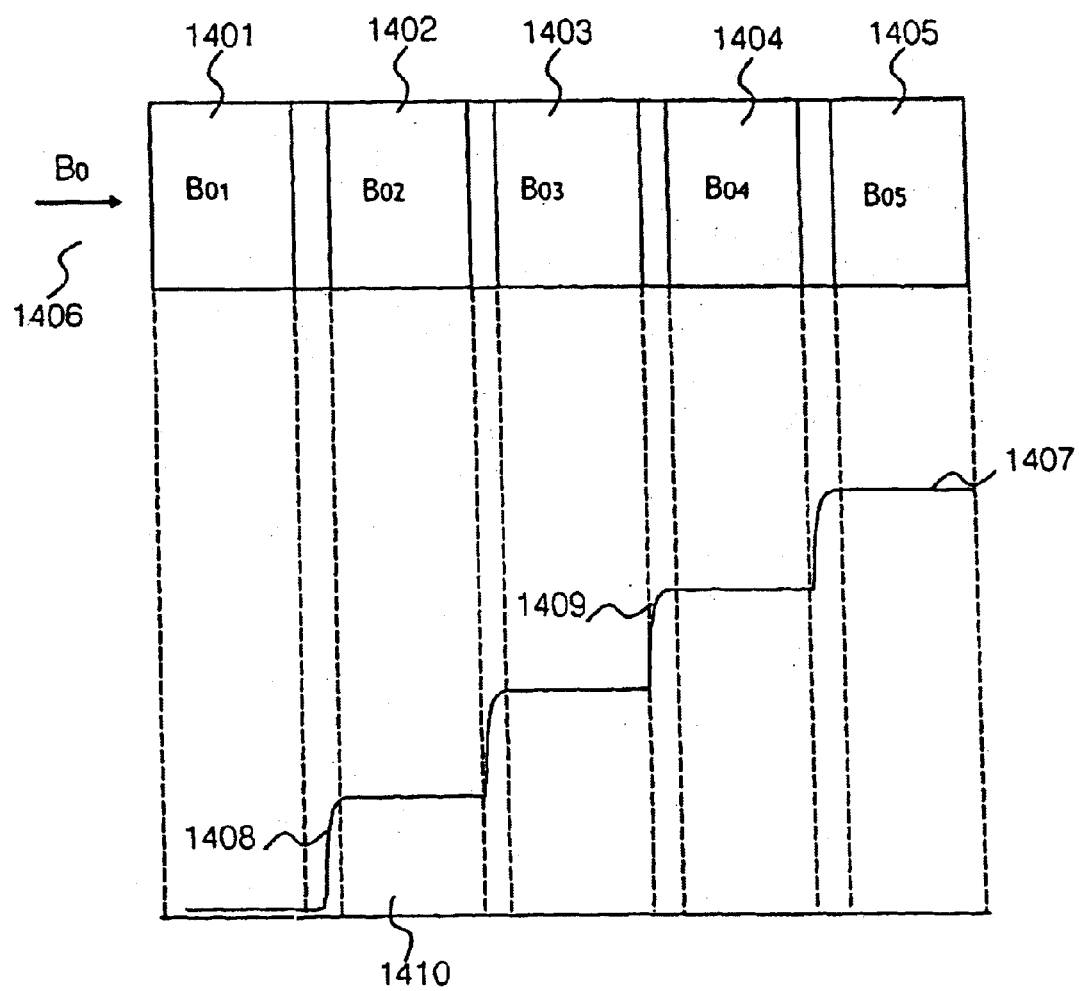
Figure 15:
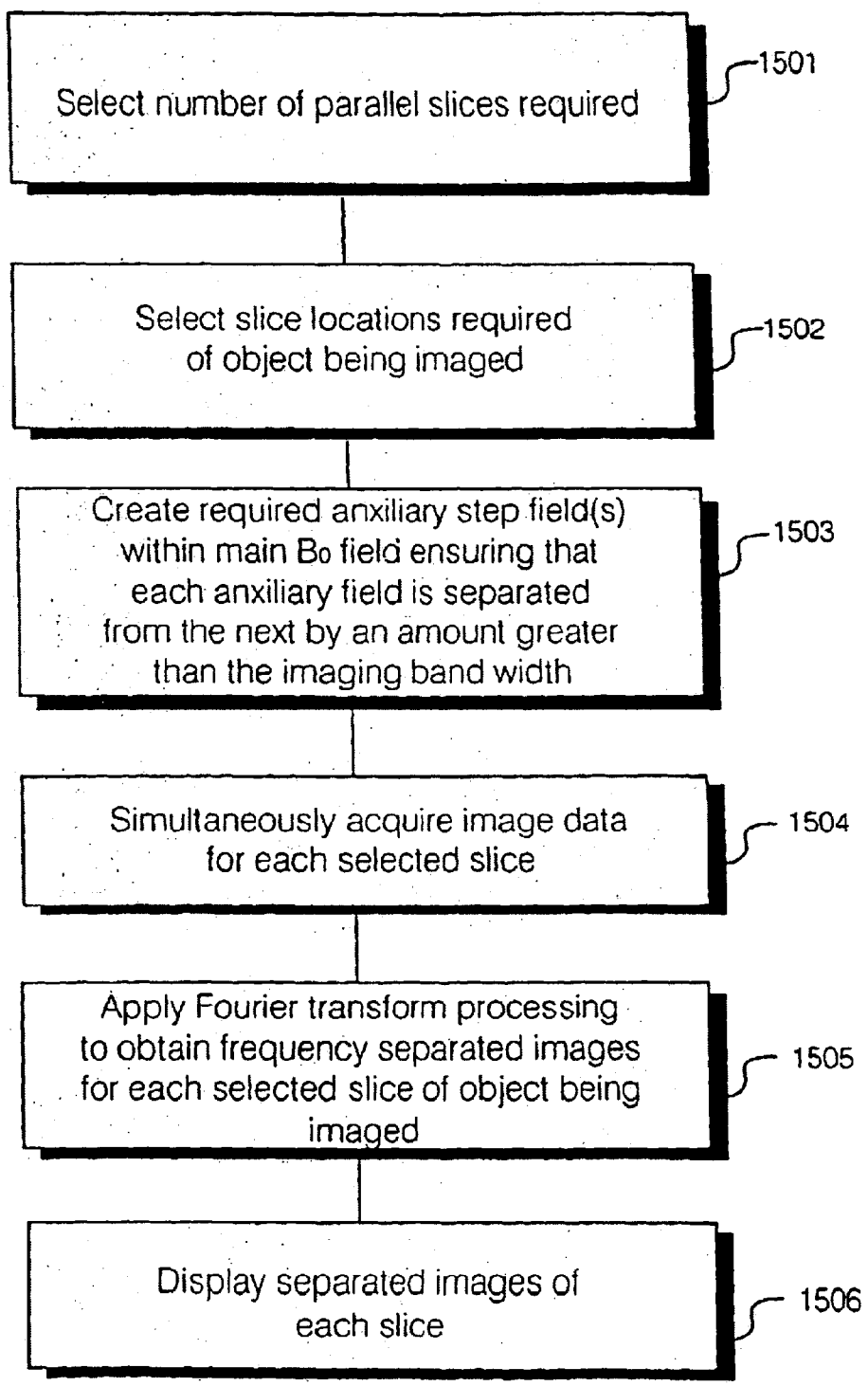
Figure 16:
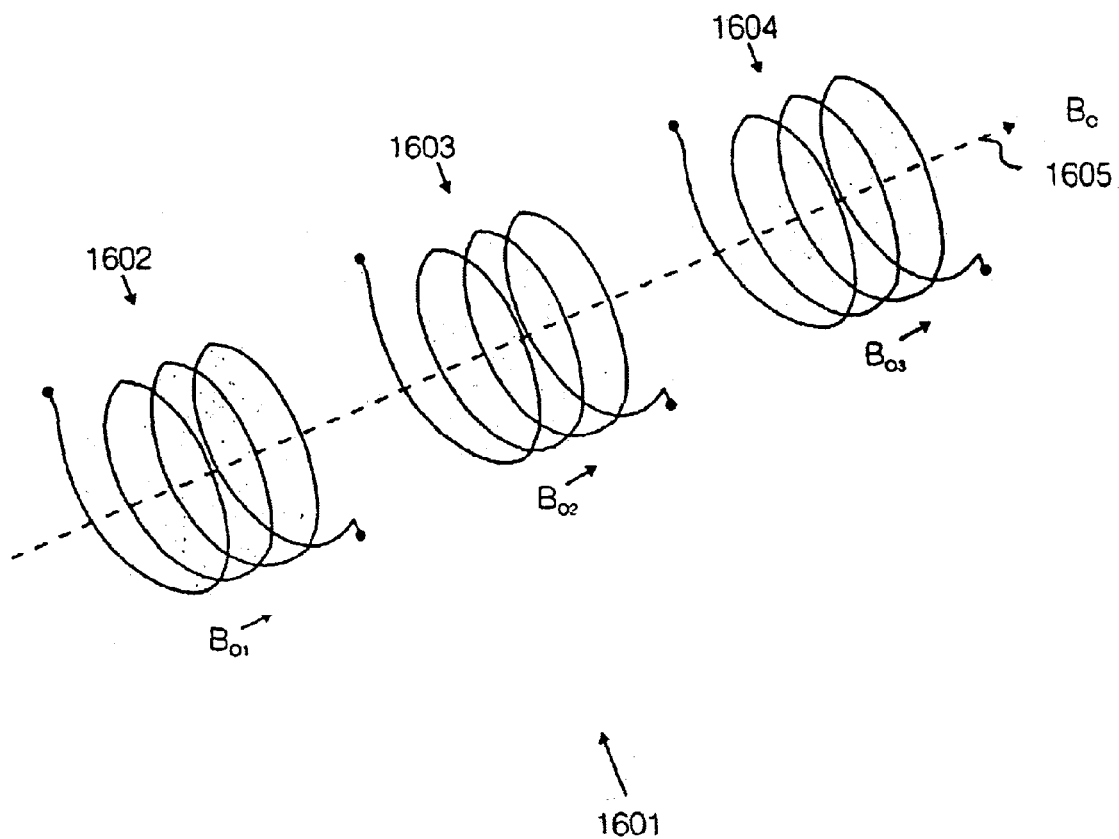
Figure 17:
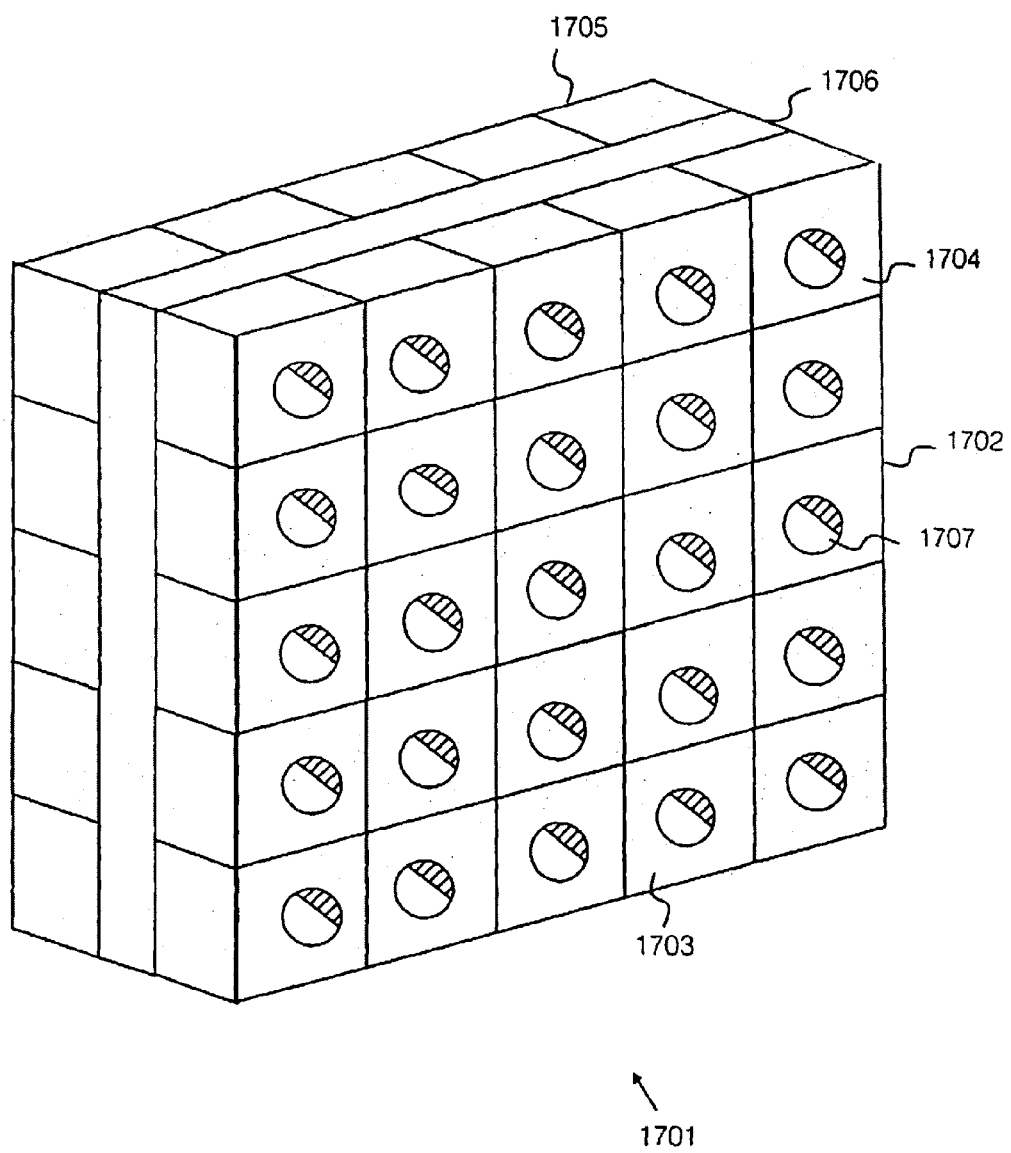
Figure 18:
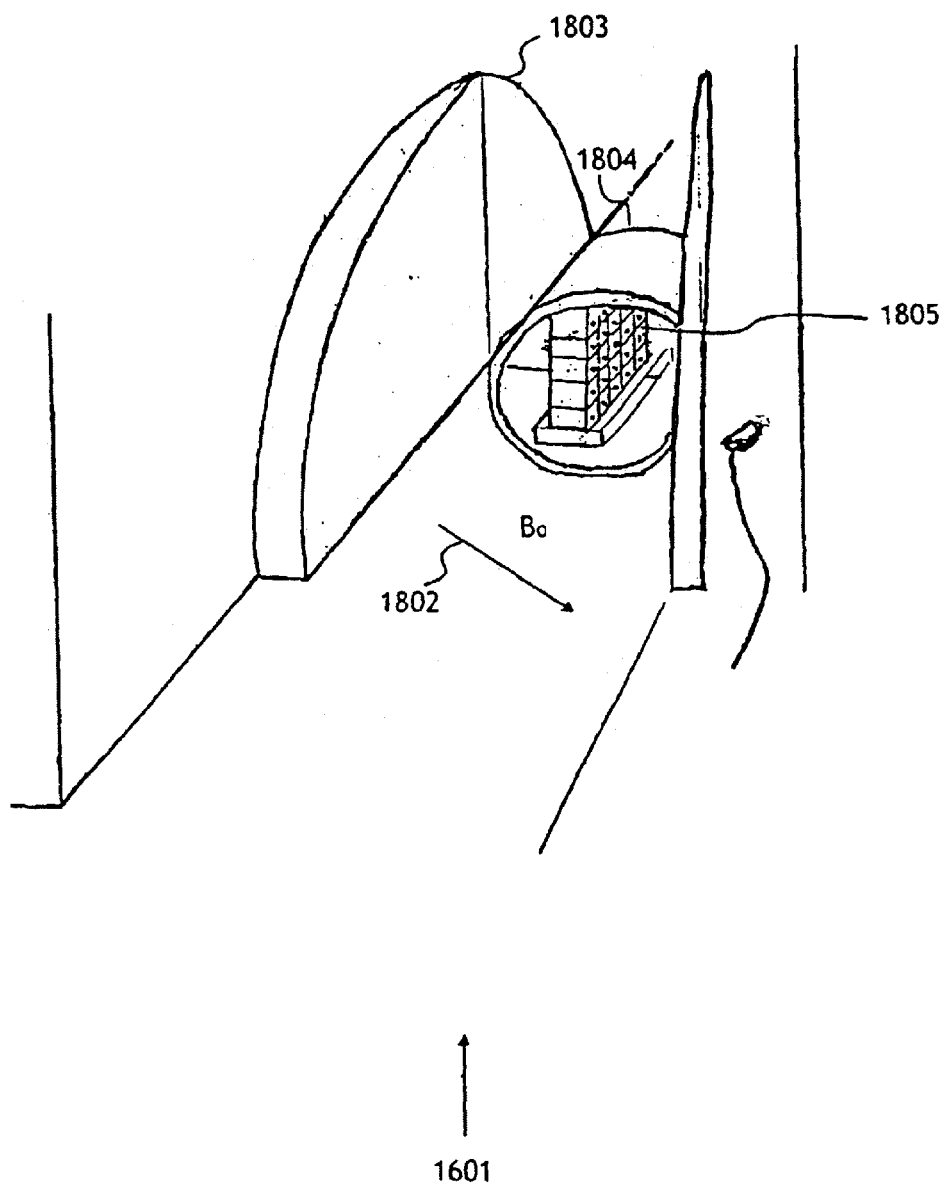
Figure 21:
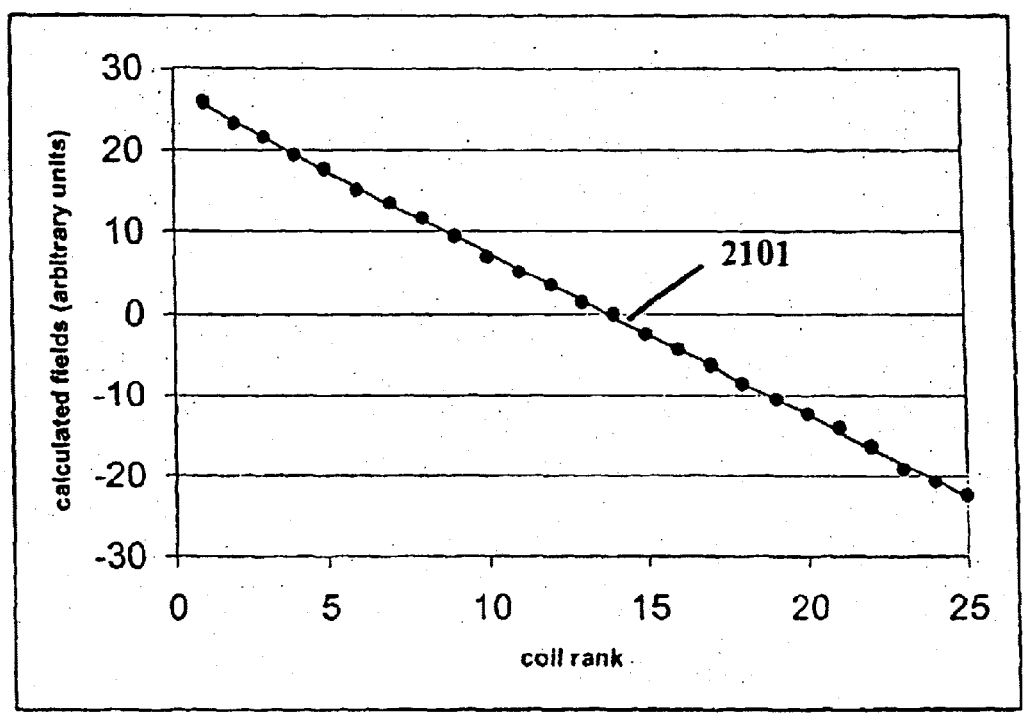
Figure 24:
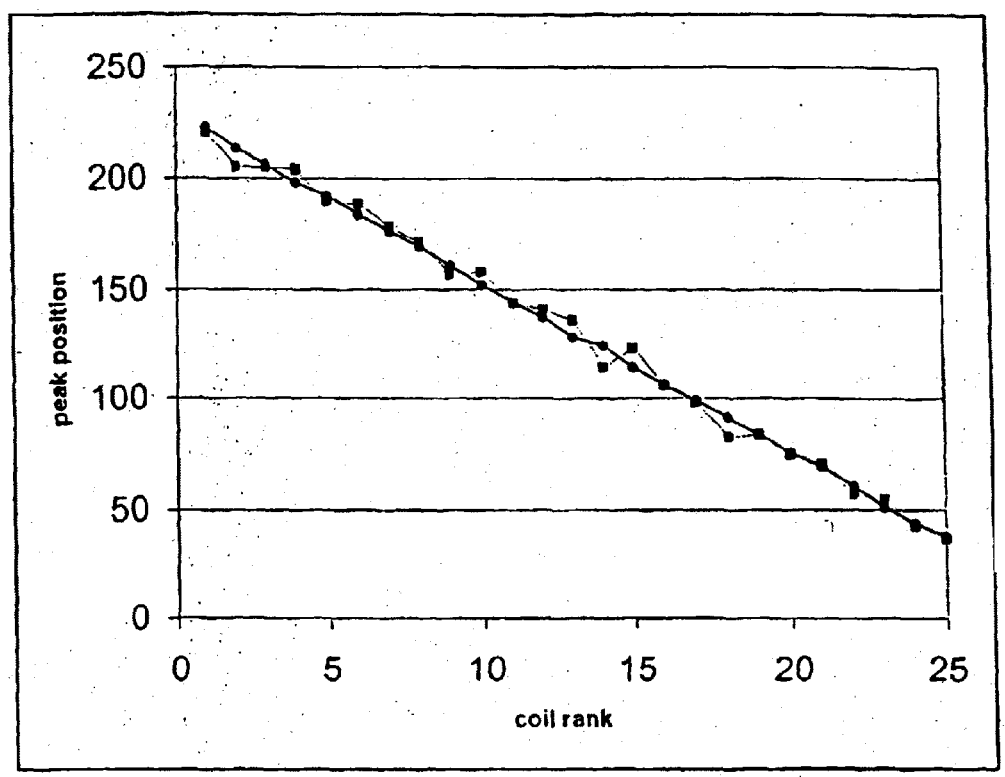
Figure 25:
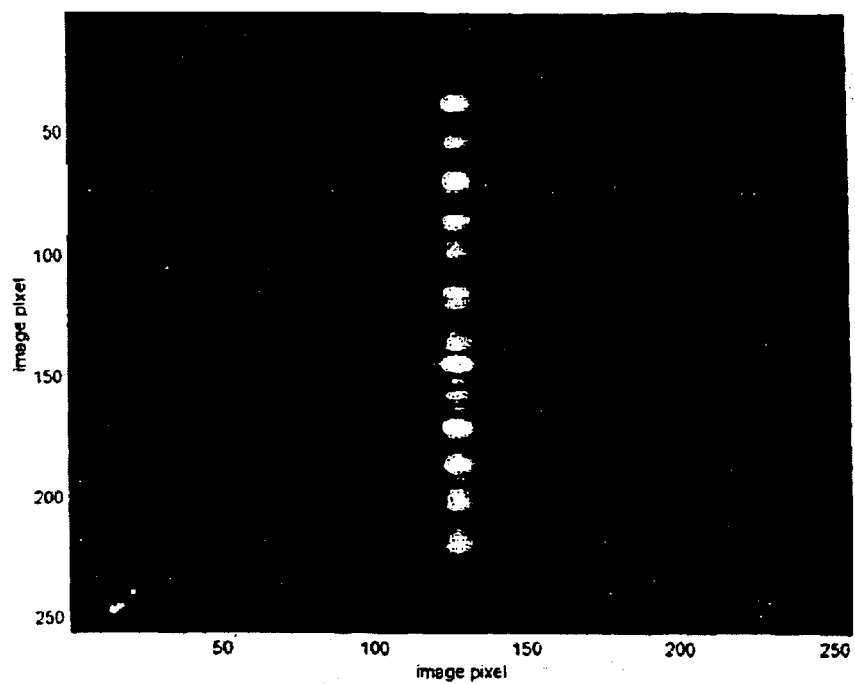
Figure 25:
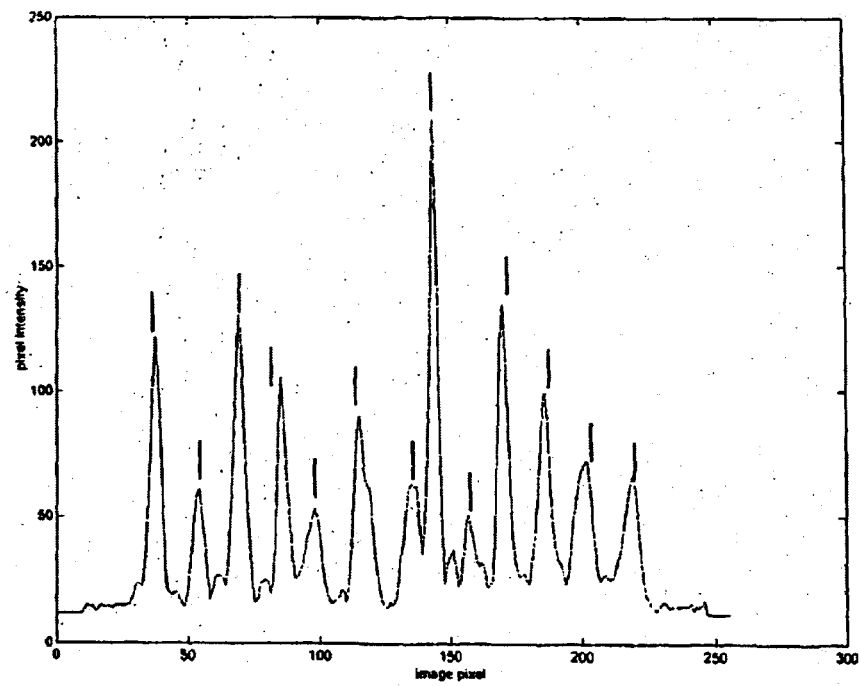
Figure 26:
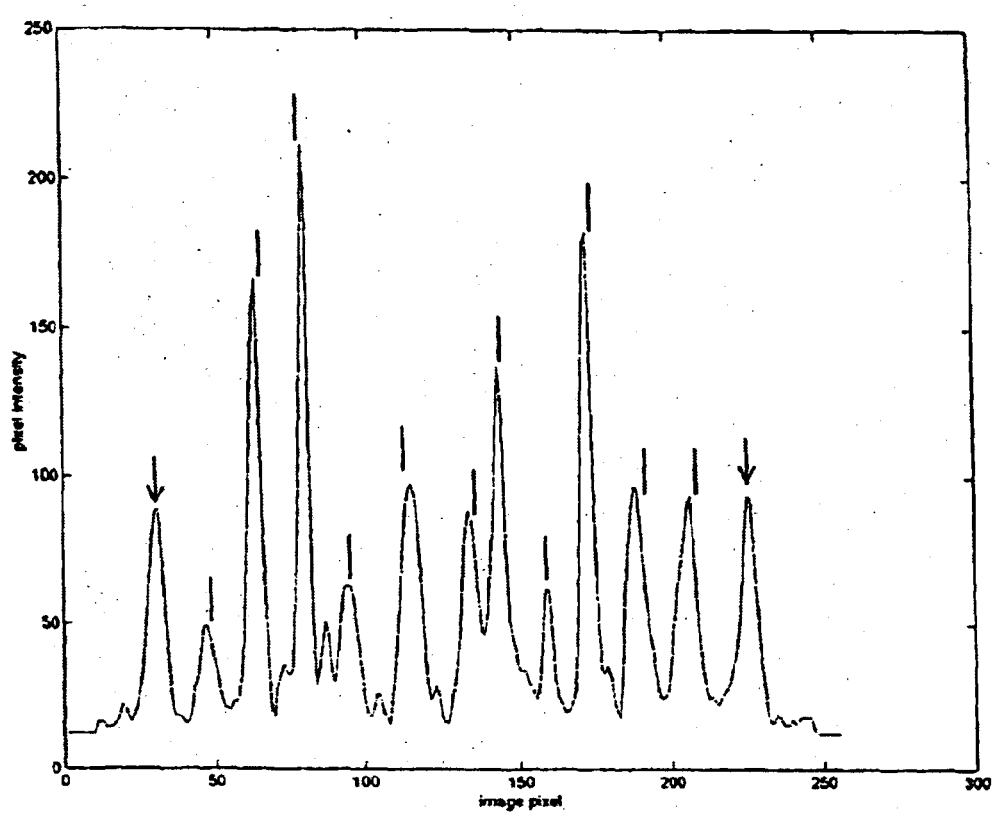
Figure 27:
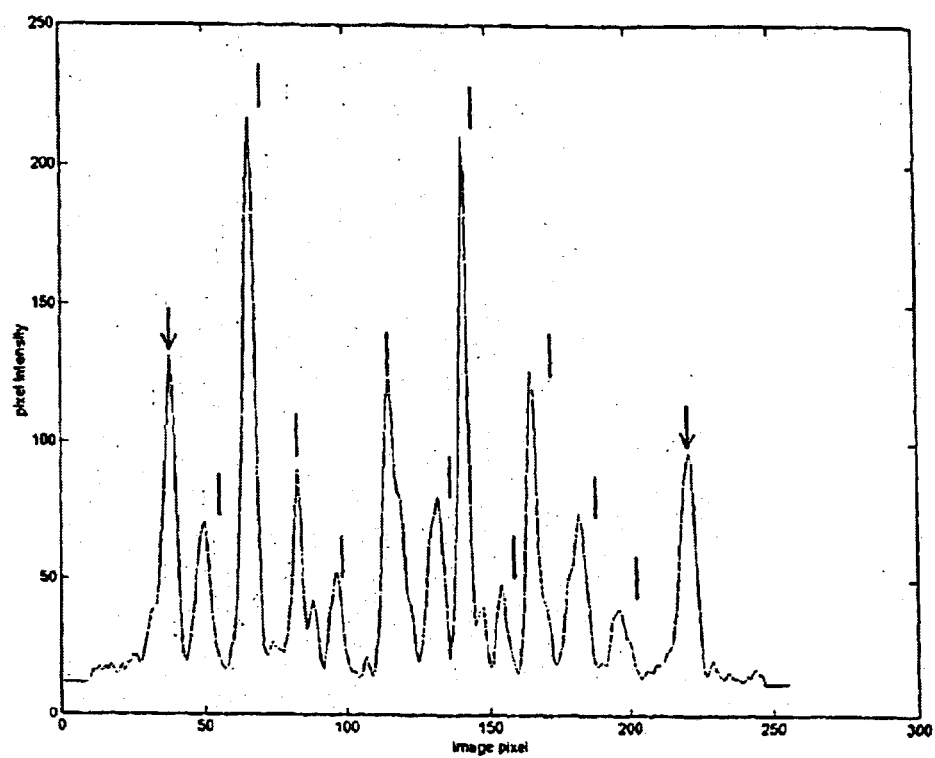
Figure 28:
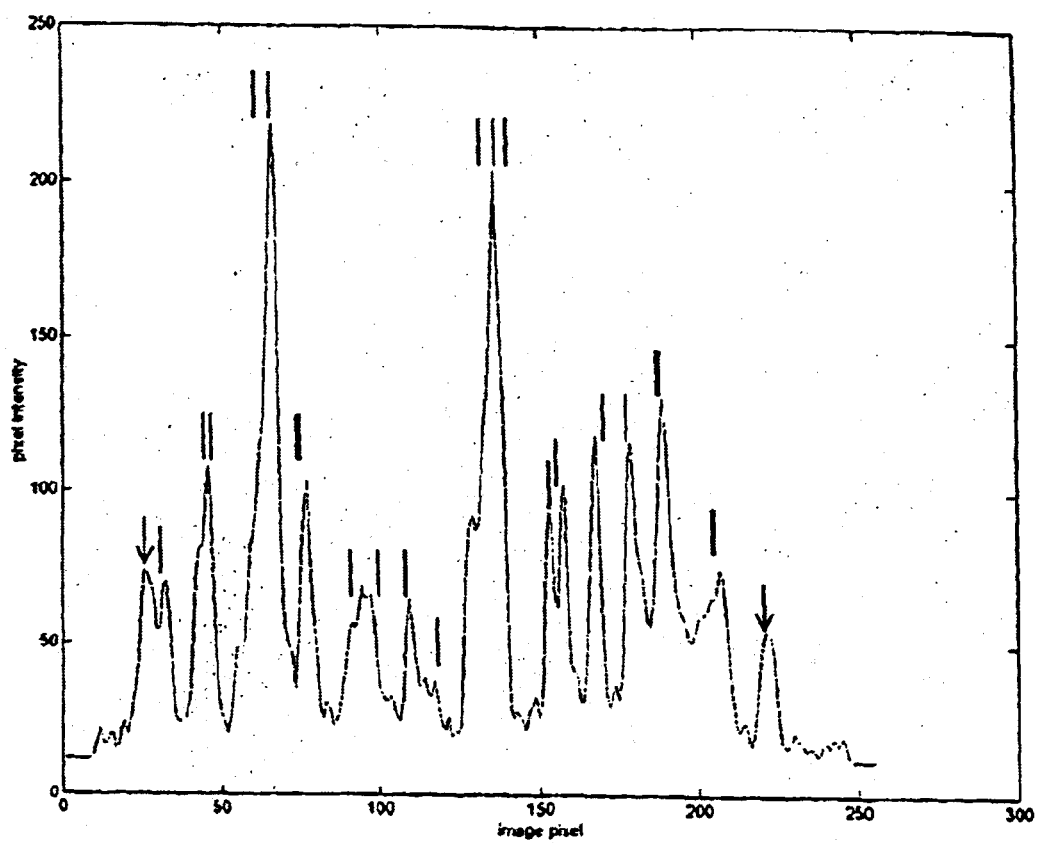
Figure 29:
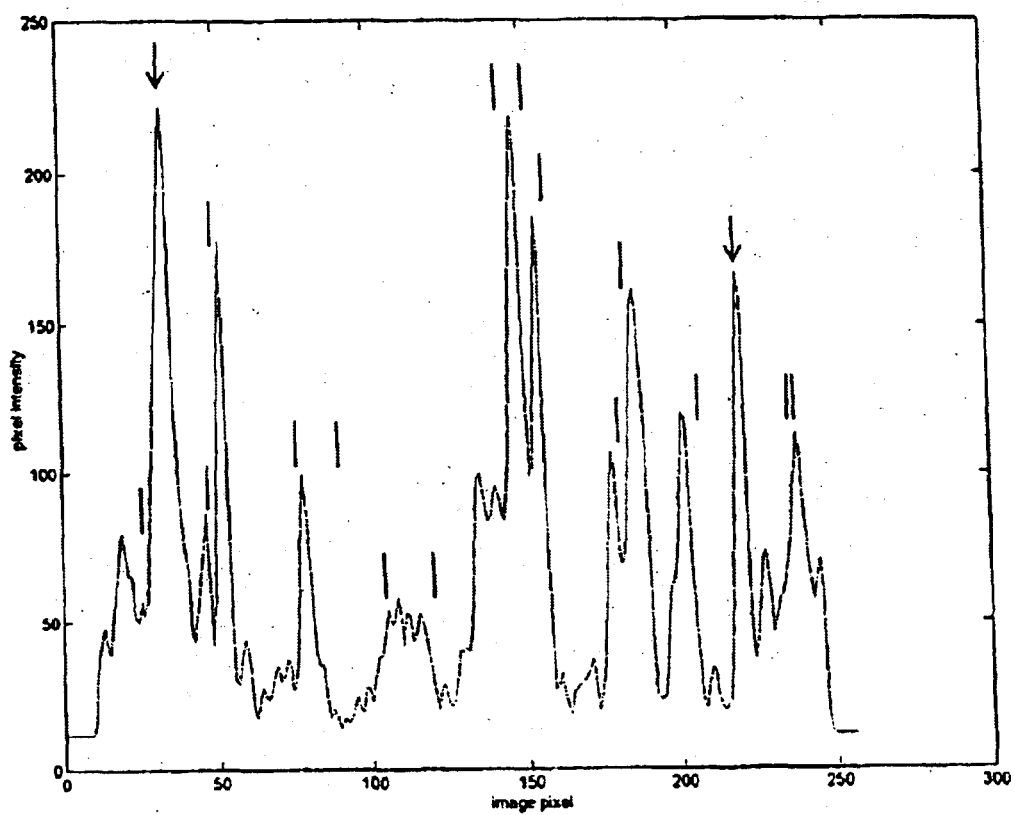
Figure 30:
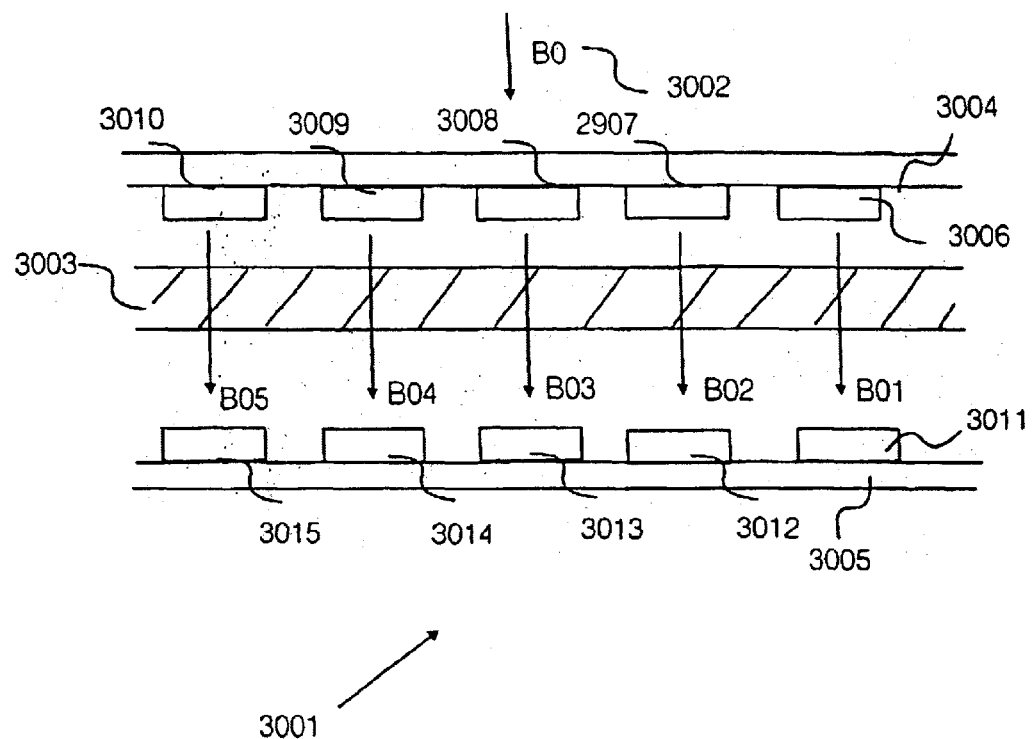
Figure 31:
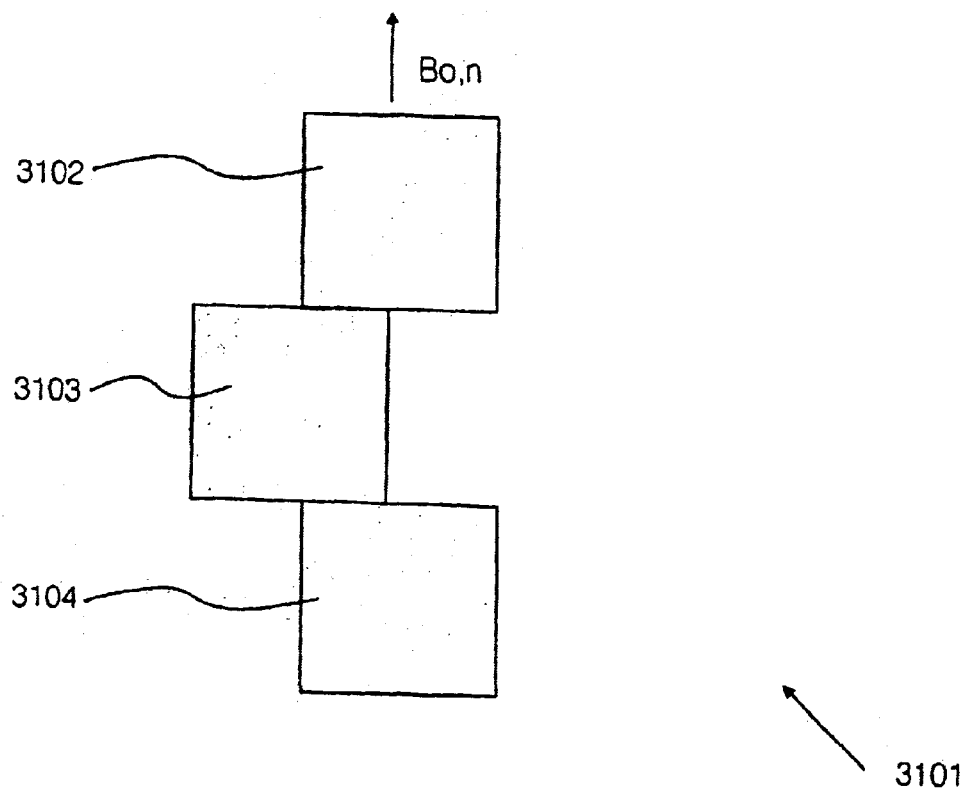
Figure 32:
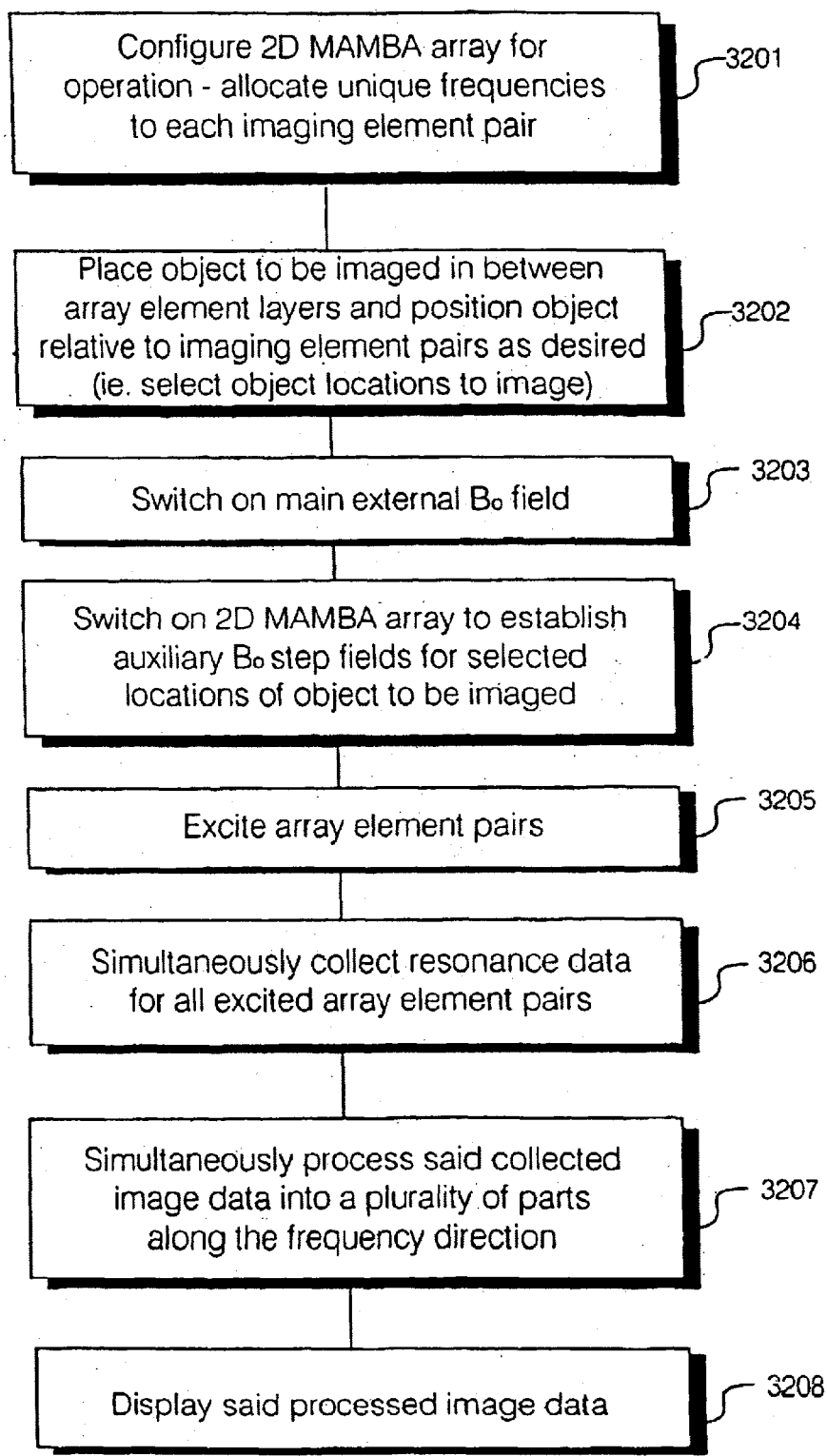
Figure 33:
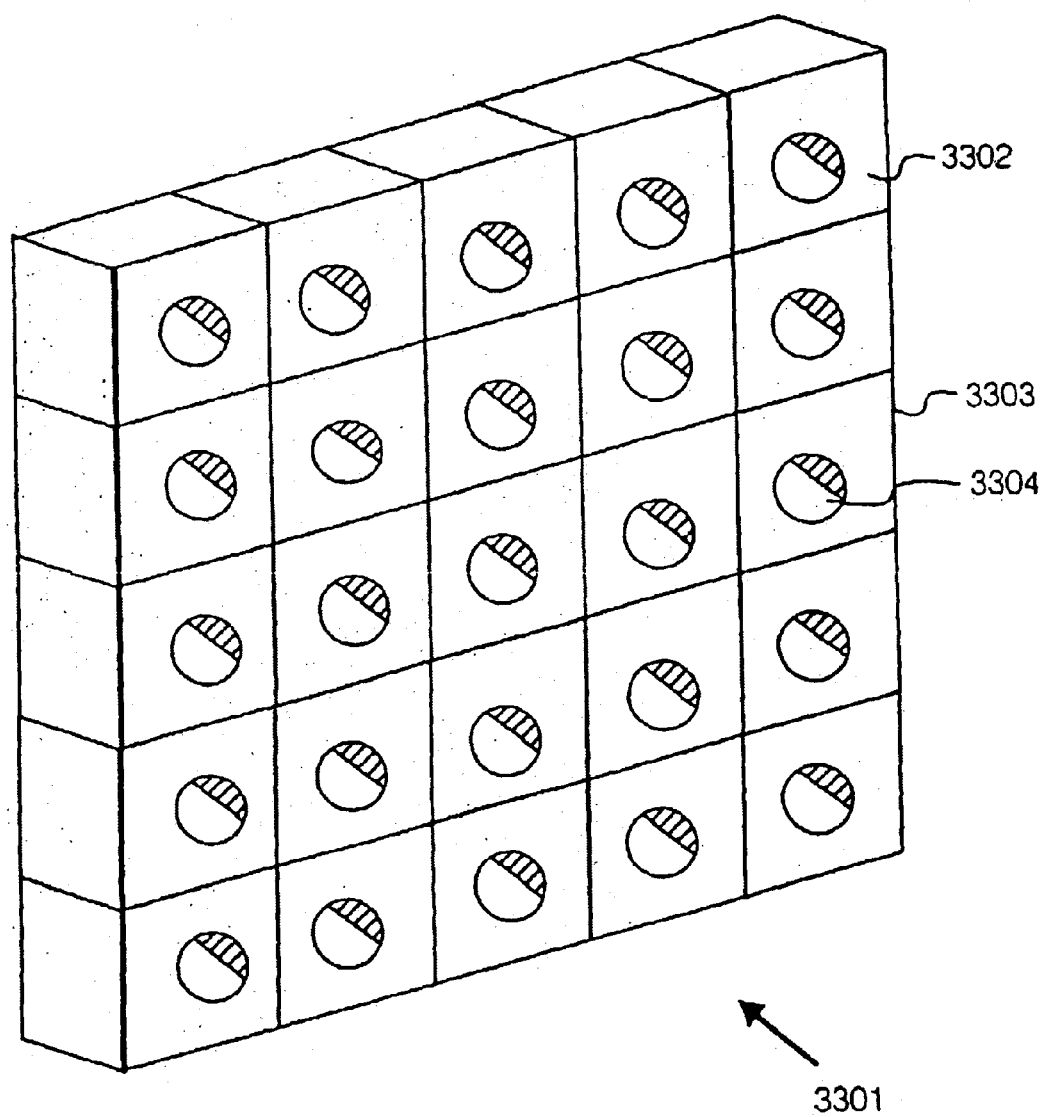
Figure 34:
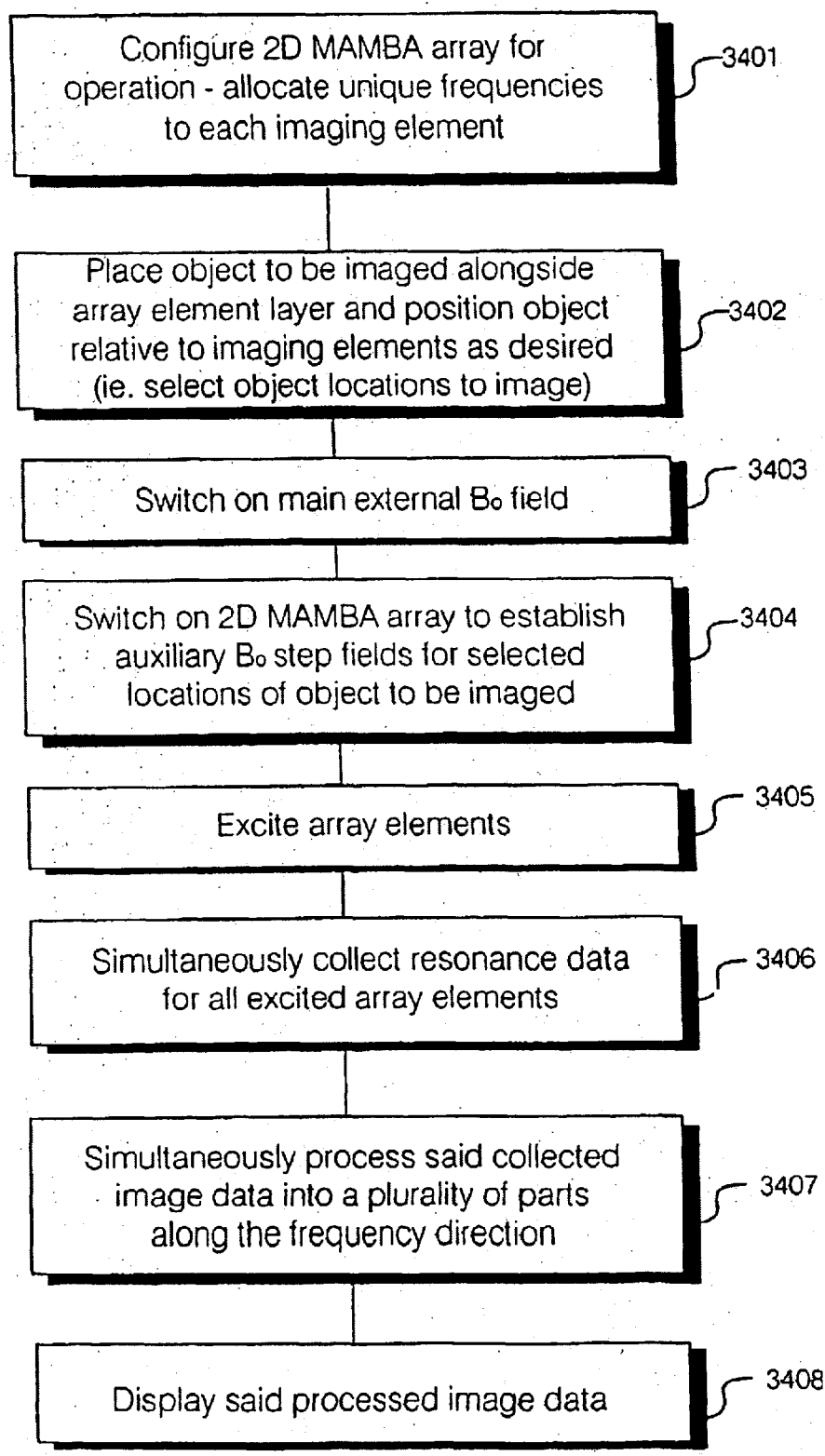
Figure 35:
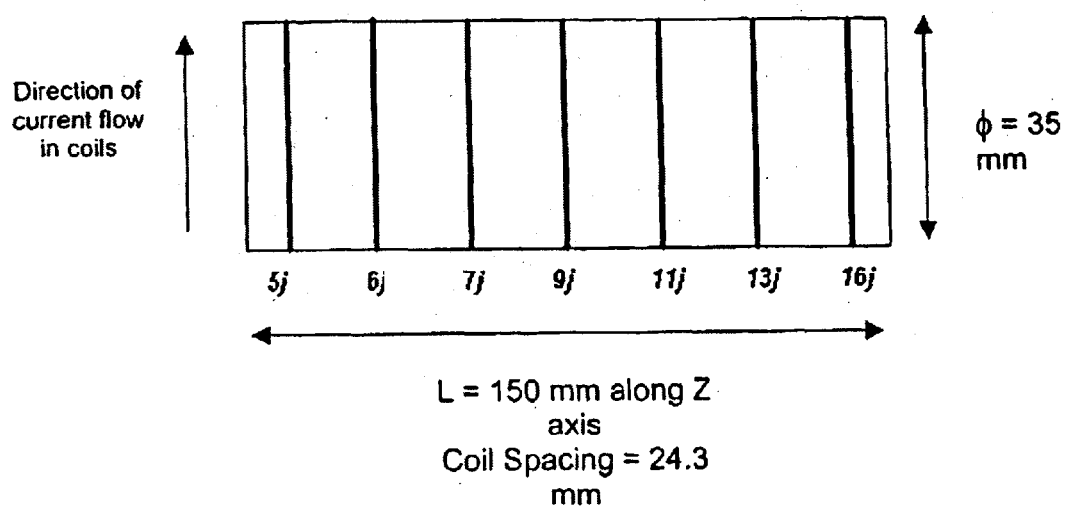
Figure 37:
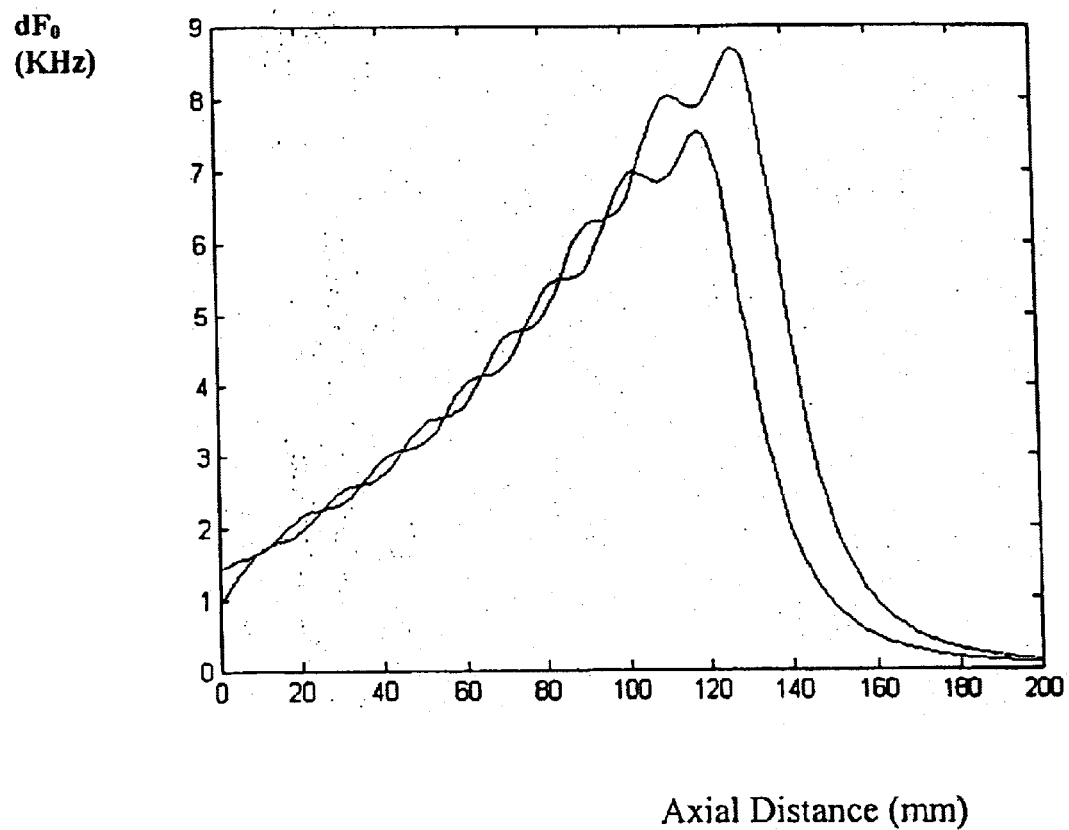
Figure 38:
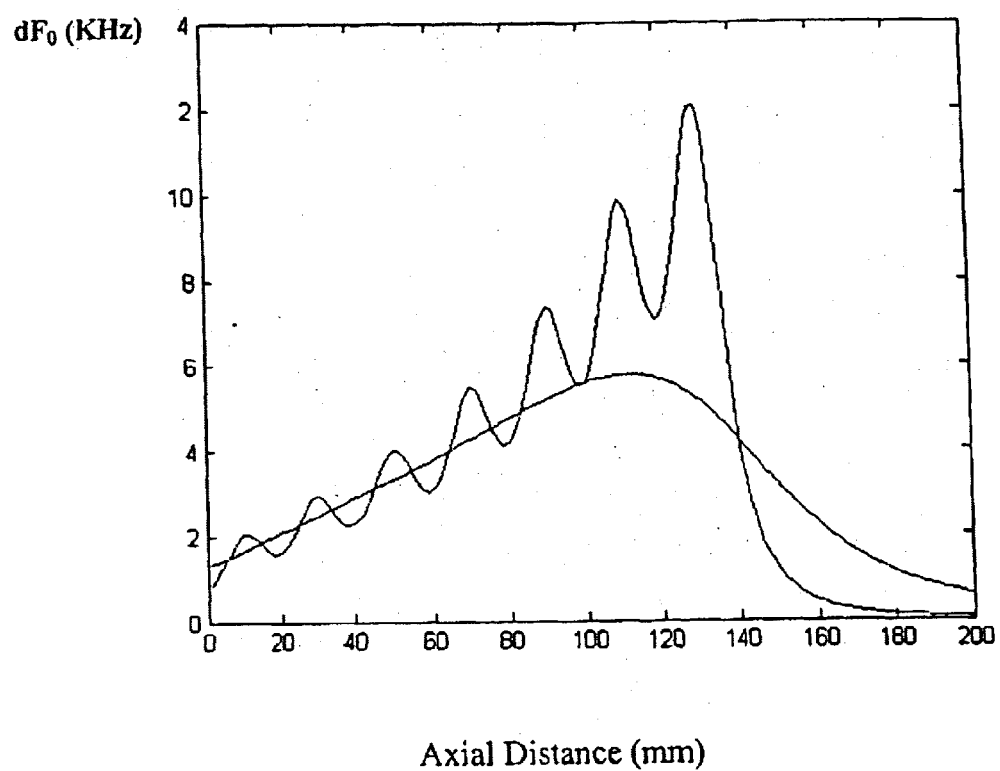
Figure 41A:
Figure 41B:
Figure 41C:
Figure 42:
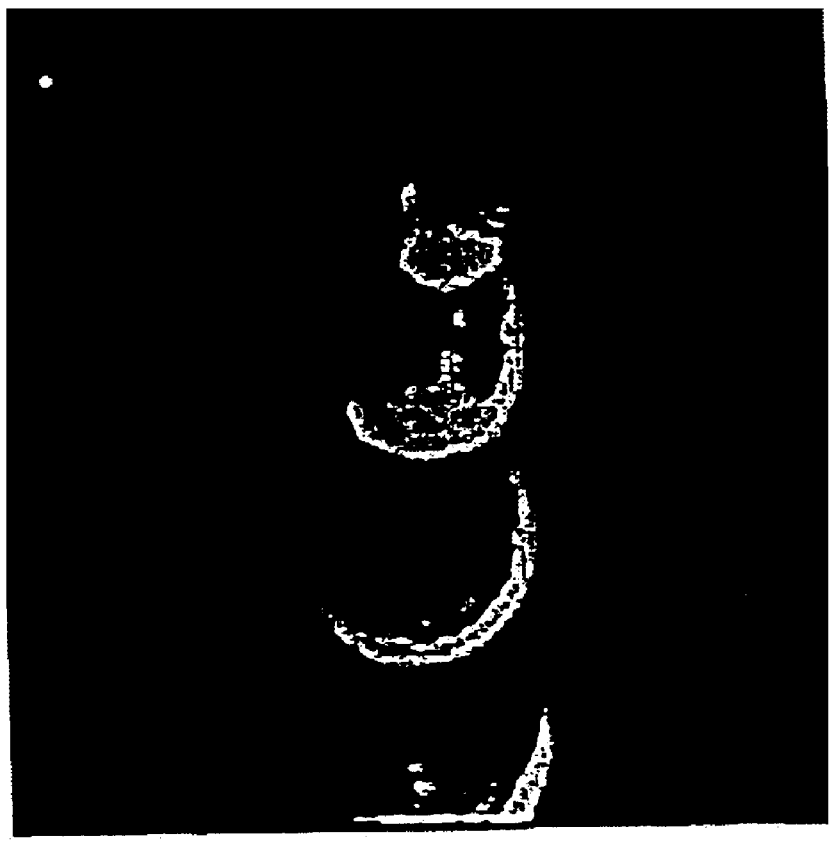
Figure 43:
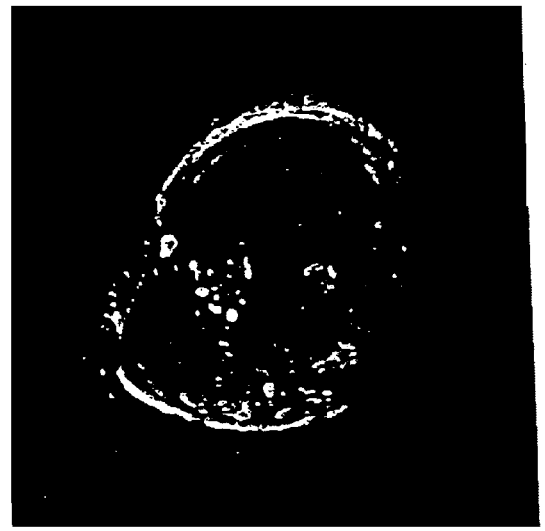
Figure 44:
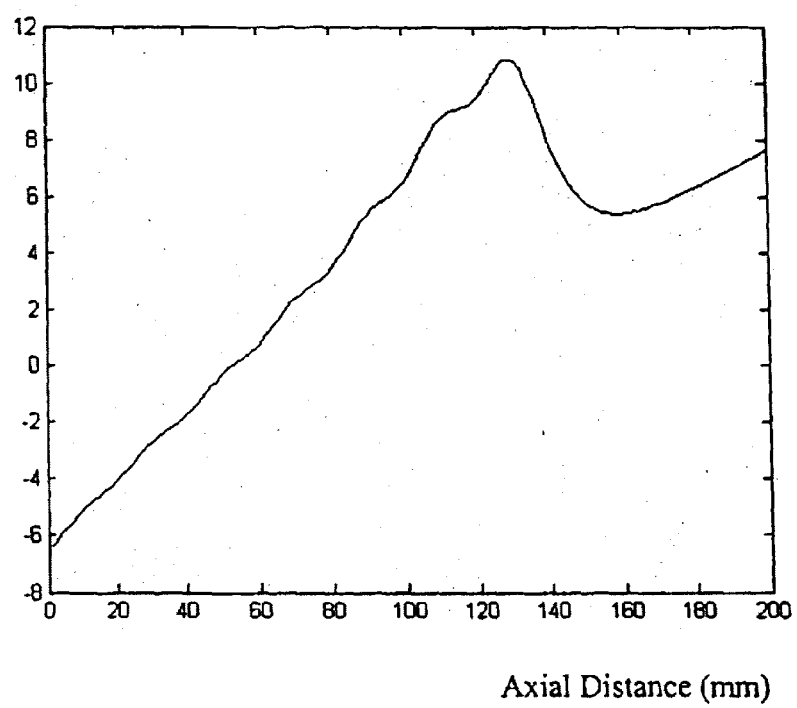
Figure 45:
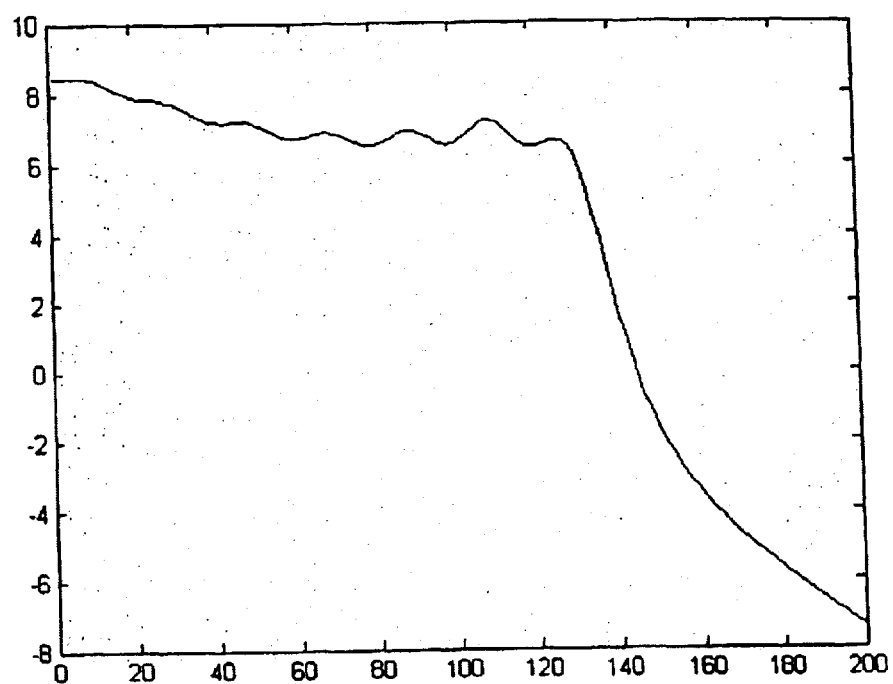
Figure 46:
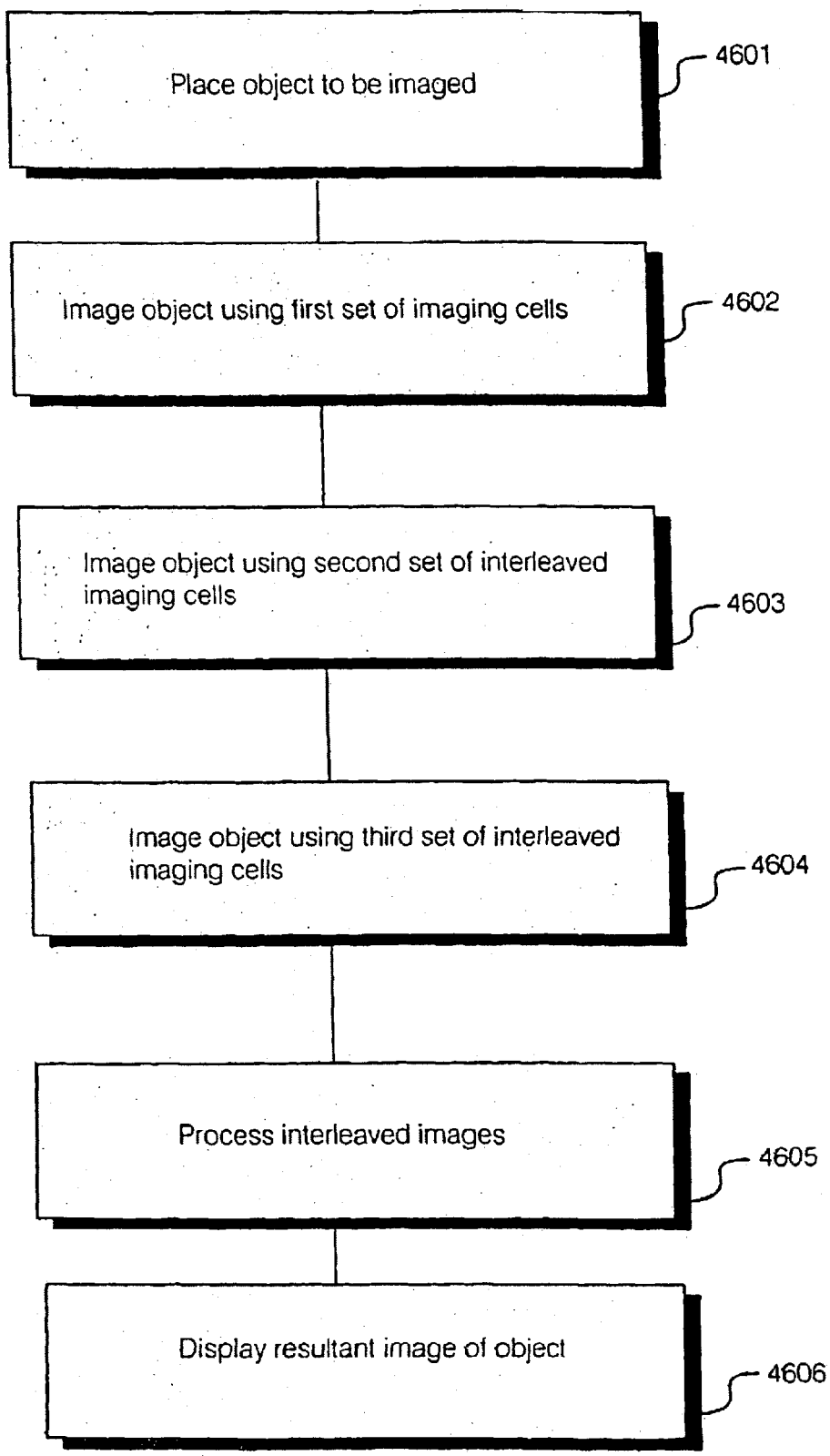
Figure 47:
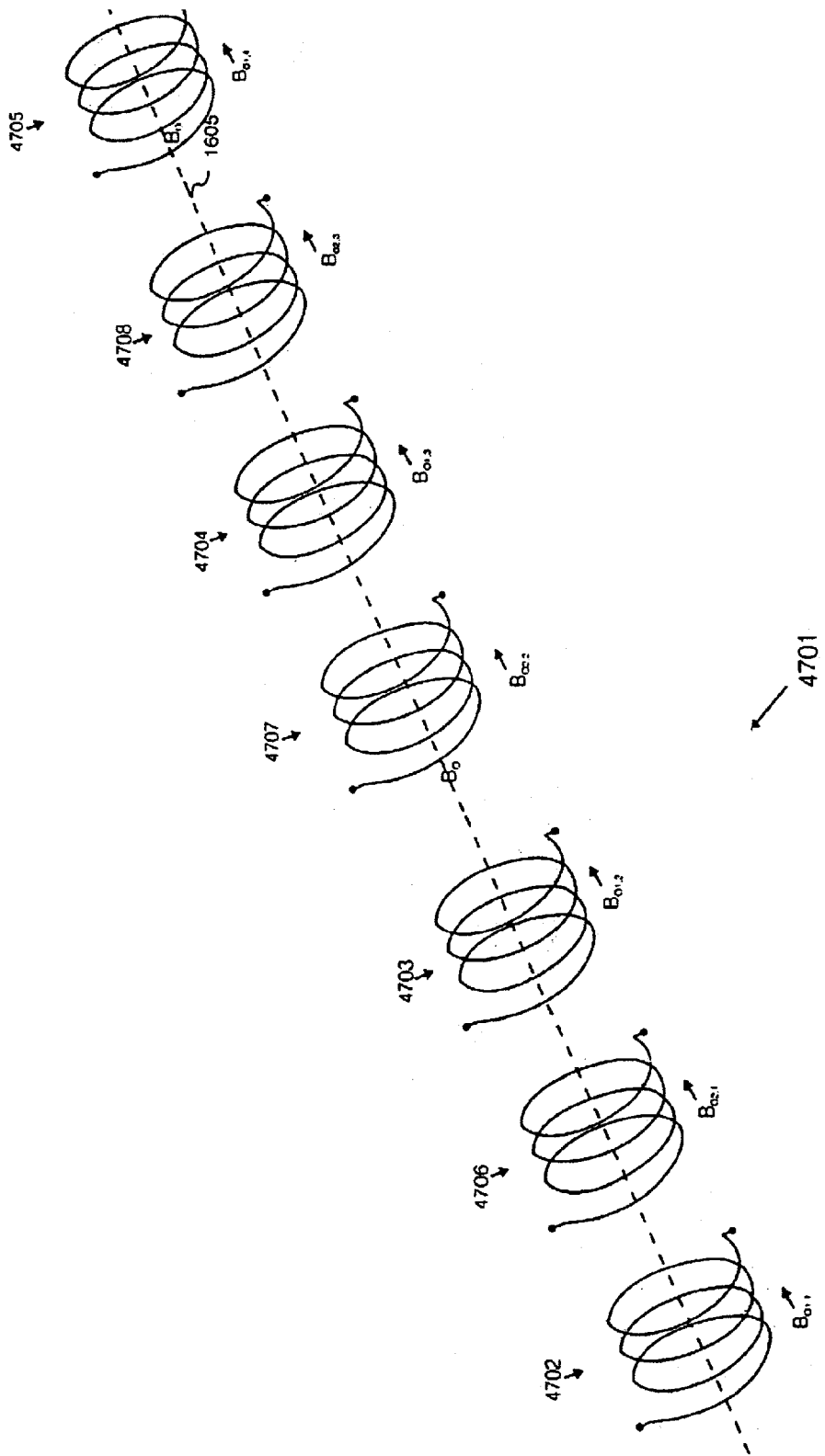
Figure 48:
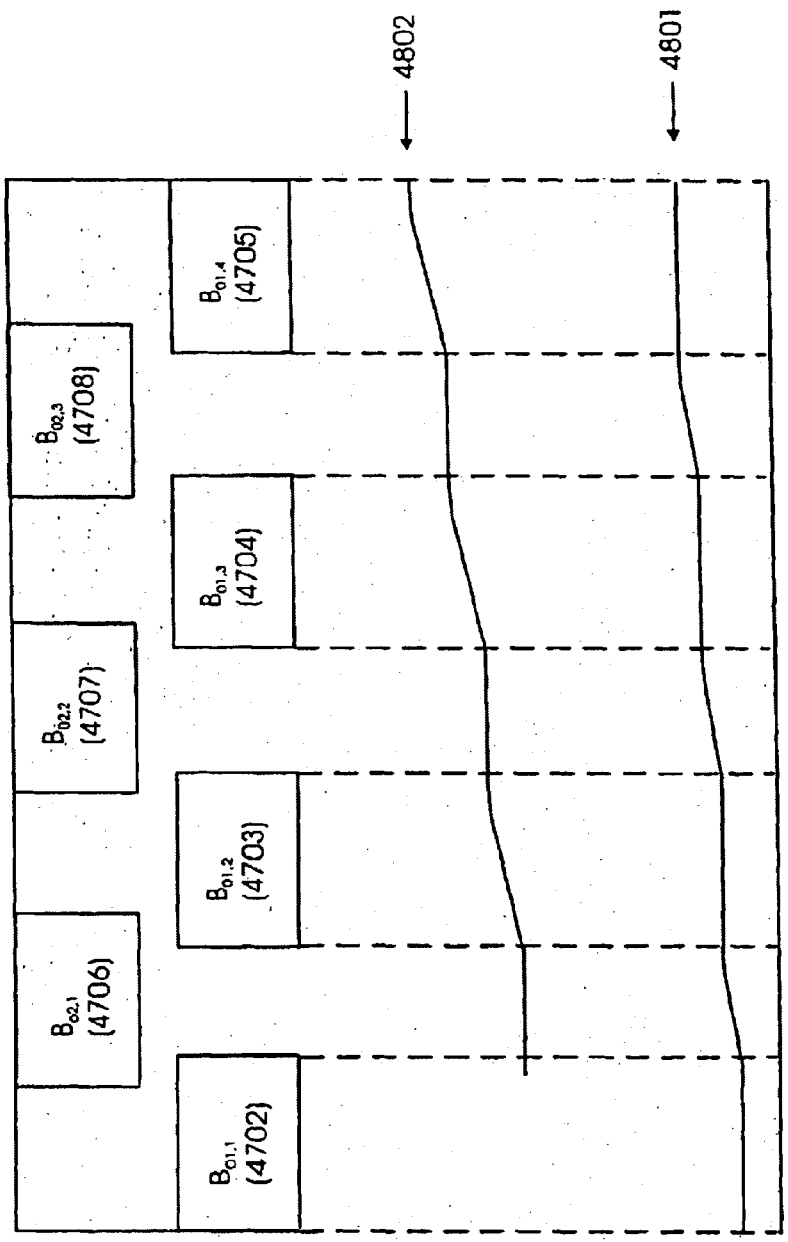
Figure 49:
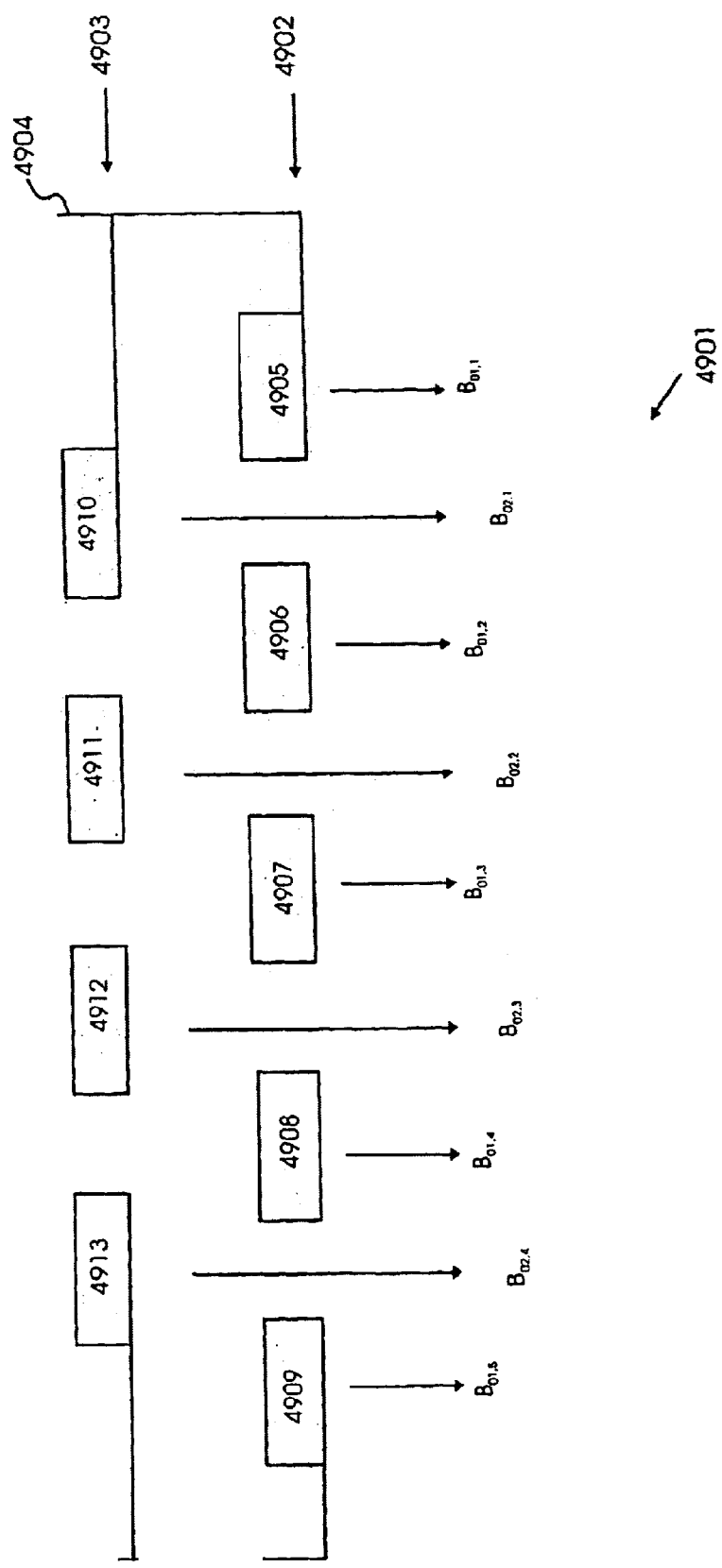
Figure 50:
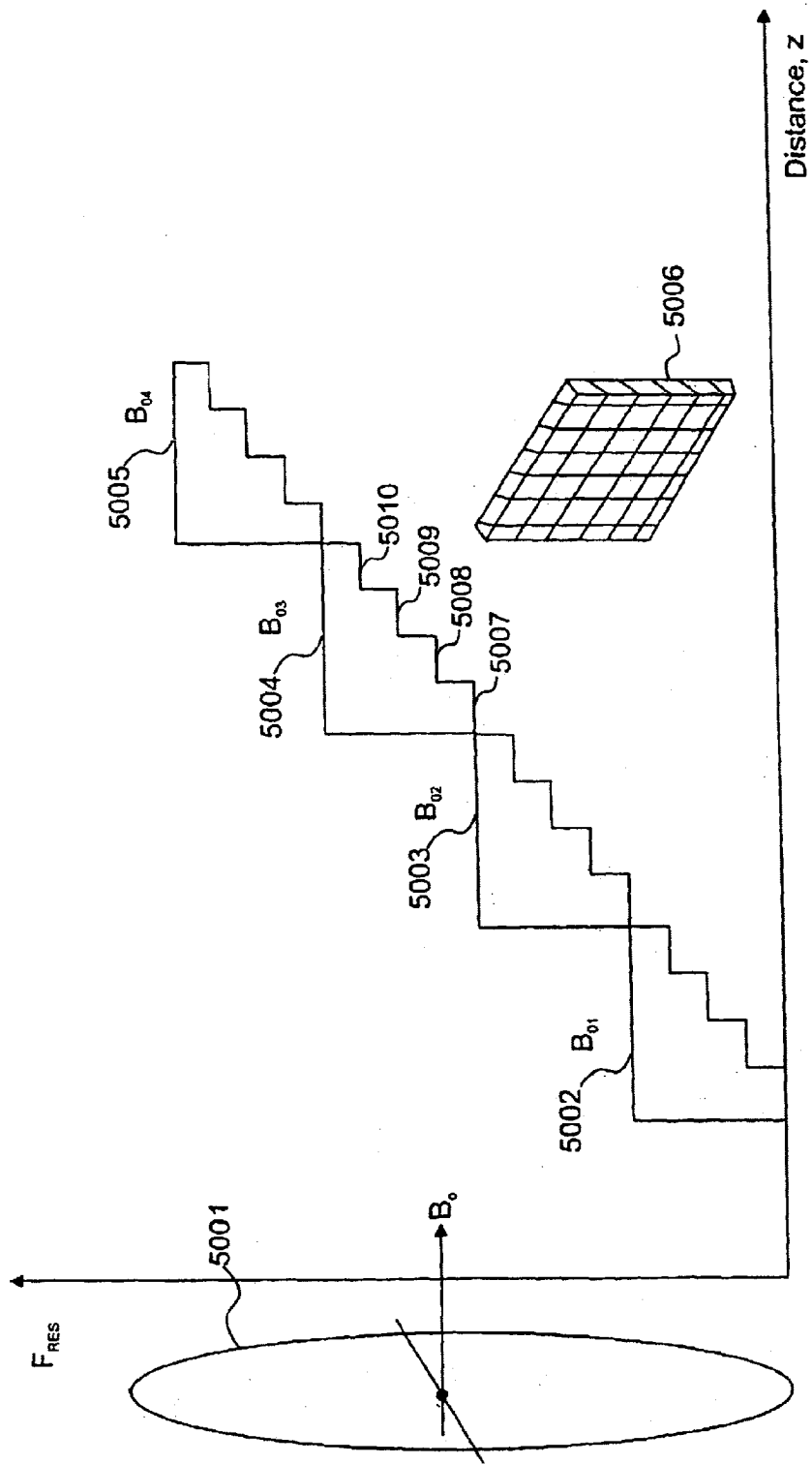
Figure 51:
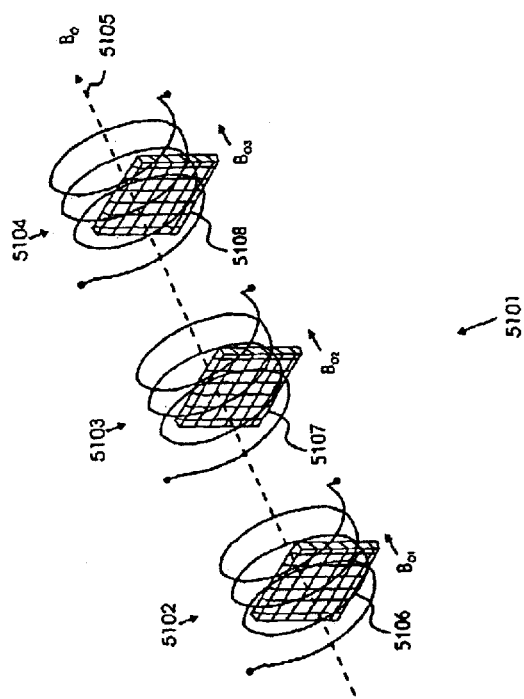
Figure 52:
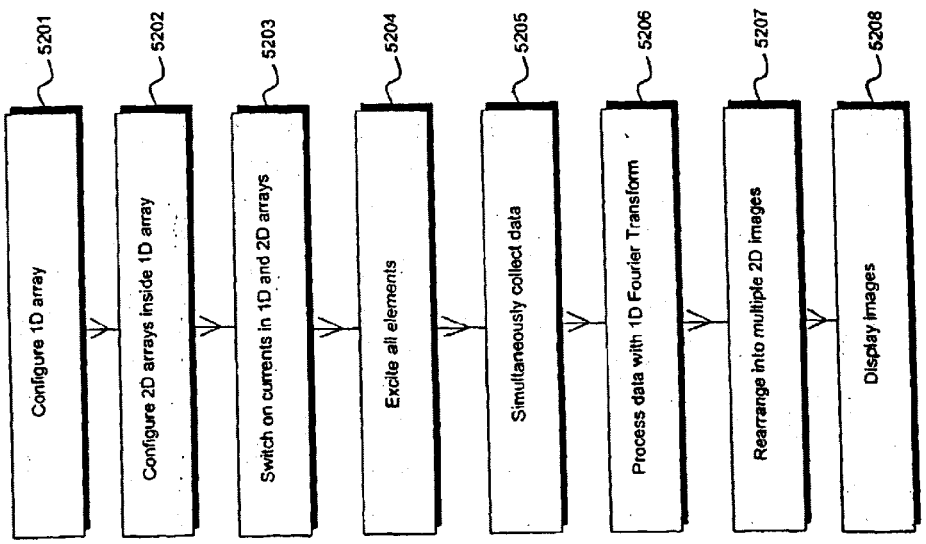
Figure 53:
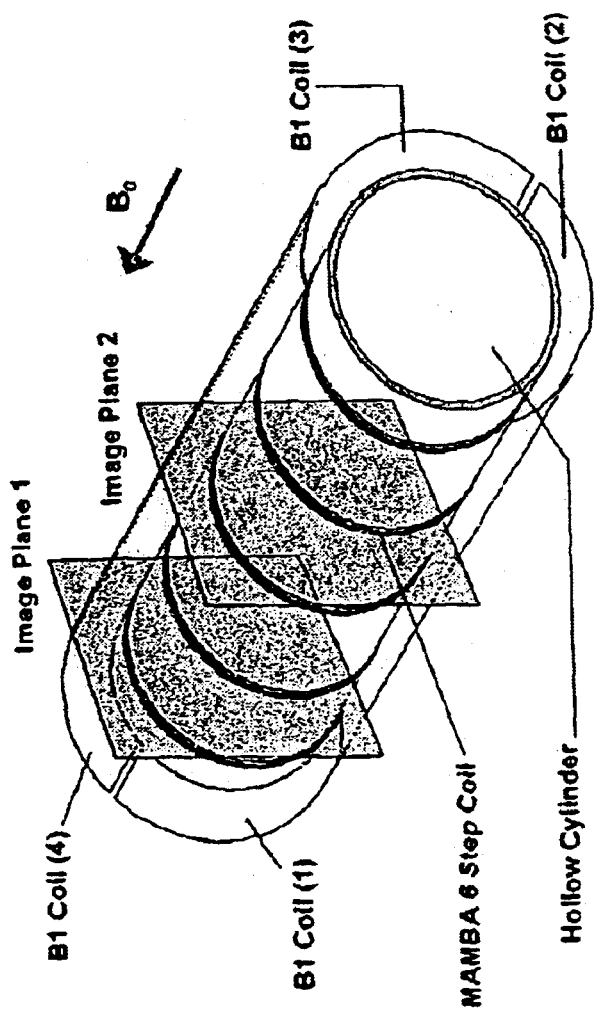
Figure 54:
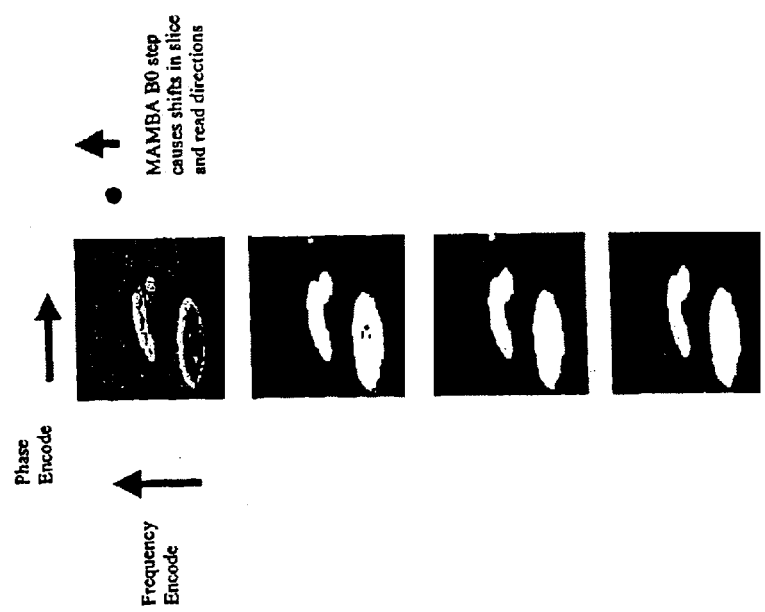
Figure 55:
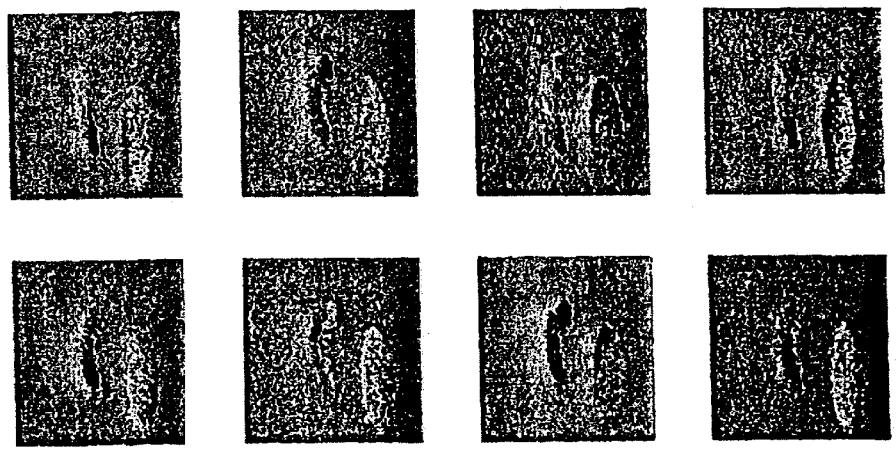

FIG. is a schematic illustration of a uniform magnetic field generated by the prior art imaging chamber shown in FIGS. 1 and 2, and additionally depicting an applied gradient;

FIG. 4 schematically illustrates, in accordance with an aspect of the present invention, the design of a single-step coil insert: 4 collinear circular coils of radius a, with spacings, turns and current directions as shown, a=2 cm and current j=0.2A;

FIG. 5 schematically illustrates calculated axial field of the single-step coil insert of FIG. 4. The thickened line segment shown at the top of the Figure indicates physical extent of the coils in axial direction;

FIG. 6 schematically illustrates design of a double-step coil insert: 8 symmetrically placed circular coils of radius a, with spacings, turns and current directions as shown, coil radius a=2.5 cm and current j=0.15A;

FIG. 7 schematically illustrates calculated axial field of the double-step coil illustrated in FIG. 6. The line segment at the top of the Figure again indicates physical extent of the coils in axial direction;

FIG. 8 shows an image of a line phantom along the axis of the single-step insert of FIGS. 4 and 5, with current (a) j=0A and (b) j=0.2A;

FIG. 9 shows the image obtained of the same line phantom as for FIG. 8, placed along the axis of the double-step insert identified in FIGS. 6 and 7, the image having being obtained using current in FIG. 9(a) of j=0A and in FIG. 9(b) j=0.15A;

FIG. 10 schematically illustrates the curve resulting from subtraction of the midpoints of the line phantom in FIG. 9(b) from those of FIG. 9(a), the resultant curve showing the variation of auxiliary magnetic field strength with position along the axis. The solid line shows measured shift in line source position produced by the single-step field generated by the single-step coil design of FIG. 4. The dashed line represents the fitted theoretical axial field. Pixel size is approximately 0.63 mm per pixel;

FIG. 11, also showing image pixel difference with respect to image pixel as for FIG. 10, includes a solid line showing measured shift in line source position produced by the double-step field and a dashed line showing the fitted theoretical axial field. Pixel size in this case is again approximately 0.63 mm per pixel;

FIG. 12 shows images obtained from simultaneous imaging of two fruit phantoms produced in a single-step field: (a) aliased image with j=0A and (b) separated phantoms with j=0.2A FIG. 13 shows simultaneous imaging of two fruit phantoms in the double-step field: (a) aliased image with j=0A and (b) separated phantoms with j=0.15A;

FIG. 14 schematically illustrates stepped auxiliary $B_0$ fields as configured in accordance with an aspect of the present invention;

FIG. 15 schematically illustrates, in accordance with an aspect of the present invention, the main steps involved in simultaneously obtaining multi-slice MR images of a physical entity being imaged;

FIG. 16 schematically illustrates, in accordance with an aspect of the present invention, a one-dimensional MRI apparatus capable of generating one or more stepped auxiliary $B_0$ fields;

FIG. 17 schematically illustrates, in accordance with an aspect of the present invention, an example of a MAMBA 2D array comprising 5×5 auxiliary field coils;

FIG. 18 schematically illustrates the MAMBA 2D array of FIG. 17 in position in a known MRI scanner apparatus;

FIG. 19 schematically illustrates, in the form of a table, the 5 by 5 MAMBA array of FIGS. 17 and 18, the arrays operational configuration having been designed using a genetic algorithm and the table showing the number of turns in each coil, each imaging cell being identified by the corner letter, a, b, c etc.;

FIG. 20 schematically illustrates, in the form of a table, the calculated field strength at the center of the 2D MAMBA coils arranged as shown in FIGS. 17 and 19 and ranked in order of field strength;

FIG. 21 shows a graph of theoretical field strengths in the center of the coils (•) as generated by the genetic algorithm array design identified in FIG. 19; there is a linear fit for calculated field verses coil rank;

FIG. 22(a) shows the image obtained from using the MAMBA array of concern in FIGS. 17 to 21 after Fourier transformation of data from calibration with one pellet phantom;

FIG. 22(b) shows the spectral profile (intensity versus image pixel) taken vertically through the peak identified in FIG. 22(a);

FIG. 23 schematically illustrates, in the form of a table, the calibration of the MAMBA array of concern in FIGS. 17 to 22. The Figure shows measured peak position for each coil with the expected peak positions calculated by linear fit with the values identified in the table of FIG. 19;

FIG. 24 schematically illustrates, for the 2D MAMBA array as configured in accordance with FIGS. 17 to 23, a graph comparing distribution of peaks obtained from calibration (■) with theoretical calculation (•);

FIG. 25(a) shows the image obtained, in relation to the 2D MAMBA array of FIGS. 17 to 24, after Fourier transformation of data obtained using multiple pellets in the array;

FIG. 25(b) shows the spectra profile taken vertically through the peaks in FIG. 25(a). The vertical bars above the peaks indicate expected position of peaks from calibration data and the current through the array, in this case, was equal to 33.5 mA;

FIG. 26 illustrates a spectrum obtained with multiple pellets, as for FIG. 25, that is pixel intensity verses image pixel, but with current through the array being set at 36 mA. Again bars above the peaks indicate expected position of the peaks from the calibration data. The vertical downward pointing arrows identify the peaks used for scaling purposes;

FIG. 27 shows a spectrum obtained with multiple pellets as for FIGS. 25 and 26, with current through the array being set at 36 mA, but with the array having being rotated by 35° to the main $B_0$ field;

FIG. 28 shows the spectrum obtained from the 2D MAMBA array as obtained with pellet phantoms in all 50 coils, again the bar and downward arrow notation being used. The current through the array was set at 36 mA;

FIG. 29 shows the spectrum obtained from the 5 by 5 MAMBA array with pellet phantoms in all 50 coils, but with the current through the array set at 60 mA;

FIG. 30 schematically illustrates a cross sectional view though a 2D 5 by 5 MAMBA array, as configured for use in imaging a physical entity in a medical application or in an industrial application;

FIG. 31, schematically illustrates, in cross section, an n-th imaging cell of an array configured from a plurality of stacked field correction coils;

FIG. 32 schematically illustrates, in accordance with an aspect of the present invention, the main steps involved in acquiring MR data in two dimensions for a given physical entity being imaged by imaging arrays located on opposite sides of the physical entity;

FIG. 33 schematically illustrates, in accordance with a further aspect of the present invention, a single layer array of imaging cells configured for use in imaging a physical entity placed alongside the array;

FIG. 34 schematically illustrates the main steps involved in acquiring 2D MR image data using the single layer imaging cell array of FIG. 33;

FIG. 35 schematically illustrates an example of a MAMBA coil design having six auxiliary field steps and being configured for interleaved imaging;

FIG. 36 illustrates a table of values used to construct the MAMBA coil schematically shown in FIG. 35;

FIG. 37 schematically illustrates the calculated axial fields of the interleaved 6-step field, schematically illustrated in FIG. 35;

FIG. 38 schematically illustrates the calculated field as the ratio of spacing of the loops to radius is set to various values, with the current ratios given in FIG. 36;

FIG. 39 shows a set of multi-slice axial images of a line phantom imaged using the interleaved 1D coil array illustrated in FIG. 35;

FIG. 40 shows images obtained through the hand and forearm of a volunteer as acquired using the device of FIG. 35;

FIG. 41 illustrates further images obtained with the device schematically illustrated in FIG. 35;

FIG. 42 illustrates further images obtained using the device of FIG. 35;

FIG. 43 illustrates yet further images obtained using the device of FIG. 35;

FIG. 44 schematically illustrates a bias on the linear slice selection gradient introduced by additional field step;

FIG. 45 illustrates a further graphical representation of relevant parameters in the design of an interleaved imaging device;

FIG. 46 schematically illustrates the basic steps, in accordance with the present invention, involved in imaging a physical entity using interleaved sets of imaging cells;

FIG. 47 schematically illustrates interleaved sets of magnetic field producing coils as configured in accordance with the present invention for MR one dimensional imaging;

FIG. 48 schematically illustrates the resultant stepped auxiliary $B_0$ fields for the interleaved set of coils depicted in FIG. 47;

FIG. 49 schematically illustrates two layers of interleaved coils configured in accordance with the present invention for a single layer two dimensional imaging device which maybe placed against a physical entity. The two layers are shown in cross section;

FIG. 50 schematically illustrates, in accordance with an aspect of the invention, the concept of three dimensional imaging using 1D imaging coils to create the main stepped auxiliary $B_0$ fields, each 1D coil being coupled with a 2D array of imaging coils;

FIG. 51 schematically illustrates a physical embodiment of an array of 1D imaging coils for producing auxiliary $B_0$ fields wherein each auxiliary coil is coupled with a 2D imaging array of coils to FIG. 52 schematically illustrates the main steps involved in acquiring MR images using a three dimensional imaging system of the type illustrated schematically in FIGS. 50 and 51;

FIG. 53 schematically illustrates the apparatus for the technique of $B_1$AC-MAMBA imaging and shows a combined parallel slice imaging MAMBA $B_0$ step field coil located inside a four-channel phased array coil together with the positions of two simultaneously excited slices;

FIG. 54 shows a fully sampled axial scan that was acquired through the forearm of a volunteer in the presence of the MAMBA step $B_0$ field to create the sensitivity maps;

FIG. 55 shows real and imaginary sensitivity maps from all four coils created by dividing the image from each coil by the sum of squares reconstructed image and multiplying by the noise mask calculated from FIG. 54.

Figure 56A:
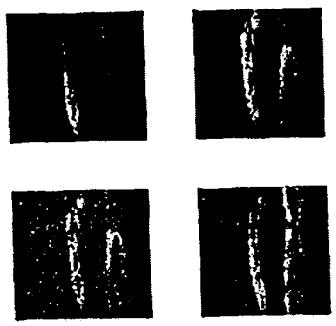
Figure 56B:
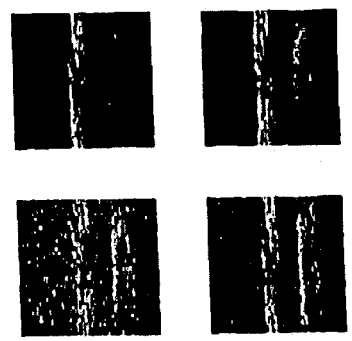
Figure 57A:
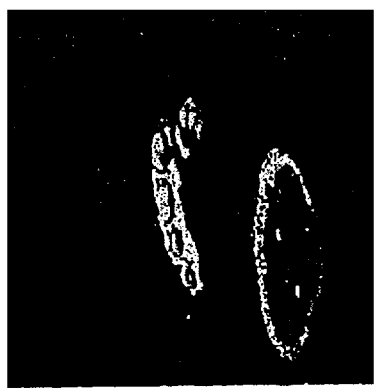
Figure 57B:
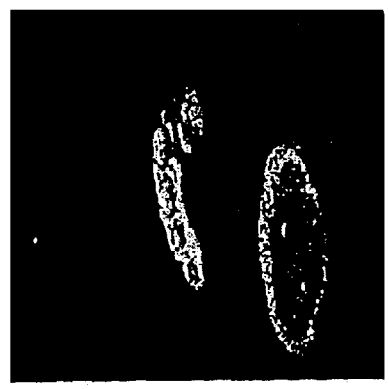
Figure 57C:
Figure 58:
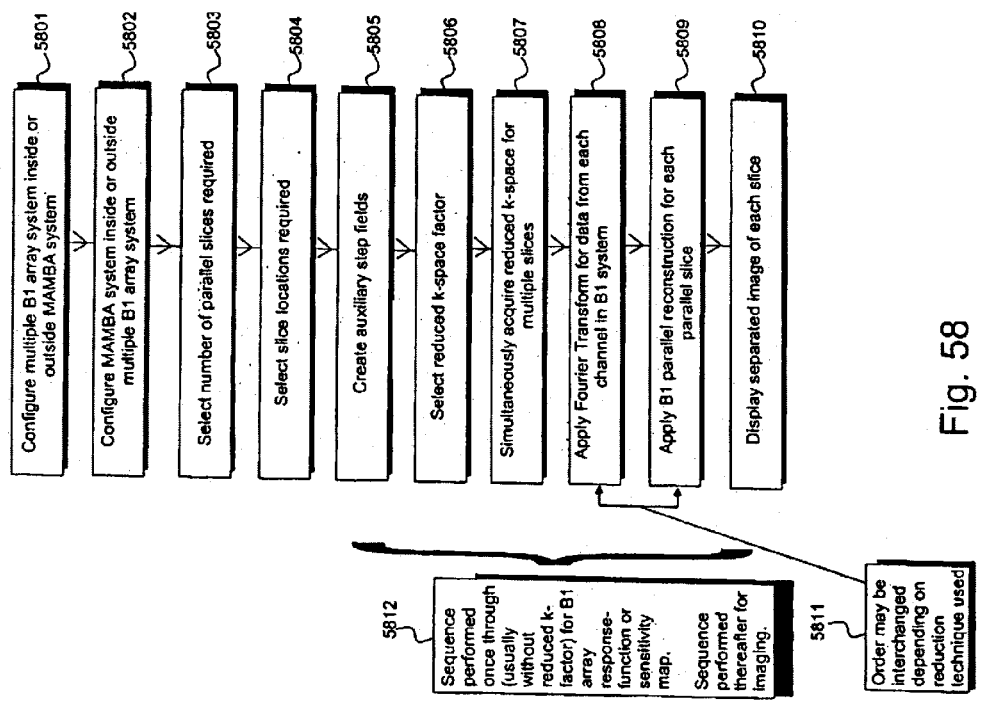

FIG. 56a shows two times under sampled, dual slice axial images of the forearm from the four array coils prior to SENSE reconstruction;

FIG. 56b shows four times under sampled images from the same data set as for FIG. 56a;

FIG. 57a shows the 'sum of squares' axial images through the forearm from the four array coils acquired using combination of dual simultaneous slice excitation in the MAMBA $B_0$ step coil and a fully sampled data set (R=1), separate from the one used to calculate the sensitivity maps;

FIG. 57b shows reconstructed axial images through the forearm together with ×2 in-plane SENSE reconstruction from the four $B_1$ array coils yielding an overall effective four-fold scan time reduction factor (R=2×2 i.e. SENSE=2, MAMBA=2);

FIG. 57c shows images of the same two slices reconstructed with ×4 in plane SENSE reconstruction yielding an eight fold scan time reduction factor (R=4×2, i.e. SENSE=4, MAMBA=2); and FIG. 58 schematically illustrates a preferred embodiment of the main steps involved in acquiring MR images using the $B_1$AC-MAMBA technique.

DETAILED DESCRIPTION OF THE BEST MODE FOR CARRYING OUT THE INVENTION

There will now be described by way of example the best mode contemplated by the inventors for carrying out the invention. In the following description numerous specific details are set forth in order to provide a thorough understanding of the present invention. It will be apparent however, to one skilled in the art, that the present invention maybe practiced without limitation to these specific details. In other instances, well known methods and structures have not been described in detail so as not to unnecessarily obscure the present invention.

(1) One-Dimensional MAMBA Magnetic Resonance Imaging

In order to overcome the problem of presenting image frequency encode aliasing, the inventors of the present invention have found that parallel simultaneous image slices maybe obtained using stepped auxiliary $B_0$ fields within the main $B_0$ magnetic field. The auxiliary fields are required to be uniform $B_0$ regions and are generated using auxiliary field coils. Each of these uniform regions are required to be of a different frequency from any neighboring auxiliary field region. In the best mode contemplated by the inventors the uniform two or more auxiliary magnetic field regions are separated in frequency by the equivalent of one or more imaging frequency encode bandwidths. The frequency separation should, in best mode contemplated, be at least equal to the imaging bandwidth. In principle, multi-frequency selective RF pulses can still be used to select desired locations in each $B_0$ field in conjunction with a slice-select gradient. Indeed any conventional imaging sequence is considered to be suitable for use with this technique. After normal Fourier transformation the image can then simply be split into two or more parts along the frequency direction to produce the simultaneously encoded slices, as all encoded slices will lie in separated frequency regions. A simple 2-coil design is described below wherein 2 steps are introduced into the main $B_0$ field (creating 2 uniform auxiliary $B_0$ regions) and which illustrates the main features of the method.

Design of Coil Inserts.

Designs to produce a single and a double step in the axial field may readily be simulated in Matlab. For ease of construction only circular coils of equal size can be considered. The expression, the well-known Biot-Savart Law for magnetic field strength $B_z$ at a distance z along the axis from the center of a circular loop, is given by:

$$B_z = \frac{CIa^2}{(a^2+z^2)^{3/2}}$$

where I is the current, a is the radius and C is a proportionality factor incorporating the permeability $\mu_0$ and other constants. In such a simulation the coils maybe further constrained to have simple current ratios and spaced at half-integer values of radius. All inserts can be wound using a single length of insulated copper wire. The total resistance's of the inserts are suitably approximately 3 ohms ($\Omega$) and 6$\Omega$ for the single- and 2-steps inserts respectively. To produce a constant current, a battery or a regulated power supply is suitable.

As will be understood by those skilled in the art there are numerous other methods available for designing the coil inserts such as, for example, the target field method.

Single Step Field

The design of a single-step field coil insert is schematically illustrated in FIG. 4 and the calculated axial field distribution is shown in FIG. 5. For testing the use of coil inserts the coils are suitably wound on a plastic former of radius 2 cm. The raised uniform step field, 501 is generally indicated about the thickened line 501 drawn above the peak in field strength. Here the raised uniform step field within the insert constitutes one imaging region, while the original $B_0$ field outside can still be used as another imaging region. In practical applications the coil radii may take on a wide range of sizes from centimeters to one or more meters depending on the particular application of MR imaging at hand.

Two Step Field

The design of a two-step field coil insert is shown in FIG. 6 and the calculated axial field distribution is shown in FIG. 7. In this case coils are again suitably wound on a plastic former of radius 2.5 cm. The auxiliary field design of FIGS. 6 and 7 provides two auxiliary field steps within which imaging may take place. The resonance frequencies inside the steps are offset from that of the main field in opposite directions.

The axial fields of the single and two-step field coil inserts may readily be verified by placing them in a low field 0.2T MRI system (e.g. Innervision MRI, London) with field coils parallel to the main $B_0$ field direction. A 14 cm tubular phantom filled with Gadolinium doped water can then be placed approximately along the axis of the insert, and a reference spin-echo image acquired of the vertical plane containing the axis with the phase-encoding direction parallel to the axis and frequency-encoding perpendicular to the axis. The following parameters were used: repetition time TR=500 ms, echo time TE=20 ms, slice thickness=5 mm and field of view=16 cm, which corresponded to an imaging frequency encode bandwidth of 10 kHz. By imaging bandwidth it is meant the reciprocal of the image-sampling rate. A suitable RF pulse can be configured to be broadband to cover the range of resonance frequencies present. A suitable current can then be passed through the coils to create the step fields and the scan repeated. The current actually utilized in each case was 0.2A for single-step and 0.15A for the 2-step field coils. Following acquisition of data the resultant raw data may then be transferred to a personal computer and imported into Matlab (or another computer program having a similar use) for analysis. The images actually acquired of the line phantom in the axis plane are shown in FIG. 8 for the single-step coil and step coil and FIG. 9 for the 2-step coil. In both FIGS. 8 and 9 (a) was imaged without auxiliary $B_0$ fields and (b) was imaged with the auxiliary $B_0$ fields. The frequency-encode axis is vertical in the Figures and therefore shifts in this direction between parts (a) and (b) of each Figure are proportional to the change in magnetic field introduced by the auxiliary coils. The midpoints of the tube phantom in the (b) portion of the Figures were subtracted from those of (a) to give a curve showing the variation of auxiliary field strength with position along the axis. This curve is shown, together with the fitted shift from the theoretical axial field for the single step field in FIG. 10 and for the two-step field in FIG. 11.

In addition to verification of axial fields as described above, simultaneous imaging can also be readily tested. Two phantoms to be imaged (such as small fruit) of diameter of approximately 2 to 2.5 cm are suitable, each placed in a uniform auxiliary $B_0$ region, arranged in a line along the axis. For the single-step case, this meant that one phantom was placed within the main field, and the other placed within the coil in the region corresponding to the magnetic field step. In the case of the two-step coil arrangement a phantom was placed in each of the regions corresponding to each step. The image plane should be selected to be perpendicular to the $B_0$ field. The slice select gradient was switched off so that imaging resulted in the projection image being along the axis direction. Using the same acquisition parameters as for the line phantom case above, a reference image was first acquired with no current through the coils and then the acquisition repeated with a step field produced by a current through the coil insert. Again, this was 0.2A and 0.15A for the single- and two-step inserts respectively. The images acquired of the phantoms are shown in FIG. 12 for the single-step coil and FIG. 13 for the 2-coil respectively. As for the tube phantom case discussed above (a) was imaged without auxiliary fields and (b) was imaged with auxiliary, that is, stepped fields.

In the case of the line phantom tests, the auxiliary field was found to produce a change in resonance frequency and resulted in a shift in the line phantom in the frequency encode direction proportional to the auxiliary field strength. This is clearly identifiable in FIGS. 8 and 9. A plot of the measured shift was then plotted, and is schematically illustrated in FIGS. 10 and 11, and for both coil inserts a good correspondence with that expected from the theoretical model is indicated.

For the single-step field, depicted in FIGS. 8 and 9, the main features are:

a first region; an auxiliary uniform region of $B_0$ field, approximately 2 cm in length along the axis;
a second region; a transitional region, approximately 3 cm in length along the axis, where the magnetic field returns to; and
a third region; the main $B_0$ field region.

For the two step auxiliary field case a similar field to the single-step case was produced. However in this case the transitional region leads to the second step, an auxiliary uniform region of reduce $B_0$, which takes the place of the main $B_0$ field for the third region ($B_0$ field region).

In both cases steps have clearly been created in the magnetic field, and if these steps are greater than the imaging bandwidth, the resonance frequency in the first region will be wholly separated from those in the third region. Signals from the first region can then be acquired simultaneously with those from the third region and, as will be understood by those skilled in the art, separated during image reconstruction via Fourier transformation.

The experiment utilizing the two small-phantoms was performed to verify this. A phantom was placed in the first and third region. FIGS. 12a and 13a, taken without the step field show overlap and interference between the two phantoms as they share the same resonance frequency. However FIGS. 12b and 13b, taken with the step field in place, show the phantoms well separated in the frequency encoding direction. The horizontal dashed line in FIGS. 12b and 13b indicates where the image maybe separated to form individual FOVs for each phantom. Clearly therefore, the step field has enabled simultaneous time-registered imaging over two different regions. In other words the problem of superposition of two given images taken simultaneously is overcome by using auxiliary fields of the type described. Note that for the single-step field, the phantom in the main $B_0$ field remains un-shifted compared with the reference image of FIG. 12a, as expected. For the two-step field, both phantoms are shifted in opposite directions from their original positions.

Simultaneous imaging of two or more regions is also possible if an MRI scanner is equipped with multiple receive coils and channels. Although they are expensive, it is known by those skilled in the art, that they are becoming increasingly available for use with accelerated k-space acquisition techniques such as SENSE for example, as described by Pruessmann K P, Weiger M, Scheidegger M B, Boesiger P, SENSE: sensitivity encoding for fast MRI. Magn Reson Med 1999:42:952–62. However as will be readily be understood by those skilled in the art, step fields may be used with SENSE as well as other conventional MRI techniques to provide additional acceleration.

Those skilled in the art will realize that the presence of a transitional gradient in between steps is unavoidable with stepped magnetic fields, and signals from the region will be severely distorted. However this can be overcome through the use of Hadamard pluses containing only the resonance frequencies of the uniform $B_0$ regions.

In the best mode contemplated by the inventors of the present invention, the auxiliary uniform $B_0$ regions should be wide, with a narrow transitional region, giving rise to closely separated imaging regions. The above examples concerned relatively simple designs of only equal-sized collinear coils and such coils give rise to an auxiliary region of about 1 coil radius in width, and a transitional region of approximately 1.5 radii. As will be understood by those skilled in the art the above specified coil design parameters and coil configurations maybe further optimized with more complex current distributions incorporating higher-order corrections. These complex current distributions may be designed using target field methods (for example the pseudoinverse method of Hoult and Deslauriers) combined with suitable regularization techniques, such as for example, subset selection and/or Tikhonov regularization. As will be understood by those skilled in the art other methods could be used, but target field methods are found to be particularly beneficial in producing well defined steps in the main magnetic field.

Those skilled in the art will further realize that stepped field imaging of the type described herein will have many applications in both the medical and non-medical imaging technology fields. Thus for example the techniques described above are applicable to flow-imaging applications in brain/caroid imaging or peripheral limb angiography The methods described in accordance with the present invention may be termed 'parallel slice imaging' or 'stepped field imaging' and, as discussed, utilize two or more auxiliary $B_0$ fields. A schematic representation of a plurality of auxiliary $B_0$ fields is shown in FIG. 14. At 1401 there is schematically represented auxiliary field $B_{01}$ and similar fields $B_{02}$ to $B_{05}$ are indicated along the main $B_0$ direction at 1402, 1403, 1404 and 1405 respectively. The direction of the $B_0$ field is indicated at 1406, the step like nature of the resultant field produced by the auxiliary fields being indicated in the lower part of Figure by curve 1407. Between each auxiliary field there is an inclined portion of steep (non uniform) gradient such as for example at 1408 and 1409, the inclined portion at 1408 being between auxiliary fields $B_{01}$ and $B_{02}$ and the inclined-portion at 1409 being located between auxiliary fields $B_{03}$ and $B_{04}$. As indicated above the height of each step portion such as step portion 1410 representing field $B_{02}$ maybe only a few milli-teslas (mT) such as for example 5 to 10 mT. However for particular applications it maybe appropriate to configure step fields which are only a fraction of a mT or alternatively which are much higher than 10 mT. The auxiliary fields themselves maybe made using simple windings of copper wire or any other suitable electrically conducting medium which may be formed in the appropriate configuration for creating auxiliary $B_0$ fields as described above. Furthermore, depending on the specific MR application, the auxiliary coils may be cooled or superconducting. The technique described above may be termed MAMBA, an acronym for Multiple Acquisition Micro $B_0$ Array. The 1-dimensional MAMBA technique described overcomes the conventional problem that if two slices are excited simultaneously then aliasing will occur in the frequency direction. If a field step is produced as described, which is greater than the imaging FOV, then another slice can be acquired, in accordance with the present invention without alaising. Many field steps can be used, in principle, yielding multiple parallel slices. With the auxiliary field coils described it is possible to acquire data simultaneously from multiple locations within the main super-conducting magnet the without multi-shot encoding requirement of Hadamard techniques. Up to 6 step coil arrangements have also been investigated and these have been found to agree closely with theoretical predictions producing flat regions of field connected by steeper regions, although the first and last regions are, to some extent effected by end effects.

Thus, in accordance with a preferred embodiment of the present invention, the prior art apparatus schematically illustrated in FIG. 1 may additionally comprise an auxiliary field generation means having a power supply. The auxiliary field generation means may be configurable to generate one or more auxiliary magnetic step $B_0$ fields within the main $B_0$ field generated by super conducting 103. The central processing unit 110 will be configured with additional processing software to control the setting of the one or more auxiliary fields according to a users requirements. Additionally central processing unit 110 will comprise further processing software so as to process the image data received from each auxiliary field region selected for the particular physical entity being imaged.

FIG. 15 schematically illustrates the basic steps involved in imaging using stepped auxiliary magnetic fields in accordance with the present invention. At step 1501 the required number of parallel slices to obtain for a given physical entity being imaged is selected. Following step 1501, at step 1502 the particular slice locations required to be imaged are selected. The selected slice locations may include 2 or more locations in the image and are selectable using gradient coil system 101. Following step 1502, at step 1503 the required auxiliary step fields within the main $B_0$ magnetic field are established and to avoid aliasing the auxiliary field strength are separated by an amount greater than the imaging bandwidth. Following step 1503, at step 1504 the apparatus is configured to acquire the required image data for the given physical entity being imaged for each selected slice. Following step 1504, the image data acquired is further processed so as to obtain an image for each selected slice, separated from the other slices in the frequency direction. Suitably processing may utilize Fourier transformation techniques so as to separate the obtained images in the frequency direction. Following step 1505 the images are obtained may be displayed on a suitably configured display such as display 112 shown in FIG. 1.

Applications of the 1D imaging method and apparatus described include arterial spin labeling in medical imaging and industrial flow measurement along a tube for example. Arterial spin labeling is a relatively recent technique wherein an image is through a plane in the human neck is required in addition to an image in another plane in the brain. A problem to date has been that obtaining images of the blood flow at the 2 positions at the same time has proven to be not as possible using standard MRI techniques. Using the 1D MAMBA coil arrangement described a slice through the neck and a slice through the brain can be obtained at the same time and therefore the pulse wave velocity of the blood flow measured at the 2 positions simultaneously. Clearly the 1D embodiment of the present invention therefore provides further applications of MRI imaging in the medical fields.

The multiple slice imaging method aspect of the present invention is to be contrasted with the method described by Larkman et al. mentioned above in the section concerning the background to the invention. Whereas Larkman's method uses RF coils to enable simultaneous image slices to be obtained the present invention utilizes uniform auxiliary magnetic field generating imaging elements.

FIG. 16 schematically illustrates, in accordance with an aspect of the present invention, an apparatus capable of generating one or more stepped auxiliary $B_0$ magnetic fields for use in one-dimensional magnetic resonance imaging. The embodiment illustrated comprises a coil arrangement 1601. Coil arrangement 1601 comprises 3 individual current carrying coils 1602, 1603 and 1604. Coils 1602 to 1604 are arranged along the same axis and offset from each other by a small distance. Each coil generates a stepped auxiliary magnetic field of different strength to the others and for use in an external magnetic field $B_0$ as shown at 1605. Coils 1602 to 1604 respectively generate stepped magnetic fields $B_{01}$, $B_{02}$ and $B_{03}$. Other configurations of coils can equally be used including a single coil used to generate the plurality of stepped fields. Alternatively only a single stepped field maybe generated with the other required uniform magnetic field being that for a region of the main external $B_0$ magnetic field, the minimum requirement being two uniform fields offset in their responsive frequencies from each other. In the one dimensional imaging technique described each imaging element (coil) thus modulates the frequency of the MR signal and from a priori knowledge of each coil's three dimensional location it is possible, after a single Fourier transform, to localize the MR signal in space. This also applies to the multidimensional embodiments of the present invention described below.

(2) Two and Multi-Dimensional MAMBA Magnetic Resonance Imaging

As discussed in the background to the invention a problem with prior art 2-dimensional MRI encoding is that a switched gradient or phase encoding has to be used. Switching of this kind is time consuming and places strains on the imaging process, particularly in environments where movement of the physical entity being imaged is required to be minimized. In accordance with the present invention MAMBA coils may be arranged in a 2-dimensional array for instantaneous 2-dimensional encoding with no pulsed field gradients. The coil may be wound from a single conducting wire such as copper wire or may comprise several such wires. This new method is achieved by combining MAMBA coils into an array so as to produce a unique local magnetic field within each coil when placed within the $B_0$ field of a standard MRI scanner. In this way each known location of a coil is associated with a unique resonant frequency. Each coil then represents a location of a pixel in the plane, and after Fourier transformation of the signal the resultant frequency spectrum gives immediately the spin distribution in the plane of the array. In effect the 2-dimentional spatial distribution is frequency encoded without the use of switched gradients or phase encoding. As only static fields are used, this technique provides fast imaging and furthermore signals from different locations are also inherently time registered. Known methods of acquiring data in 2-dimensions require frequency and, phase encoding using switched magnetic gradients, and spatial localization is generally performed using the spin-warp method. The disadvantages of the known prior art methods stem from the requirement to switch gradients rapidly, which places stringent demands on the stability of the imaging system. For example, small phase errors arising during data acquisition from eddy currents, for example, can result in severe artifacts in the resultant images. Also, the minimum echo time for acquisition is lengthened due to the need to encode using switched gradients. In accordance with the present invention a two-dimensional array of coils is used and a new method has resulted for planar imaging by frequency encoding in 2-dimensions using only static currents.

Example of Design of a MAMBA Array.

Those skilled in the art will realize that a MAMBA array, as configured in accordance with the present invention, maybe configured in a number of ways. As an example, the array may be made of a square shaped Perspex former suitable for holding two layers of 25 coils, each layer arranged in a 5 by 5 array. In different practical applications different sized arrays maybe required and thus arrays consisting of many more elements than 5 by 5 may be configured for actual practical use. Suitable sizes for the coils are 15 mm square, and the coil layers are suitably separated by approximately 7.5 mm to achieve a Helmholtz arrangement as shown in FIG. 17. Although a Helmholtz arrangement represents the best mode contemplated for the imaging elements the main criteria for an appropriately configured array is that the imaging elements generate uniform, or as near uniform as possible, magnetic fields. The Perspex former 1701 comprises a Perspex block with 25 holes drilled into it on each side with suitable means being prodded for holding the coils in place in two adjacent holes and a separation layer being present towards the center of each hole. Each adjacent pair of coils may thereby be considered to represent an imaging cell and termed an imaging pair. Thus a first layer 1702 comprises 25 holes suitable for holding 25 magnetic field generating coils. For example, coil holes are depicted at 1702 in the middle layer and on the bottom and top row at 1703 and 1704 respectively. The second layer is indicated at 1705 and comprises similar holes for holding current carrying coils as for layer 1702. A dividing layer between each layer of coil holding holes is generally indicated at 1706 and comprises, in the embodiment shown, a narrower region in between each coil holding portion for each pair of imaging elements. Each coil pair location represents a picture element (pixel) in the final image obtained in the imaging arrangement. Of course in a working medical or illustrated embodiment of the 2D array the images obtained would be of a physical entity located between the two layers of coils rather than of pellet phantoms or other physical entitys located within each coil. The field strength at the center of a coil is the superposition of several fields from the coil itself and its neighbors. To obtain unique a magnetic field strength at the center of each coil, the magnitude and direction of current in each coil must be carefully selected. Moreover, to maximize the number of unique points within a bandwidth, the total field strength at the center of the coils should increase linearly.

Genetic Algorithm.

Although the field distribution from a square coil is relatively easily calculated from the Biot-Savart law, it is non-linear, and the problem of combining multiple coils in order to achieve desired field values at even a limited number of points is, as will be understood by those skilled in the art, a difficult one. For ease of construction and to maintain uniformity of current, the coils may suitably be wound from a single length of copper wire or another high conductance wire. This simplifies the problem considerably by constraining the coil currents to only integer values. Nevertheless, as will be understood by those skilled in the art, systematic searching of the total field distribution from even a small range of integer values is impractical. Thus, for example, attempting to use traditional optimization methods such as gradient-descent methods has been found to be flawed due to the presence of multiple local minima. On the other hand, genetic algorithms have been found to be effective in the present case where the problem to be solved involves multiple dimensions and minima. As those skilled in the art will realize the present invention should not be considered as limited to 2D arrays configured with imaging elements having strengths determined by use of a genetic algorithm since other ingenuitively applied optimization techniques may also be applied to solve the problem.

Parameters for use in a genetic algorithm configured, in accordance with an aspect of the present for MAMBA array optimization comprise, for example, the following:

constant population of 300 chromosomes, each comprising 25 genes representing the number of coil turns;

genes allowed integer values up to ±25 with the sign representing direction of current flow;

fitness judged by the total route mean square deviation from a linear fit of the resulting field strengths;

the probability of mutation: a simulated-annealing scheme is found to be suitable, starting from a maximum of 1, and falling exponentially to 0.5 after 7500 generations;

selection for mating: binary tournament is found to be appropriate;

selection strategy: elitist, with automatic selection for the best chromosome;

mating: by single-point crossover by selected chromosomes at a constant probability of 0.2; and algorithm running time: 30,000 generations.

With an array configured in accordance with the above genetic algorithm design, a 5×5 array was placed in a low strength field 0.2 Tesla standard MRI system (Inner vision MRI, London) perpendicular to the $B_0$ field direction. The setup 1801 is schematically illustrated in FIG. 18, the $B_0$ field direction being left to right across the Figure as shown. At 1802 the arrow generally indicates the main magnetic field ($B_0$) direction between super conducting magnet coil arrangement 1803. At 1804 there is provided the RF coil and within RF coil 1804 there is arranged the 2D MAMBA array, the array body being positioned substantially perpendicular to the main field direction 1802 such that the individual array coil configurations generate auxiliary magnetic fields in the same direction as the main field direction. Again in medical imaging context or an industrial imaging context, the array of imaging cells will be configured such that the particular physical entity being imaged is located between the two layers of imaging coils. As will be understood by those skilled in the art, the Perspex former may be replaced by any suitable array forming means so as to establish an array of imaging coil elements located at a desired separation from each other, depending upon the image quality required for a given application of the imaging apparatus. Due to the nature of the device imaging is suitable for fairly narrow physical entitys such as for example imaging blood flow in the human hand or imaging industrial fluid flow through into dimensions along a substantially planar flow arrangement In this configuration all gradients were switched off, and a current of 33.5 mA was passed through the micro coils using a small battery. A pellet phantom was placed in each coil in turn, and a scan was acquired using a standard RF pulse spin-echo sequence with repeat time TR=400MS, echo time TE=20 ms, number of averages NEX=64 and number of time points=256. A broadband RF pulse was used to cover the range of resonant frequencies present. The Fourier transform of the data forms the frequency spectrum, and the peak is taken to correspond to the resonant frequency at the position of the coil. Thus calibration of the pixel frequencies is achieved.

Following the result of the calibration multiple pellet localization was performed. Thirteen pellets were placed in coils that were well separated in frequency coils a, d, e, f, g, h, j, l, o, p, u, v, and y. FIG. 19 schematically illustrates a table representing the 5 by 5 MAMBA array designed by the genetic algorithm described above and shows the number of turns in each coil (± represent opposite directions), each cell being identified by the corner letter. A scan was acquired using the array parameter values detailed above, but with increased NEX=256 for improved signal-to-noise ratio. To assess the dependence on current and angle, the scan was repeated with current increased from 33.5 mA to 36 mA Keeping the current at 36 mA the array was rotated about a vertical axis by an angle of 35° from its initial position and another scan acquired. Next, the array was rotated back to its original position, and pellet phantoms were placed in all coils and another set of echo's obtained with the current set at 36 mA Finally the current was increased to 60 mA and another scan acquired. As discussed the coil configuration as optimized by genetic algorithm is shown in FIG. 19. The calculated field at the center of each coil, together with its rank is shown in the table of FIG. 20. A graph of the field strength with coil rank is shown in FIG. 21 together with the linear fit.

The results obtained with the 5 by 5 array, set up in accordance with the genetic algorithm described, were as follows. FIG. 22*a* shows the Fourier transform image of the data for coil a, and FIG. 22*b* shows the vertical profile through the peak The full-width half-maximum values for the coils ranged from 4 to 10 pixels. FIG. 23 shows the measured position of the peaks for all coils, together with the expected positions calculated from fitting the theoretical values of FIG. 20 to the measured data. FIG. 24 shows the measured and expected peak positions against coil rank Multiple Pellet Localization FIGS. 25(*a*) and (*b*) show the spectra in image and graphical form after Fourier transformation of the signal from 13 pellets with current at 33.5 mA The bars above the peaks in FIG. 25*b* indicate their expected position from the results of the calibration. FIG. 26 shows the spectra with current increased to 36 mA The bars above the peaks indicate their expected positions from the calibration data linearly scaled using the positions of the end peaks. These reference peaks are indicated with arrows. FIG. 27 shows the spectra with current at 36 mA and the array rotated by 35°, again with bars indicating expected positions from calibration data. With pellets in all coils with the array in its original position, FIGS. 28 and 29 show the spectra with current at 36 mA and 60 mA respectively, with bars where peaks may be expected from calibration data. In FIG. 29 it will be noticed that the end peaks have been shifted out of the field-of-view and so could not be used as references for scaling purposes: two other peaks were chosen instead and taken to correspond to coils r and x.

Analysis of Results

The aim of the above 2D MRI work was to perform 2D localization by frequency encoding with static currents, using auxiliary field coils in a square array to define unique magnetic field values at known locations in the plane. For maximum separation of frequencies, the currents in the coils are required to be carefully selected to ensure that the resulting fields increased linearly. As discussed, a genetic algorithm is found to generate an optimal coil array pattern such as that schematically illustrated in FIG. 19. The actual algorithm employed was found to be remarkably effective: FIG. 20 shows a theoretical average frequency separation between coils of 2.01 units. This average frequency separation is close to the maximum over the range of 48.4 units. Minimum separation is 1.22 units between coils ranked 13 and 14. If the spectra is digitized over approximately 200 image pixels, this represents an average separation between peaks of 8 pixels, with a minimum of 5 pixels. FIG. 21 clearly indicates that the genetically produced design provides values close to the ideal required linear increase.

(1) Calibration of Pixel Frequencies.

Figure 22:
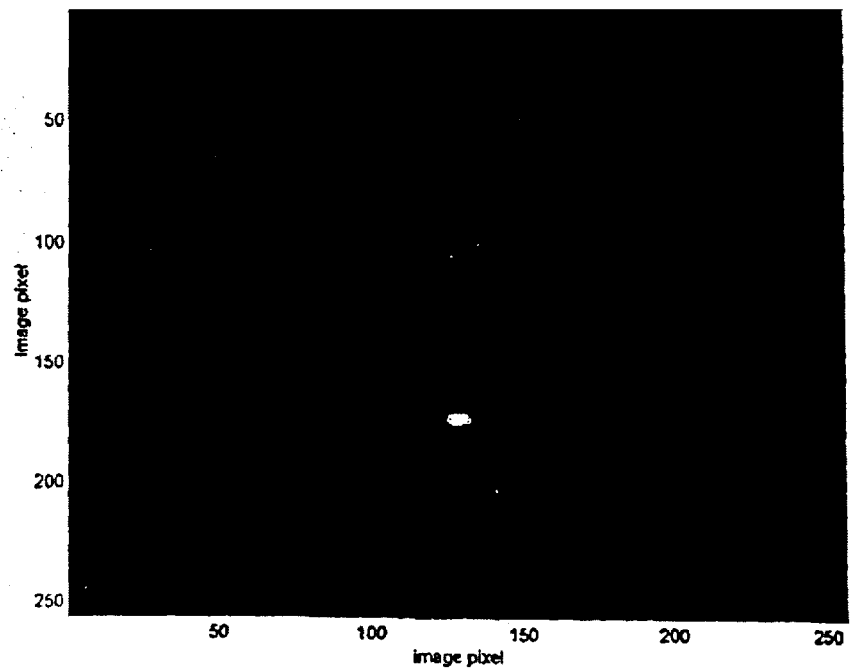
Figure 22:
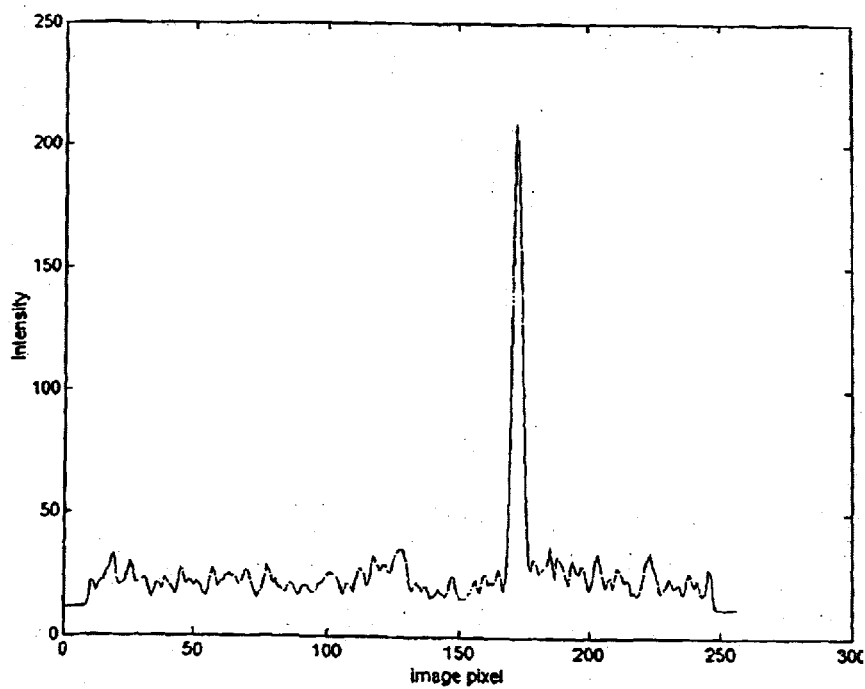

FIG. 22 shows an example spectrum from imaging a single pellet phantom. The full-width half maximum values ranged between 4 to 10 pixels. The upper value is less than that required to resolve all frequencies even if the frequencies corresponded exactly to design values. FIG. 24 schematically illustrates a graph comparing distribution of peaks obtained from calibration (■) with those obtained from theoretical calculation (•) and indicates that although the measured frequencies show roughly a linear increase, they do not correspond exactly with calculated frequencies. The inventors of the present invention consider that this is likely to be the result of imperfections in construction of the array and in particular the finite width of the wire, stray electromagnet fields from the interface connections and fluctuations in power supply etc. In some cases it can be seen that this has led to non-uniqueness in frequencies, for example between coils ranked 2–4. Generally the effect of this will be to reduce the separation between said frequencies so that they are more difficult to resolve.

(2) Multiple Pellet Localization

In respect of multiple pellet localization, in FIG. 25, the peaks from pellets in 13 locations separated in-frequency by at least 10 pixels are seen to be well resolved and close to their calibration values. 2D localization can thus be performed by mapping these peaks to their known locations within the array. Although the peaks show some degree of varying line-width and amplitude, this is not to be unexpected because the field at the center of each coil is a combination of fields from several neighboring coils, and the homogeneity of the field that each pellet experiences will not be uniform throughout the array.

However, as the fields are static, the point-spread function of each peak will be constant, and most-processing techniques such as deconvolution can thus be applied.

The spectrum in FIG. 26 was obtained after an increase in current from 33.5 mA to 36 mA The spectra have been stretched in the x-direction compared with FIG. 25(b), corresponding to an increase in the local $B_0$ fields. To calculate the new expected values, the end peaks have been used to scale the theoretical values accordingly. The peaks are still found to be close to their expected values. Importantly, from most of the peaks, the line-widths have been unchanged and in some cases the line-widths have even narrowed, leading to their better separation. Maintenance of line-width with increasing current is thus considered to be critical if this is to be used to improve separation between peaks. FIG. 27 shows the spectrum obtained after the array has been rotated at an angle to the main $B_0$ field. Compared with FIG. 26, it is seen that the spectrum has been compressed in the x-direction, indicating the reduction in the effective local field, generated by the auxiliary coils. Otherwise, the spectrum is only changed slightly as compared with FIGS. 25 and 26, but good separation is observed between the peaks. There are, inevitably, regions of non-unique fields between the coils. Such regions of non-unique fields were avoided in the 2D work described above tests by using pellet phantoms and thereby restricting the presence of spins to within the coils only. For more general use, it is envisaged by the inventors of the present invention that limiting the signal to that within each field coil by means of individual received coils placed inside the fields will be highly beneficial. If the received coils are parallel and collinear with the field coils, it will require the array to be placed at an angle to the main $B_0$ fields. FIG. 27 clearly shows that this can be done without significantly effecting the distribution of frequencies.

FIG. 28 shows the spectra obtained when all locations in the MAMBA array were filled with phantom pellets. Again, using the end peaks to scale for any change, e.g. fluctuations in current, many of the peaks can be clearly identified. Nevertheless those skilled in the art will observe that poor line-widths or non-unique frequencies have resulted in some of the peaks merging into one broad peak. In FIG. 28, the current has been greatly increased, stretching spectra further. The end peaks have been shifted out of the imaging bandwidth and therefore it was necessary to use 2 other peaks to perform the required re-scaling. Overall in this configuration there is less agreement between the peaks and their predicted positions, but an increase in error due to resealing is not to be unexpected. However, increasing the current resulted in resolving some of the broad peaks into their component peaks e.g. the peak in FIG. 28 at pixel 75 has spilt into its components to form the doublet at pixel 47 and 49 in FIG. 29. Those skilled in the art will understand that the fact that increasing the current does not necessarily result in an increase field inhomogeneity and a loss of resolution thereby means that it could be used to improved separation of the spectra.

In view of the above, an aspect of the invention concerning frequency encoding in 2D using static fields generated by an array of auxiliary field coils, has proven to be effective. It is necessary to generate locations in the plane, which have unique frequencies, and preferably the unique frequencies for each location are generated using a genetic algorithm for a given array under construction. 2D imaging within a single echo, as described by way of example above, has the advantages of speed, stability of static magnetic fields and the absence of switched gradients. As those skilled in the art will readily appreciate, the size of the array and the spectral range coverage may be increased considerably and/or tailored as required. Similarly the size of the coils may be increased or decreased as appropriate. The precision of fabrication may be improved considerably by, for example, implementing a MAMBA array on a printed circuit board (PCB). Further optimization of the individual coils may be achieved by shimming to optimize separation of frequencies for the various locations. Similarly the bandwidth maybe increased so as to further improve separation of frequencies—to achieve this the current can be increased. Individual receive coils for each coil may also be used so to overcome the presence of non-unique frequencies outside the coils. As those skilled in the art will realize, the method should also work with FID's with TE=0 in addition to the spin-echo sequence example described.

Potential applications include rapid fMR time series from a skullcap type array, as the signals generated will have the additional advantage of being inherently time-registered over the plane.

FIG. 30 schematically illustrates, in sectional view, a 2D MAMBA array configured for use in imaging a physical entity in an industrial or medical application. The 5 by 5 MAMBA array 3001 comprises two parallel layers of imaging elements placed within a main external magnetic field $B_0$, 3002. Typically the strength of the main magnetic field may be around 1 or 2 Tesla. The physical entity being imaged is generally indicated at 3003 and is placed between a first layer of imaging elements 3004 and second layer of imaging elements 3005. Imaging elements 3004 comprise a 5 by 5 array or another suitable sized array of imaging elements and imaging layer 3005 is configured with corresponding imaging elements. Thus layer 3004 comprises imaging elements 3006 to 3010 respectively and layer 3005 positioned opposite layer 3004 comprises elements 3011 to 3015 respectively. A pair of opposite imaging elements thus comprises an imaging element pair or cell such as element 3006 opposite element 3011, said element pairs being located on directly opposite sides of a given sample space wherein a physical entity being imaged maybe placed. Since the array comprises a 5 by 5 array then the side sectional view shows only a first row of imaging element pairs and thus 20 other imaging pairs will also subsist in the array, providing coverage over the width of, for example, a human hand. The imaging elements may comprise current carrying coils of the type described earlier. For any particular application the coil size and coil spacing can be changed as required. Thus for example the imaging elements may comprise coils of 20 mm in diameter and neighboring elements may then suitably be separated by a distance of approximately 10 mm. For an array configured of 20 cm coils the separation required would be 10 cm. The imaging array 3001 may suitably be configured for use in an existing MRI scanner or may be permanently formed within a dedicated MRI imaging machine configured for a specific application.

The imaging elements themselves maybe configured in a more complex arrangement than that schematically illustrated in FIG. 30 so as to further improve the uniformity of the actual auxiliary field generated and thus to provide squarer edges to the resultant field strength. Thus, for example, a given imaging element may comprise a series of layers of coils stacked appropriately to generate a more uniform field. Such stacking may comprise coils of different field strengths and may include spatially offsetting each coil from the next FIG. 31 schematically illustrates an n-th imaging cell 3101 of an array and configured from a plurality of stacked field correction coils. Coil 3102 is locatable closest to a given physical entity to be imaged and is operable in conjunction with two further coils 3103 and 3104 respectively, the resultant auxiliary field $B_{0,n}$ being of higher uniformity than if only coil 3102 was utilized.

Those skilled in the art will realize that improved imaging can be obtained by configuring the imaging elements on printed circuit boards so as to give greater access to imaging the plane located in between paired imaging elements. Thus in the embodiment illustrated in FIG. 30, imaging is restricted to the regions in-between the holes formed to hold the coils. Clearly the 2D imaging method described is suitable for special applications including measuring blood flow in the human finger or hand and in industrial applications where relatively narrow objects may be required to be imaged. Broader physical entities could also be imaged using the methods described, however resolution falls off with increasing distance between the imaging elements of a pair and therefore a limit will exist as regards acceptability for any particular application. Printed circuit coil arrays may find use in dentistry where a dual layer board could be designed to fit over the surface of the human teeth.

An example of an industrial application for the above identified 2D imaging technique is monitoring of the transition from liquid phase to solid phase of various materials under manufacture or use. The problem with solids is that the NMR signal decays away very quickly. With the 2D MAMBA coil array arrangement described above no switching of frequency or encode gradients are required and therefore the resonance signal from a solid can be acquired before it decays to zero. Thus for example if it is desired to observe where a plastic has melted during heating, then use of a 2D MAMBA array is well suited since it can actually measure the signal from the forming solid as a function of position.

Those skilled in the art will also understand that the methods and apparatus of the above examples may readily be modified so as to provide other forms of multidimensional imaging such as 3D imaging. Multiple planes of coils or combinations of the one and two dimensional coil arrays can be used to generalise the two dimensional example to enable imaging of three dimensional spin distributions. As no switched encoding is required the method is suitable for sampling very rapidly as is necessary for solid materials imaging. Essentially each coil can be thought of as an independent spectroscopic MR system providing a rapidly sampled time signal at a known spatial location.

As discussed, an advantage of removing the need to encode in both the frequency and phase encoding directions in 2D imaging are that time consuming switching is avoided. In accordance with an aspect of the present invention frequencies alone can be used as long as carefully selected frequencies are determined for each imaging cell. The uniqueness requirement for each imaging cell is a complex part of the design of the 2D array. For a suitably configured array to work effectively the frequencies must be carefully determined, the best mode being to use a genetic algorithm. This is because in order to make each pixel point unique in the magnetic field it is actually a sum of the fields from all the other imaging cells. In other words all of the different contributions from, all of the other imaging element cells have to be superimposed in order to generate a unique result.

FIG. 32 schematically illustrates, in accordance with an aspect of the present invention concerning an example for 2D MR imaging, the main steps involved in acquiring magnetic resonance data in 2 dimensions for a given physical entity being imaged. Thus at step 3201 a 2D MAMBA array is configured for use in imaging a given physical entity to be imaged. In configuring of the array each imaging element pair is allocated a unique field strength and therefore a responsive MR frequency using, in the best mode contemplated by the inventors, a genetic algorithm. Following step 3201, at step 3202 the physical entity to be imaged is also placed between the array imaging element layers and the physical entity to be imaged is placed relative to the imaging element pairs as desired. In other words the physical entity to be imaged is placed such that an imaging element of each imaging element pair is located on each side of the physical entity being imaged and the portion of the physical entity being imaged is then positioned adjacent to the array. For example, if a human hand is to be imaged then the relevant portion of the hand for which an image is required is positioned adjacent to the imaging elements. Following step 3202 at step 3203 the main external $B_0$ magnetic field is switched on. Following step 3203, at step 3204 the 2D MAMBA array is switched on so as to establish auxiliary $B_0$ step fields for the selected area of the physical entity to be imaged. Following step 3204, the array element pairs are excited using a broadband radio frequency pulse. Alternatively excitation may be achieved using a chirped that is a frequency swept, RF pulse or a switched pulse. At step 3206 the resultant simultaneously generated resonance data for each element pair is collected. Following step 3206, at step 3207 the resultant resonance data for each element pair is simultaneously processed and collected into a plurality of pairs along the frequency direction. Thus by using stepped $B_0$ magnetic fields the image data from a particular element pair is off-set from another given element pair and since each location is already known to be associated with a given frequency then the particular frequency can be directly related to a location with respect to the physical entity. Following step 3207, at step 3208 the processed image data is displayed on a conventional monitor for viewing by the operator of the imaging apparatus.

A magnetic resonance imaging system configured for operation with at least one auxiliary magnetic field capable of producing at least one auxiliary uniform $B_0$ step magnetic field imaging region within the main $B_1$ field may be controlled by hard-wired electronics, such as for example using application specific integrated circuits (ASIC's). Alternatively one or more computer programs running on a CPU, and/or any associated specially configured processors, as appropriate, may control such an imaging system.

FIG. 33 schematically illustrates, in accordance with a further aspect of the present invention, a single layer array of imaging cells configured for use in imaging a physical entity placed alongside the array. Array 3301 comprises a plurality of imaging elements such as element 3302 in row 1 and element 3304 in row 3. The array illustrated comprises a 5 by 5 array of imaging elements, but for practical applications maybe configured to comprise many more elements. In contrast to the 2D dual layer imaging array schematically illustrated in FIGS. 17, 18 and 30, array 3301 is suitable for imaging physical entities placed close to its imaging surface. Thus, for example, the human leg may not be able to be imaged using a device of the type illustrated in FIG. 17 since the distance between the imaging element layers would be too great for legs of typical adult humans. Imaging array 3301 is configured for use in a main $B_0$ field of a magnetic resonance imaging machine such that the array may be placed next to, for example, a person's head or leg and the outer portions of the head/leg imaged accordingly. A limited depth of imaging maybe achieved using device 3301, the particular depth at which image quality remains acceptable being dependant upon, amongst other things, the field strength and the degree of field uniformity generated by the imaging elements of the array. As was the case for the device shown in FIG. 30, the imaging elements may comprise stacked layers of corrective imaging units so as to increase field uniformity. Device 3301 thus enhances the practical applications of using auxiliary $B_0$ magnetic stepped fields by enabling planar imaging from a particular side of a physical entity and may find wide application in medical imaging and industrial imaging situations. Thus by using stepped $B_0$ magnetic fields the image data from a particular imaging element in such a single plane imaging device is off-set from another given imaging cell and since each location is already known to be associated with a given frequency then the particular frequency can be directly related to a location with respect to the physical entity.

FIG. 34 schematically illustrates the main steps involved in acquiring 2D MR image data using the single layer imaging cell array of FIG. 33. At step 3401 the 2D MAMBA array is configured for operation by allocating unique frequencies to the single layer of imaging elements. Following configuration of the array at step 3401, at step 3402 the physical entity to be imaged is placed alongside the imaging element array layer and the physical entity is positioned relative to the imaging elements as desired so as to select the particular locations on the physical entity to image. Following step 3402 the main external $B_1$ magnetic field is switched on at step 3403. At step 3404 the 2D MAMBA array comprising a single layer of imaging elements is energized to establish auxiliary $B_1$ step fields for the selected locations of the physical entity to be imaged. Following step 3404, at step 3405 the array imaging elements are excited and at step 3406 the resultant resonance data is simultaneously collected for all the excited array elements. At step 3407 the collected resonance data is simultaneously processed into a plurality of parts along the frequency direction, such as for example using Fourier transform techniques. Finally, at step 3408 the resultant image data that has been collected and processed is displayed on a suitable electronic or other display device.

In addition to the embodiments described above, the auxiliary magnetic field or fields created by use of the present invention maybe established using a specially configured magnet. In other words coil inserts of the type detailed in FIG. 16 may be dispensed with in some applications. A suitably configured magnet must be capable of producing a $B_0$ magnetic field of the required strength for effecting magnetic resonance imaging for the given application under consideration. As those skilled in the art will understand, such a magnet may readily be configured through an appropriate winding configuration within the main magnetic structure. This is particularly straightforward to understand for a super conducting type coil magnet. With coiling specially configured, different auxiliary fields maybe made an integral part of the main magnetic field producing structure. A magnet configured to generate auxiliary fields in accordance with the present invention maybe cooled using a super coolant and may comprise a copper matrix with a high temperature super conducting wire running through it, the coolant, for example, being liquid helium.

This new type of imaging methodology forms a class of MR sequences, which are suitably described as frequency space or 'f-space' techniques.

(3) Interleaved Pulsed MAMBA Magnetic Resonance Imaging

The above described methods and apparatus may be further improved by a further aspect of the present invention wherein interleaved sets of pulsed $B_0$ field coils are configured to generate discrete regions of uniform auxiliary magnetic field within the main magnetic field. In particular for both the one dimensional and multi-dimensional embodiments described it will be readily apparent to those skilled in the art that there are restrictions in spatial coverage of a given physical entity being imaged due to the coil geometries required to solve the non-unique frequency problem. Thus for example referring to FIG. 14 it can readily be observed that in between the auxiliary coils there are regions where imaging is not possible. This problem also arises in the case of the two dimensional array of FIG. 17 in that imaging of a given physical entity is restricted to the coil locations and thus imaging in the regions in between the coils is effectively not allowed. By using a second layer of auxiliary fields spatially offset from the first layer it is found that improved imaging coverage of a physical entity is attainable.

By interleaved it is meant spatially offsetting a first set of auxiliary imaging cells from a second set of imaging cells. Interleaving may be achieved, for example, by:

1. employing one or more additional sets of imaging elements and undertaking a first imaging pass with the first set followed by a second pass for the second set, and so on for additional sets; or
2. in the case of coil type imaging cells, within the same winding exciting at a first set of currents to enable the winding to act as a first imaging cell set and exciting at a different set of currents to enable the winding to act as a second imaging cell set, and so on for creating additional sets.

The number of sets of imaging elements can be chosen according to the specific application and image quality required. However two or three sets are found to provide significant improvement in the total spatial coverage actually imaged. Interleaving thus enables a fuller overall image of a physical entity being imaged to be obtained.

Using interleaved fields has been found by the inventors of the present invention to enable full coverage along the coil axis for simultaneous parallel slice acquisition one-dimensional imaging. The method of interleaving can be generalised for 2D and 3D MAMBA coil sets to provide full spatial coverage (although with relatively low spatial resolution dependent on coil design) combined with very high temporal resolution limited only by acquisition speed and desired spectral resolution. In the case of multi-dimensional imaging the sets may suitably be arranged in layers.

Simulations of a number of coil designs have been performed using the Biot-Savart law. A six-step coil was built and interfaced to a 0.17 T Niche MRI system and the field steps measured using an imaging technique. Measured field steps were in good agreement with the values predicted by simulation. The coil design was then scaled up by a factor of three, interfaced to a 1.5T whole body MRI system and scans of the hands and arms of volunteers were acquired from up to four field steps using standard spin and gradient echo sequences. Images were also acquired simultaneously from two field steps with no frequency encode aliasing and one excitation. The one dimensional interleaved pulsed MAMBA field step enables many slices to be acquired simultaneously along the axis of the coil for rapid volumetric studies without the need for multiple shot Hadamard encoding. Extension of interleaved coil design to two or three dimensions is feasible which could provide full spatial coverage combined with ultra-rapid data acquisition.

A number of interleaved step coil designs have been simulated using the Biot-Savart law and Matlab 6.1 (Mathworks Inc., Cambridge, Mass.), with the following equation for the field value as a function of position z along the axis of the coil.

$$B_z(\rho=0)=\Sigma_i \mu_0 I_i a^2/2 \; (a^2+(z-s_i)^2)^{3/2}$$

The field $B_z$ at the axial position z was calculated at radial location $\rho=0$, from the sum of the fields from loops located at axial positions $s_i$ with equal spacing similar to the coil radius a. The current in the $i^{th}$ coil was $I_i$, and $\mu_0$ the magnetic permeability of air. The current was chosen to flow in the same direction in all coils and was adjusted for each loop to minimise the field variation at the centre of each of the step regions using an iterative technique. The spacing of the coils was also used as a variable in the optimisation to achieve flat field steps. A field variation of less than 5% along the axis of the field step was achieved for the central steps. The required current density was approximated practically by varying the number of turns at each loop position and using a constant current through all loops.

The prototype MAMBA coil, shown schematically in FIG. 35, was constructed according to the table shown in FIG. 36 and was formed on a 150×35 mm plastic tubular former. The coil was placed along the $B_0$ axis (horizontal across the magnet) of a dedicated 0.17 Tesla Niche MR system (InnerVision MRI Ltd., London, England), which may be used for neonatal, or extremity scanning. The system was located in a small RF screened enclosure. The magnet had a uniform field (<5 ppm FWHM before application of the MAMBA field) over 160 mm and could produce a maximum gradient strength of 15 m T/m. A low voltage battery delivered current, which was varied between 100 mA and 200 mA using a potentiometer and ammeter in series with the coil. A phantom consisting of a 140 mm long, 5 mm diameter tube of water was located centrally $\rho=0$) along the axis of the coil and imaged using a spin echo acquisition (TR/TE=715–975/20 ms, 128×256 matrix, 10 mm slice thickness, 160 mm FOV, 10 KHz sampling rate, NEX=1). The spatial offsets measured in the image frequency encode direction could be used to calibrate the field produced by each coil using the known frequency encoding bandwidth (10 KHz). The stepped fields also shifted the measured slice locations but this was compensated for by summing images over all slices to produce a composite image. Slice selection was achieved using standard 2D single frequency band excitation pulses in interleaved multi-slice mode with regularly spaced frequency offsets to assess the field steps produced by the MAMBA coils.

Following the initial experiments at 0.17 Tesla, the coil design was directly scaled up by a factor of three from the design presented in Table 1 and wound on a 105 mm diameter×550 mm plastic tube to accommodate a human arm. The coil was placed along the magnet axis and inside the head coil of a 1.5 Tesla whole body MR system (Eclipse, Philips Medical Systems, Cleveland, Ohio). Current between 0.5–2A was supplied using a regulated laboratory power supply. The coil resistance was measured at 0.5 Ohms. The MAMBA coil supply leads were looped around ferrite filters to help protect the power supply from RF and gradient induced transients. Multiple slice axial T1 weighted images of the arm of a human volunteer were acquired with a standard interleaved spin echo sequence (TR/TE=600/10 ms, Matrix=192×256,23 slices, SLT=5 mm, Gap=10 mm, FOV=450 mm, 32 KHz sampling, NEX=2) to investigate the axial extent of the field steps which could be used for imaging and the shifts produced in the frequency direction to remove aliasing. Images were also acquired with a gradient echo sequence with and without fat saturation (TRITE=300/8 ms, matrix=128×256, 23 slices, SLT=3 mm, Gap=10 mm, FOV=450 mm, 31.2 KHz sampling, NEX=1) to assess the effects of inhomogeneity within the field steps. A spin echo sequence (TR/TE=608/16 ms, Matrix=192×256, SLT=5 mm, FOV=300 mm, 15.6 KHz sampling, NEX=1) with a +/−8 KHz cosine modulated Gaussian weighted Sinc RF pulse was used to excite two simultaneous slices in different field steps. All images had frequency encoding in the vertical direction.

FIG. 37 graphically illustrates the calculated axial fields from optimised designs of the interleaved 6 step field coils and shows discrete offset regions of uniform field along the axis of the coil (mm). The second set of coils with different currents, spatially offset along the z-axis produces a field distribution, which fills in the gaps of uniform coverage produced by the first set. Alternatively, two identical sets of coils could be used offset along the axis. FIG. 38 graphically illustrates the calculated field as the ratio of spacing of the loops to radius is set to 0.5 (smooth trace) and 2.0 (peaked trace) with the current ratios given in FIG. 36.

Figure 39A:
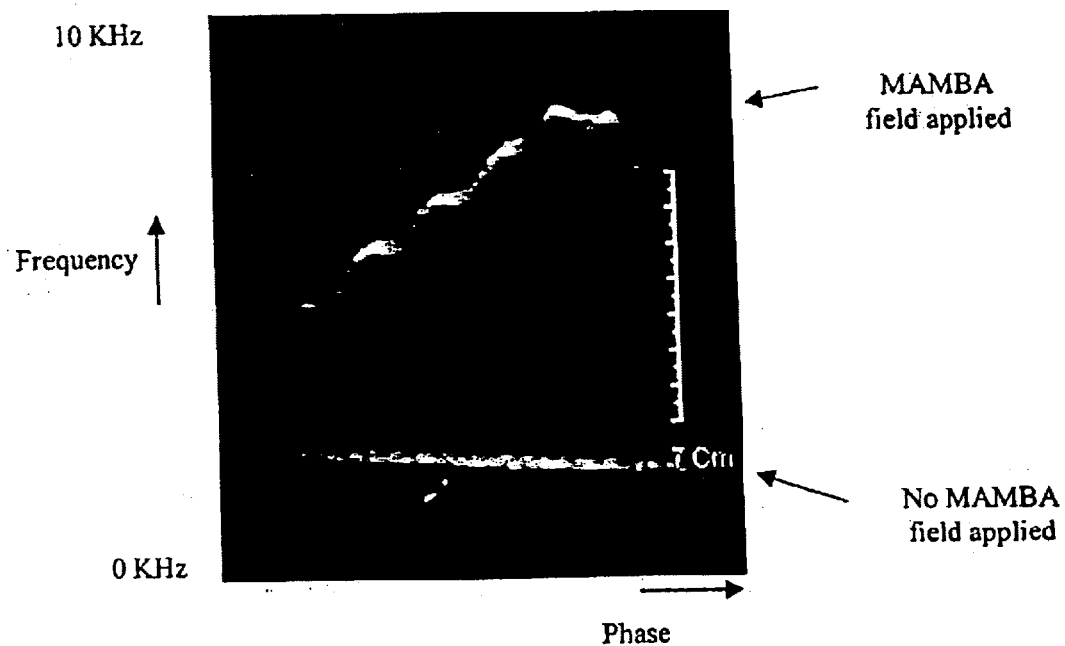
Figure 39B:
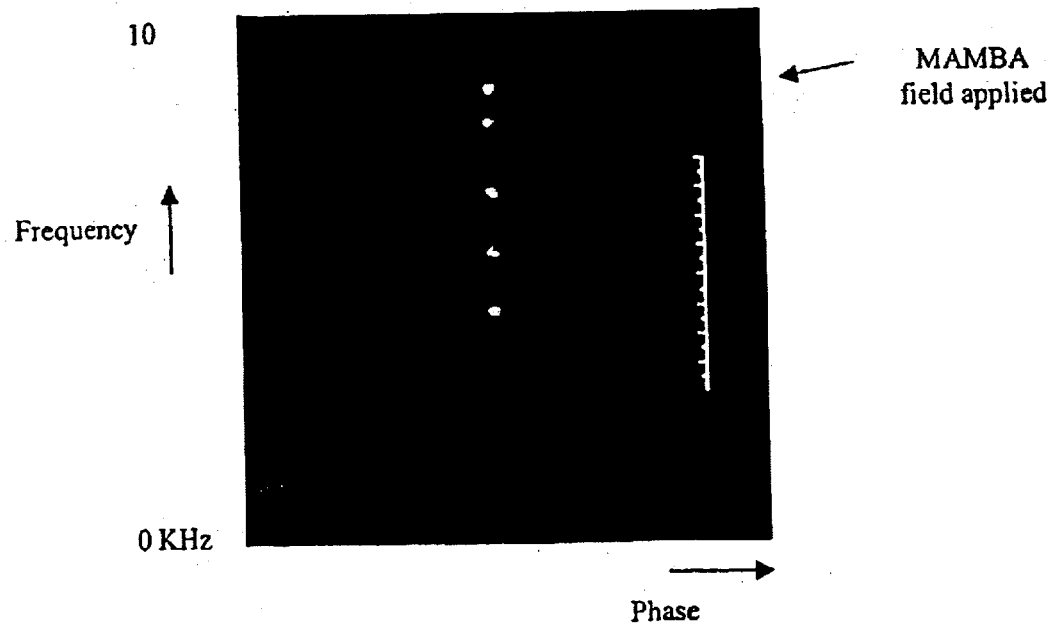

FIG. 39*a* shows a set of multi-slice axial images of the line phantom imaged without (bottom) and with (top) the 6 step auxiliary $B_0$ field applied (200 mA current). The individual multi-slice images have been summed together to show the entire field in a single composite image. The auxiliary fields offset the image of the straight-line phantom in the frequency direction (vertical) resulting in a 'snake-like' image representing the field steps. FIG. 39*b* is a summed set of multi-slice, 5 mm sagittal scans through the regions of uniform field showing the circular cross-section of the phantom acquired in five of the six field locations each of which can be thought of as a separate imaging region with its own bandwidth.

Figure 40A:
Figure 40B:
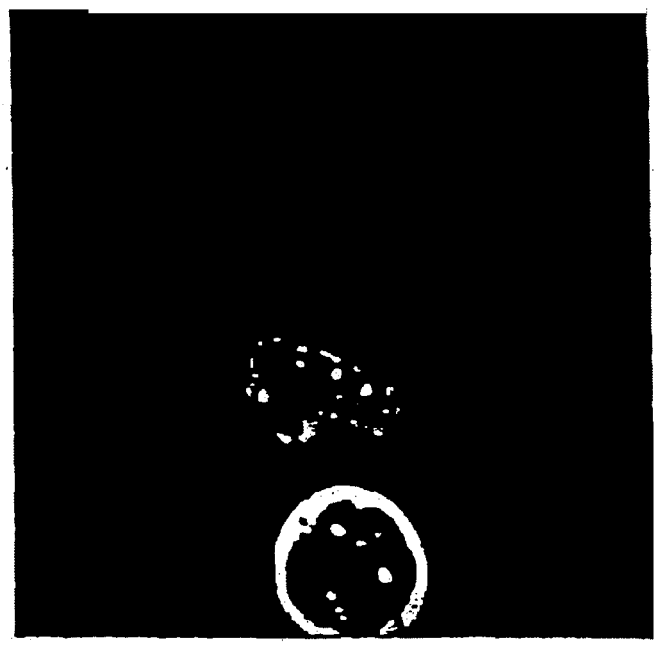

FIG. 40*a* shows images acquired at 1.5T from field steps 3 and 5 through the hand and forearm of a volunteer using a multi-slice spin echo sequence with simultaneous dual frequency excitation with no applied MAMBA field showing the expected frequency encode aliasing. Applying the MAMBA field with a current of 600 mA (FIG. 40*b*) resolves the aliasing problem.

In FIG. 41, spin echo images acquired at 1.5T from three 5 mm slices moving distally (a–c) gapped by 5 mm and located in the flat regions of three adjacent field steps (3, 4 and 5) of the MAMBA array with an applied current of 1A are shown. Each image (a–c) is the sum of the three images acquired from MAMBA coil steps 3, 4 and 5.

FIG. 42 illustrates four image slices obtained from an interleaved spin echo sequence acquired at 1.5T from steps 2, 3, 4 and 5 of the MAMBA coil with a current of 1A. The images from the different steps have been summed to show the offsets in the frequency direction.

FIG. 43 shows gradient echo images acquired from the forearm of a volunteer in step 3 of the MAMBA coil with a current of 0.5 A at 1.5T, without (a) and with (b) fat-saturation applied (different slice/study.

With auxiliary field coils it is possible to acquire data simultaneously from multiple locations within the magnet without the multi-shot encoding requirement of Hadamard techniques. The prototype one-dimensional MAMBA interleaved design described is capable of, in principle, producing twelve simultaneous slices in two rapidly interleaved shots. The experimentally measured field pattern for the six step coil at 0.17T agreed closely with theoretical predictions producing flat stepped regions of field connected by steeper regions of gradient. Images from the first and last regions were affected by end effects and no attempt to correct these was made in the current design resulting in only five of the six field regions being adequately imaged at 0.17T. In addition RF non-uniformity at the edge of the RF coil caused difficulties in visualising all six regions simultaneously.

Images on phantoms and volunteers at 1.5T using the scaled up version of the coil gave good results over extended regions within the field steps. To achieve excitation of two simultaneous slices it was necessary to use dual frequency band excitation pulses.

The additional field steps introduce a bias on the linear slice selection gradient which means the slice positions are not at the nominal resonance frequency calculated from the gradient field and position (FIG. 44). This explains the difference in slice positions selected in FIGS. 40a and 40b in the presence of the MAMBA field. However, the frequency values do increase monotonically until the end of the coil. It is important that material does not extend beyond the high field end of the step coil otherwise slice aliasing will occur.

Calculation of slice position and the subsequent offset frequency needs to take into account the strength of the MAMBA field at a particular location. This places high stability requirements on the power supply and could also cause some difficulty in designing and calibrating appropriate graphical planning software. It is important that the polarity of the field matches the gradient field otherwise the MAMBA and gradient fields will oppose each other as in FIG. 45 resulting in a non-monotonic net field and resulting in aliased slices.

Slice select rephasing will be modified by any residual inhomogeneity in the field steps, but the standard value appropriate for a linear field was used for all the images, acquired in this study. Some shading artefacts were seen in gradient echo images and the region of field step which could be used was reduced compared to spin echoes as could be expected due to the higher sensitivity of these sequences to field inhomogeneity which will also affect the in plane encoding process.

Figure 43B:

As will be understood by those skilled in the art conventional pre-pulse methodology can potentially be used to introduce appropriate contrast for MAMBA techniques. Fat saturation has been demonstrated on a gradient echo sequence as shown in FIG. 43b, although higher order shimmed step coil designs maybe utilised to produce optimum results. Echo planar imaging with MAMBA would also require very accurate shimming of the field steps. Fast Spin Echo (FSE) and Single Shot Fast Spin Echo (SSFSE) sequences would be expected to work well with parallel slice MAMBA due to their low sensitivity to field inhomogeneity although they would be sensitive to fields from any eddy currents induced in the coil structures by the imaging gradients. The auxiliary fields can be switched off at anytime allowing the method to be applied to specific sequences only As will be realised by those skilled in the art use of appropriate RF pulses for generating parallel slices may provide an opportunity for reducing SAR at high $B_0$ field strengths, especially with fast spin echo methods.

Larger auxiliary coils with a higher order field step design, perhaps wound on the main $B_0$ coil assembly or pole faces, increase coverage, reduce the spacing of steps and improve step field uniformity. In the prototype design described a field step axial spatial increment similar to the coil radius was needed. Optimisation of the radial uniformity of the one dimensional MAMBA coils will also be required to increase the available imaging volume. Only about 50% of the coil diameter can theoretically be imaged without significant field distortion, although the images acquired at 1.5 T clearly demonstrate the complex anatomy of the hand and forearm without much apparent distortion despite the forearm completely filling the coil.

Much larger field steps and more rapid data sampling can be used than in the system described in detail above. The requirement for an increased overall acquisition bandwidth to cover multiple slices, each with their own frequency bandwidth, means that the signal to noise will be degraded by the square root of the number of simultaneous slices acquired. In this study the FOV was adjusted to ensure all slices were included with the MAMBA field switched on and so the slices were acquired at lower resolution without a SNR penalty. Digital processing with multi-frequency notch filters may be required for optimum performance.

Interleaving the coils by a factor of two or more can be used to solve the problem of the regions of non-uniform field and potentially allow full volume coverage if used in conjunction with rapidly interleaved multiple band RF excitation pulses with appropriate frequency offsets. Interleaving introduces the requirement to switch the fields between the two sets of coils with the consequent disadvantage of producing switching transients although this could be done more slowly than with gradient based techniques to minimise transients.

FIG. 46 schematically illustrates the basic steps involved in imaging using interleaved auxiliary magnetic field imaging cells as configured in accordance with 1D imaging or multi-dimensional imaging according to present the invention. At step 4601 a given physical entity to be imaged is placed in the required position next to the imaging device. Following step 4601, the physical entity is imaged using a first layer of imaging cells configured as part of the interleaved imaging structure. Following step 4602, at step 4603 the physical entity is imaged using a second layer of interleaved imaging cells. Further interleaved sets of imaging cells may be provided and in FIG. 46 a third such set is provided for imaging at step 4604. In the example shown, imaging at step 4604 corresponds to imaging by the final interleaved set of imaging cells. Thus following step 4604 the interleaved images obtained are processed at step 4605 by an appropriately configured computer-processing device. Following step 4605 the resultant image obtained, from the three interleaved imaging steps in the example shown, is displayed at step 4606 on a suitably configured display device.

FIG. 47 schematically illustrates two interleaved sets of imaging coils as configured, in accordance with the present invention for use in 1D imaging. The coil arrangement 4701 comprises a first set of coils 4702, 4703, 4704 and 4705 and a second set of coils 4706, 4707 and 4708. The coils are interleaved in that a coil from the first set is placed in between coils from the second set and vice versa, other than the end points. Coils from the first set are denoted $B_{01}$ and are successively numbered 1 to 4 in the example shown. Coils from the second set are denoted $B_{02}$ and are numbered 1 to 3 respectively. As can be seen coils from the first set are placed in a spatially different position to those of the second set. However those skilled in the art will realise that depending upon the particular coil configurations and field strengths required then the exact configuration as regards interleaving of imaging cells may be varied considerably.

FIG. 48 schematically illustrates an example of the form of interleaved stepped auxiliary $B_0$ fields as possibly generated by a coil arrangement of the type shown in FIG. 47. Each field generated is denoted by the same numbering system as described for FIG. 47. As can be seen from FIG. 48 flat or uniform auxiliary $B_0$ fields are produced by each coil. The fields for the first set of interleaved coils, 4702 to 4705 are generally indicated at 4801 and those for the second set at 4802. From FIG. 48 it can be seen that the fields for the first set are separated from those of the second set.

FIG. 49 schematically illustrates, in cross section, an array of a first set and a second set of interleaved imaging cells as configured for use in a single planar two dimensional single plane imaging device suitable for placing next to a physical entity to be imaged. Array 4901 comprises a first set of imaging elements generally indicated at 4902 and a second set of imaging elements generally indicated at 4903. The imaging elements are held in place in the array body 4904. Imaging layer 4902 comprises imaging elements such as those depicted at 4904, 4906, 4907, 4908 and 4909. Similarly the interleaved layer 4903 comprises imaging elements 4910, 4911, 4912 and 4913 respectively. A given imaging element of rear layer 4903 is spatially offset from two neighboring adjacent elements in layer 4902. Thus for example, imaging element 4910 is located approximately mid-way between imaging elements 4905 and 4906. The $B_0$ auxiliary fields generated are indicated using the same notation as used for those depicted in the 1D-imaging example of FIGS. 47 and 48.

Interleaved imaging elements may be configured in a variety of ways as will we understood by those skilled in the art. Thus for example in respect of a 1D imaging apparatus the following techniques could be employed:

Use of coil inserts for each layer of coils interleaved, each coil having corrective coils;

A magnetic resonance imaging magnet itself could be configured to integrally generate the required sets of interleaved auxiliary $B_0$ fields.

In respect of 2D or higher imaging, the imaging elements may be offset spatially in configurations that have to be carefully determined to optimize performance. Thus although midway positions have been shown in FIG. 49 it may be that non mid-way positioning could provide optimal results, particularly if more than 2 layers of interleaved imaging cells are used and/or if complex corrective coils are included.

To summarise the following are preferred embodiments and preferences of the subject matter described earlier:

1. A magnetic resonance imaging (MRI) apparatus configurable to image a physical entity placed in a position for imaging, said apparatus comprising:

a main magnetic flux source for providing a uniform fixed RF magnetic field, $B_0$;

an RF system for generating a rotating RF excitation magnetic field $B_1$; and a control processor for controlling imaging functionality, collecting image data and effecting data processing of said of captured image data; and a display means for displaying processed image data as resultant images;

said apparatus additionally comprising:

an auxiliary magnetic field means capable of producing at least one auxiliary uniform $B_0$ step magnetic field imaging region within said main $B_0$ magnetic field.

Preferably said auxiliary magnetic field means is configured to produce one auxiliary $B_0$ step magnetic field imaging region and another imaging region is provided in said main uniform magnetic field, $B_0$, the auxiliary uniform $B_0$ step field being separated from the main $B_0$ field by an amount greater than the imaging frequency encode bandwidth.

Preferably said auxiliary magnetic field means is configured to produce a plurality of auxiliary uniform $B_0$ step magnetic field imaging regions within said main $B_0$ magnetic field, each said auxiliary field providing a different magnetic resonance frequency to a neighboring auxiliary magnetic field.

Preferably said auxiliary magnetic field means is configured to produce a plurality of auxiliary uniform $B_0$ step magnetic field imaging regions within said main $B_0$ magnetic field, each said auxiliary field being separated in magnetic resonance frequency from a neighboring auxiliary field by an amount greater than the imaging frequency encode bandwidth.

Preferably said at least one auxiliary magnetic step field is produced by at least one current carrying coil inserted in said main $B_0$ field.

Preferably a plurality of auxiliary magnetic fields are produced by a magnetic field generation means from the set comprising:

a single current carrying coil comprising magnetic field generating coil elements axially aligned along the same longitudinal ($B_0$) axis; and a plurality of current carrying coils axially aligned along the $B_0$ direction.

Preferably said apparatus additionally comprises a magnetic field gradient system; and RF coils for generation of multi-frequency selective RF pulses used to select desired locations in uniform $B_0$ magnetic field regions in conjunction with a slice gradient.

Preferably said image data received by said processor is processed to form an image that can be split into a number of parts in the frequency direction, said number of parts corresponding to the number of stepped uniform magnetic field regions in use.

Preferably said processing comprises splitting of data in the frequency direction using a Fourier transformation.

Preferably said auxiliary magnetic field means comprises a 2D array of magnetic field generation cells for use in 2D imaging, each said imaging cell being capable of generating a said stepped auxiliary magnetic field, said array being configurable for operation within said main $B_0$ field of said apparatus.

Preferably said auxiliary magnetic field means comprises a 2D single layer array of magnetic field generation cells, sad apparatus being configurable to image said physical entity from a selected side of said physical entity.

Preferably said auxiliary magnetic field means, comprises a 2D array of magnetic field generation cells, a said cell comprising elements arranged in a paired Helmholtz arrangement, said array comprising a first layer of said elements and a second layer of said elements, each said layer being for positioning on an opposite side of a said physical entity being imaged.

Preferably said auxiliary magnetic field means comprises a two dimensional array of magnetic field generation cells comprising a pair of imaging elements arranged in pairs, each said element pair being allocated a unique magnetic field strength associated with a unique magnetic resonance frequency.

Preferably said auxiliary magnetic field means comprises a 2D array of magnetic field generation cells having a unique magnetic field strength associated with a unique magnetic resonance frequency, the magnetic field strengths having been determined by a genetic algorithm.

Preferably said auxiliary magnetic field means comprising a 2D array of magnetic field generation cell, each said cell being capable of generating a step uniform auxiliary magnetic field associated with a unique resonant frequency, a said cell thereby being associated with a specific location of the in plane of said array and consisting a pixel of a said resultant image.

Preferably said auxiliary magnetic field means comprises a 2D array of magnetic field generation cells, each said cell being capable of generating a stepped auxiliary magnetic field associated with a unique magnetic resonance frequency, said apparatus thereby providing inherent frequency encoding according to the 2D spatial distribution of said magnetic field generation cells.

Preferably only non-switched magnetic fields are used to image said physical entity.

2. A magnetic resonance imaging (MRI) apparatus configurable to image a physical entity placed in a position for imaging, said apparatus comprising:

a main magnetic flux source for providing a uniform fixed RF magnetic field, $B_0$;

an RF system for generating a rotating RF excitation magnetic field $B_1$;

a control processor for controlling imaging functionality, collecting image data and for effecting data processing of said captured image data; and a display for displaying processed image data as resultant images;

said apparatus further comprising:

an auxiliary magnetic field means capable of producing at least one auxiliary uniform $B_0$ step magnetic field imaging region within said main $B_0$ magnetic field;

selecting means for selecting at least two locations of said physical entity to image simultaneously, at least one comprising a location in said at least one step field;

excitation means for simultaneously establishing the required excitations condition for the frequency associated with each said selected location; and simultaneous image data collection and processing means for simultaneously processing collected image data from said locations into a plurality of part along the frequency direction, said simultaneous processing means being configured to display said processed image data on said display.

3. In a magnetic resonance imaging (MRI) apparatus configurable to image a physical entity placed in a position for imaging, said apparatus comprising a main magnetic flux source for providing a uniform fixed RF magnetic field, $B_0$ and an RF system for generating a rotating RF excitation magnetic field $B_1$, there is provided a method of imaging comprising the steps of:

placing a said physical entity in said imaging position;

subjecting said physical entity to said uniform main $B_0$ magnetic field;

establishing at least one auxiliary uniform $B_0$ step magnetic field imaging region within said main $B_0$ field;

selecting at least two locations of said physical entity to image, at least one comprising a location in said at least one auxiliary step field;

for each selected location substantially simultaneously establishing the required excitation condition for the frequency associated with each said selected location;

substantially simultaneously collecting resonance image data for each selected location being imaged;

substantially simultaneously processing said collected image data into a plurality of parts along the frequency direction; and displaying said processed image data.

Preferably said second said location of said physical entity to image comprises a uniform magnetic field region provided by said main uniform magnetic field $B_0$.

Preferably said step of establishing at least one auxiliary uniform $B_0$ step magnetic field comprises establishing a plurality of auxiliary uniform $B_0$ step magnetic fields within said main $B_0$ magnetic field, each auxiliary field providing a different magnetic resonance frequency from a neighboring auxiliary step magnetic field.

Preferably a plurality of said auxiliary uniform $B_0$ step magnetic field imaging regions are produced within said main $B_0$ magnetic field, each said auxiliary field being separated in magnetic resonance frequency from a neighboring auxiliary field by an amount greater than the imaging bandwidth.

Preferably said step of establishing at least one auxiliary uniform $B_0$ step magnetic field comprises use of at least one current carrying coil inserted in said main $B_0$ field.

Preferably said step of establishing at least one auxiliary $B_0$ step magnetic field imaging region comprises establishing a plurality of said auxiliary uniform $B_0$ regions, said plurality of said regions being established from the set of magnetic field generation means comprised from the set:

a single current carrying coil comprising magnetic field generating coil elements axially aligned along the same longitudinal ($B_0$) axis; and a plurality of current carrying coils axially aligned along the $B_0$ direction.

Preferably said step of selecting said at least two locations of said physical entity to image comprises use of a magnetic field gradient system and RF coils for generation of multifrequency selective RF pulses used to select said desired locations in uniform $B_0$ magnetic field regions in conjunction with a slice gradient.

Preferably said step of substantially simultaneously processing said collected image data into a plurality of parts along the frequency direction produces a number of frequency separated parts, said number corresponding to the number of stepped auxiliary uniform magnetic field regions in use.

Preferably said step of simultaneously processing said collected image data into a plurality of parts along the frequency direction comprises use of a Fourier transformation.

Preferably said step of establishing at least one auxiliary uniform $B_0$ step magnetic field comprises establishing a plurality of auxiliary uniform $B_0$ step magnetic fields through use of a 2D array of magnetic field generation cells, said cells each comprising a pair of imaging elements arranged in a Helmholtz arrangement, said array comprising a first layer of said elements and a second layer of said elements, each said layer being configured for positioning on an opposite side of said physical entity being imaged.

Preferably said step of establishing at least one auxiliary $B_0$ step magnetic field comprises establishing a plurality of said uniform step magnetic fields through use of a 2D array of magnetic field generation cells, each magnetic field generation cell comprising a pair of imaging elements and each imaging element pair being allocated a unique magnetic field strength associated with a unique magnetic resonance frequency.

Preferably said step of establishing at least one auxiliary uniform $B_0$ step magnetic field comprises establishing a plurality of auxiliary uniform $B_0$ step magnetic fields, the method of establishing said plurality comprising usage of a 2D array of imaging cells, each imaging cell having a unique magnetic resonance frequency corresponding to a unique magnetic field strength said magnetic fields strength of each cell having been determined from using a genetic algorithm.

Preferably said step of selecting at least two locations, comprises selecting said locations for 2D magnetic resonance imaging, each said selected location thereby constituting a pixel of a said resultant image.

Preferably a 2D array of magnetic field generation cells establishes a plurality of auxiliary uniform $B_0$ step magnetic field imaging regions within said main $B_0$ field, said array thereby providing inherent frequency encoding according to the 2D spatial distribution of said magnetic field generation cells.

4. An imaging apparatus for use in nuclear magnetic resonance imaging of a physical entity, said apparatus comprising:

a main body configurable for placement in a main uniform external $B_0$ magnetic flux source, said main body comprising an auxiliary magnetic flux source means capable of producing at least one auxiliary $B_0$ step magnetic field imaging region within said main $B_0$ region upon said apparatus being placed in a said external magnetic flux $B_0$.

Preferably said main body comprises a coil arrangement capable of conducting an electric current.

Preferably said main body comprises a single current carrying coil having a plurality of coiled segments, each said segment being axially aligned with said other segments and each said segment being configured to generate a uniform stepped auxiliary magnetic field.

Preferably said apparatus is configured for use in 1D magnetic resonance imaging.

5. An imaging apparatus for use in 2D nuclear magnetic resonance imaging of a physical entity, said apparatus comprising:

a main body configurable for placement in a main uniform external $B_0$ magnetic flux source, said main body comprising at least one array of magnetic flux generating cells for providing a plurality of auxiliary stepped $B_0$ magnetic fields within said external $B_0$ field.

Preferably said at least one array of flux generating cells comprises a first layer of magnetic flux generating imaging elements and a second layer of said magnetic flux generating imaging elements.

Preferably said main body comprises a layer of said magnetic flux generating cells formed on a printed circuit board.

Preferably said pairs of magnetic flux generating elements each have a unique magnetic field strength corresponding to a unique magnetic resonance frequency.

Preferably said magnetic flux generating cells each have a unique magnetic field strength corresponding to a unique magnetic resonance frequency, said unique magnetic field strengths having been determined using a genetic algorithm.

Preferably said magnetic flux generating cells each have a unique magnetic field strength corresponding to a unique magnetic resonance frequency, a said unique magnetic resonance frequency being separated from another by at least the imaging frequency encode bandwidth.

6. In respect of a multi-dimensional array of magnetic field producing imaging cells for use in MR imaging, a method of determining unique magnetic field strengths for said cells, said method comprising the steps of:

configuring a genetic algorithm with a constant population of chromosomes;

allocating a number of genes to each chromosome, said number of genes relating to the number of said cells in said array; and enabling said genes to have values relating to the number of said cells in said array.

Preferably said number of genes corresponds to the number of said cells in said array.

Preferably said values of said genes have values up to plus or minus the number of said cells in said array.

Preferably said magnetic producing imaging cells comprise current carrying coils and said values of said genes have plus or minus values up to the number of said cells in said array, the sign representing the direction of current flow in said coils.

Preferably fitness is judged by the total route means square deviation from a linear fit of the resulting field strengths.

Preferably the probability of mutation is calculated according to a simulated-annealing scheme.

Preferably a selection strategy utilized in said genetic algorithm comprises the elitist method, with automatic selection for the best said chromosome.

Preferably said genetic algorithm comprises a mating strategy using single-point cross over by selected chromosomes at a constant probability Preferably said multi-dimensional array comprises a 2D array of imaging cells.

7. A computer program configurable for use in a method of magnetic resonance imaging of a physical entity wherein said imaging method comprises placing said physical entity in a uniform main $B_0$ external magnetic field and at least one stepped auxiliary field region within said main field, said computer program comprising:

selection means for selecting at least two locations of said physical entity to image, at least one comprising a location in said at least one auxiliary step field region;

excitation means for substantially simultaneously initiating magnetic resonance excitation for each said selected location;

data collection means for effecting collection of magnetic resonance image data for each said selected location; and image data processing means for substantially simultaneously processing said collected image data into a plurality of parts along the frequency direction.

Preferably said selection means is configured to select a plurality of locations in accordance with 1D nuclear magnetic resonance imaging.

Preferably said selection means is configured to select a plurality of locations for multi-dimensional nuclear magnetic resonance imaging.

Preferably said processing means is configured to process said collected data in accordance with a Fourier transformation.

Suitably said computer program additionally comprises processing means to effect display of said processed image data.

8. A magnet for use in nuclear magnetic resonance imaging of a physical entity, wherein said magnet is capable of producing a $B_0$ magnetic field of required strength and said magnet additionally comprises:

an integral auxiliary magnetic flux source means capable of producing at least one auxiliary $B_0$ step magnetic field imaging region within said main $B_0$ region.

Preferably said magnet comprises a super conducting magnet.

Interleaved imaging is also provided.

9. A magnetic resonance imaging (MRI) apparatus configurable to image a physical entity placed in a position for imaging, said apparatus comprising:
   a main magnetic flux source for providing a uniform fixed RF magnetic field, $B_0$;
   an RF system for generating a rotating RF excitation magnetic field $B_1$;
   a control processor for controlling imaging functionality, collecting image data and effecting data processing of said of captured image data; and
   a display means for displaying processed image data as resultant images;
   said apparatus being characterized in that it additionally comprises:
   an auxiliary magnetic field means capable of producing a plurality of uniform $B_0$ step magnetic field imaging regions within said main $B_0$ magnetic field, wherein said auxiliary uniform $B_0$ field regions comprise a plurality of interleaved groups of said regions.

Preferably said auxiliary magnetic field means comprises a first set of imaging elements configured to generate a first set of auxiliary $B_0$ field regions and at least a second set of imaging elements configured to generate a second set of auxiliary $B_0$ field regions, the sets of regions being spatially interleaved with each other.

10. A magnetic resonance imaging (MRI) apparatus configurable to image a physical entity placed in a position for imaging, said apparatus comprising:
   a main magnetic flux source for providing a uniform fixed RF magnetic field, $B_0$;
   an RF system for generating a rotating RF excitation magnetic field $B_1$;
   a control processor for controlling imaging functionality, collecting image data and for effecting data processing of said captured image data; and
   a display for displaying processed image data as resultant images;
   said apparatus being characterized in that it further comprises:
   an auxiliary magnetic field means capable of producing a plurality of auxiliary uniform $B_0$ step magnetic field imaging regions within said main $B_0$ magnetic field said auxiliary regions being arranged as a plurality of interleaved groups;
   selecting means for selecting a plurality of locations of said physical entity to image simultaneously, said selected locations corresponding to locations in said step fields;
   excitation means for simultaneously establishing the required excitation condition for the frequency associated with each said selected location; and
   simultaneous image data collection and processing means for simultaneously processing collected image data from said locations into a plurality of parts along the frequency direction, said simultaneous processing means being configured to display said processed image data on said display.

11. A magnetic resonance imaging (MRI) apparatus configurable to image a object placed in a position for imaging, said apparatus comprising a main magnetic flux source for providing a uniform fixed RF magnetic field, $B_0$ and an RF system for generating a rotating RF excitation magnetic field $B_1$, a method of imaging characterized by comprising the steps of:
   placing a said object in said imaging position;
   subjecting said object to said uniform main $B_0$ magnetic field;
   establishing a plurality of auxiliary uniform $B_0$ step magnetic field imaging region within said main $B_0$ field said auxiliary regions being arranged as a plurality of interleaved groups;
   selecting a plurality of locations of said object to image, said selected locations corresponding to locations in said step fields;
   for each selected location substantially simultaneously establishing the required excitation condition for the frequency associated with each said selected location;
   substantially simultaneously collecting resonance image data for each selected location being imaged;
   substantially simultaneously processing said collected image data into a plurality of parts along the frequency direction; and
   displaying said processed image data.

12. An imaging apparatus for use in nuclear magnetic resonance imaging of a physical entity, said apparatus comprising:
   a main body configurable for placement in a main uniform external $B_0$ magnetic flux source, said main body comprising an auxiliary magnetic flux source means comprising a first group of imaging cells capable of producing a first set of auxiliary $B_0$ step magnetic field imaging regions within said main $B_0$ region and at least a second group of imaging cells capable of producing a second set of auxiliary $B_0$ step magnetic field imaging regions within said main $B_0$ region, said cells of a said group being spatially interleaved with said cells of a said other group.

13. An imaging apparatus for use in nuclear magnetic resonance imaging of a physical entity, said apparatus comprising:
   a main body configurable for placement in a main uniform external $B_0$ magnetic flux source, said main body comprising a first array of imaging cells capable of producing a first set of auxiliary $B_0$ step magnetic field imaging regions within said main $B_0$ region and at least a second array of imaging cells capable of producing a second set of auxiliary $B_0$ step magnetic field imaging regions within said main $B_0$ region, said cells of a said array being spatially interleaved with said cells of a said other array.

14. In respect of a multidimensional array of magnetic field producing imaging cells for use in MR imaging, there is provided a method of determining unique magnetic field strengths for interleaved groups of said cells, said method comprising, for a selected group, the steps of:
   configuring a genetic algorithm with a constant population of chromosomes;
   allocating a number of genes to each chromosome, said number of genes relating to the number of said cells in a said group; and
   enabling said genes to have values relating to the number of said cells in said selected group of said array.

15. A computer program configurable for use in a method of magnetic resonance imaging of a physical entity wherein said imaging method comprises placing said physical entity in a uniform main $B_0$ external magnetic field and a plurality of stepped auxiliary field regions within said main field, said auxiliary regions produced by a plurality of interleaved groups of imaging cells, said computer program comprising:

first imaging location determination means for specifying locations of said physical entity to image corresponding to a first group of said cells;

second imaging location determination means for specifying locations of said physical entity to image corresponding to at least a second group of imaging cells, said second group being interleaved with said first group;

excitation means for substantially simultaneously initiating magnetic resonance excitation for each said selected location of a said group;

data collection means for effecting collection of magnetic resonance image data for each said selected group; and image data processing means for substantially simultaneously processing said collected image data into a plurality of parts along the frequency direction.

16. A magnet for use in nuclear magnetic resonance imaging of a physical entity, wherein said magnet is capable of producing a $B_0$ magnetic field of required strength and said magnet additionally comprises:

an integral auxiliary magnetic flux source means capable of producing a plurality of auxiliary $B_0$ step magnetic field imaging regions within said main $B_0$ region, said auxiliary magnetic flux source means being configured to operate as a plurality of groups of interleaved magnetic flux generating imaging cells.

(4) Three Dimensional Magnetic Resonance Imaging Using a One-Dimensional Auxiliary MAMBA Field Producing MRI Apparatus Coupled with 2D MAMBA Coil Arrays The one dimensional imaging method described in relation to FIGS. 1 to 16 concerns creation of auxiliary $B_0$ magnetic fields as is shown, in particular, in FIG. 14. In accordance with the present invention this method can be extended by incorporation of two-dimensional arrays of imaging coils of the type shown schematically in FIG. 17. In relation to a particular auxiliary field step there may be configured a two-dimensional coil array located within or otherwise associated with the step. In this way each auxiliary step is thereby divided up in to a number of regions (sub auxiliary field steps) each associated with a unique frequency. Such a system effectively combines the one-dimensional imaging technique with the two-dimensional imaging technique to create a three-dimensional imaging technique. The total three-dimensional volume to be imaged is thus divided into a plurality of unique auxiliary field step regions in the axial (z) direction. In view of the presence of a 2D array of imaging elements for a given auxiliary field each such region is further divided into a number of points in the x-y plane, each point being associated with a unique resonance frequency. This is because each imaging element of a 2D array is associated with a unique frequency that is added to or subtracted from the main auxiliary step frequency to give a unique absolute frequency for the associated imaging element. Using the genetic algorithm method described earlier (or another suitable method) it can be ensured that the absolute frequencies for each 2D array are different to the absolute frequencies of the other 2D arrays and therefore unique frequencies are obtained for each imaging element throughout the three-dimensional volume being imaged.

FIG. 50 schematically illustrates the concept of three dimensional imaging using 1D imaging coils to create the main stepped auxiliary $B_0$ field regions where in each 1D coil is coupled with a 2D array of imaging coils. For a given 2D array the associated main auxiliary field step ensures that the frequencies associated the two dimensional coil array are unique for that array because it adds an extra frequency on to the frequencies that are generated by the two-dimensional array. The extra frequency added on by the main auxiliary step is unique to that step. For another (next) main auxiliary field step the auxiliary field frequency is different and therefore the frequencies generated by the two-dimensional array in this next step are different to that of any other step. In the example shown the auxiliary field steps are shown as successively increasing in the z direction. Other arrangements for the auxiliary steps could be used as it is not necessary to position them in ascending resonance frequency along the z axis. The auxiliary steps could be arranged in any order along the z-axis.

At 5001 an auxiliary field step producing coil system is generally depicted and the direction of the main magnetic field $B_0$ is shown, the $B_0$ field direction conventionally being assigned to the z-axis. The figure generally depicts a graph of resonance frequency of the magnetic resonance signal verses the distance z along the field direction. At 5002 there is shown a first main auxiliary field step $B_{01}$ followed by successively adjacent $B_0$ auxiliary steps at 5003 ($B_{02}$), 5004 ($B_{03}$) and 5005 ($B_{04}$). In this example each auxiliary field, with increasing z, corresponds to a higher resonance frequency MR signal. By placing a two-dimensional coil array within each main auxiliary step unique resonance frequencies are allocated to each position in space occupied by an imaging element of the arrays. Thus for example, array 5006 in the Figure is shown as placed for use within the third main auxiliary magnetic field $B_{03}$ and sub-auxiliary magnetic fields are produced within the $B_{03}$ field as indicated respectively at 5007, 5008, 5009 and 5010. The figure is slightly misleading in that strictly only the main auxiliary field steps are off-set in the z direction whereas the distribution of the sub-auxiliary fields from the 2D array is within the x-y imaging plane. In other words the sub-auxiliary $B_0$ steps of a particular 2D array are all located at the same z location within the 1D array along the z-axis and the width of a given sub-auxiliary step is analogous to the conventional slice thickness.

FIG. 51 schematically illustrates a physical embodiment of an array of 1D imaging coils for producing main auxiliary B fields wherein each auxiliary coil is coupled with a 2D imaging array of sub-auxiliary field step producing coils.

A main auxiliary field producing coil system 5101 comprises a plurality of main coils 5102, 5103 and 5104 that are placed along the axis of the main ($B_0$) field direction 5105. Within each coil there is placed a two dimensional coil array as follows: array 5106 associated with 1D imaging coil 5102, array 5107 associated with coil 5103 and array 5108 associated with coil 5104. As shown in the figure a main plane through a given coil array is, in the best mode contemplated by the inventors, positioned orthogonal to the main field direction $B_0$.

FIG. 52 schematically illustrates the main steps involved in acquiring MR images using a three dimensional imaging system of the type illustrated schematically in FIGS. 50 and 51. At step 5201 an array of one-dimensional imaging coils is configured for creation of a required configuration of main auxiliary field steps. Following step 5201, at step 5202 a series of two dimensional coil arrays are configured such that there is provided a two dimensional coil array inside each of the one dimensional imaging coils, the two dimensional arrays being orientated orthogonal to the main $B_0$ magnetic field direction. Following step 5202, at step 5203 an electrical current is switched on in respect of both the one-dimensional and two-dimensional imaging arrays. Following step 5203, at step 5204 all the elements of the two dimensional arrays are excited so as to produce the required magnetic resonance signals. Unlike in the 1D MAMBA system described earlier slice selection is not required since a broadband RF pulse is used to simultaneously excite across all the required frequencies. Following step 5204, at step 5205 the magnetic resonance data for all the excited elements is collected, preferably substantially simultaneously, and the data is then processed at step 5206 by using a one dimensional Fourier Transform. Following step 5206, at step 5207 the data processed at step 5206 is rearranged into multiple 2D images. Following step 5207, at step 5208 the resultant images are displayed on an appropriately configured image viewer such as a standard visual display unit Applications of the three dimensional imaging technique described are numerous and include, for example, imaging fluid flow in industrial type flow apparatus having dimensions sufficient to enable incorporation of the required apparatus. Future applications maybe envisaged to include measuring blood flow in the human or animal body upon miniaturization of the coils. An example of a miniaturized system would be one configured to fit inside a human artery via incorporation of the coil system in the end of a catheter or some other form of invasive medical device.

It is to be understood by those skilled in the art that the three dimensional imaging technique described may incorporate the interleaving technique described earlier and in certain circumstances may be used in combination with the $B_1$AC-MAMBA technique described below.

(5) $B_1$AC-MAMBA: $B_1$ Array Combined with Multiple Acquisition Micro $B_0$ Array Parallel Magnetic Resonance Imaging Those skilled in the art will be aware that state of the art MRI scanners are in use which use a plurality of RF receive coils. Recently MRI systems comprising a plurality of RF receive coils have been used to accelerate image acquisition time through use of an in-plane $B_1$ sensitivity encoding technique, such as SENSE or SMASH. The SENSE/SMASH methods utilise specially configured post-processing software to process the acquired data and thereby reduce the actual time required to acquire the image data of a given physical entity being imaged. A further preferred embodiment of the present invention concerns production of an additional order of acceleration for image acquisition as compared with the known SENSE or SMASH types of parallel imaging methodologies. In accordance with the present invention this is achieved through the combination of an in-plane $B_1$ sensitivity encoding technique, such as SENSE or SMASH, for example, with the simultaneous multiple slice $B_0$ field step multiplexing technique (MAMBA) described in relation to FIGS. 4–16 and 35–48. However unlike the 1D MAMBA system it is a requirement in this case that the MRI scanner is equipped with multiple channel radio frequency array coils and receivers. The combined radio frequency ($B_1$) and stepped $B_0$ technique is readily used in conjunction with the interleaving techniques described above in relation to FIGS. 35–48. Those skilled in the art will appreciate that special techniques may be required to calculate appropriate sensitivity maps in order to ensure correct working of such a combined system and it will also be apparent that scan times can be further reduced by appropriate combination with $B_1$ sensitivity encoding techniques, including frequency dependent sensitivity correction methods and hardware techniques to reduce interactions between $B_0$ and $B_1$ coils.

A detailed study of this technique has revealed production of high scan time reduction factors (R<=8). In this study, two slices were acquired simultaneously in combination with x2 and x4 SENSE in-plane encoding using a MAMBA stepped $B_0$ field coil inside a multiple (four) channel phased array coil system. Experiments were performed on a 1.5 T Infinion system (Philips Medical Systems, Cleveland, Ohio, USA). Signal to noise ratio was reduced with higher R factors as expected from the reduced number of acquisitions used to create the unaliased images. Combined SENSE (or another similar technique) and MAMBA provides significantly reduced scan times through parallel acquisition whilst at the same time reducing the number of RF channels required by a factor equal to the number of field steps employed. The $B_1$ array combined with multiple acquisition micro $B_0$ array ($B_1$AC-MAMBA) technique is applicable in situations when the length of a physical entity is much greater than its diameter as in scanning limbs or in whole body screening of disease.

As will be understood by those skilled in the art, and as stated previously, a continual quest in MR research is to reduce the time required to measure a complete volume data set to allow, for example, improved dynamic imaging of brain or body function, contrast agent uptake measurements, scanning of uncooperative or unknowing patients such as neonates or whole body screening for disease. As already described in detail, arrays of auxiliary $B_0$ coils which generate discrete stepped regions of uniform field locally within the main magnetic field (MAMBA) can be used to:

(a) encode in plane; or (b) to generate multiple simultaneous slices.

The in-plane MAMBA 2D technique described earlier does not require any switched gradient encoding and is limited to planar physical entities such as thin films or potentially to surfaces of thin structures such as the human cortex The parallel slice MAMBA technique uses field step coils with conventional imaging sequences modified to excite several slices simultaneously. Aliasing is avoided by shifting parallel slices in the frequency encode direction by more than the frequency encode bandwidth using the $B_0$ field steps and by frequency over sampling by a factor equal to the number of parallel slices to be acquired.

The aim of the present study was to investigate combination of a MAMBA $B_0$ step field array coil with dual simultaneous slice excitation and x2 and x4 SENSE in-plane $B_1$ sensitivity encoding using a four channel phased array receiver coil to produce up to an eightfold increase in image throughput and qualitatively compare the images with conventionally sampled images. This combination of parallel encoding methods is referred to as $B_1$ Array Combined with Multiple Acquisition Micro $B_0$ Array imaging ($B_1$AC-MAMBA, pronounced 'Black Mamba', for short). The $B_1$AC-MAMBA technique is applicable in situations when the length of a physical entity is much greater than its diameter as in scanning limbs or in whole body screening of disease.

As will be understood by those skilled in the art $B_1$ traditionally refers to the transmit section of the radio frequency field. In the present context $B_1$ is also to be construed as the much weaker field generated through the radio frequency receiver coils by the precessing magnetization during data acquisition.

Methods and Apparatus

A MAMBA stepped $B_0$ coil was constructed on a 550× 105 mm former to produce six uniform field steps spaced by approximately 70 mm. Details of the coil design are given in the earlier figures and associated description. The coil was placed centrally along the magnet $B_0$ axis and inside a flexible four coil body phased array in a 1.5 Tesla Infinion whole body MR system (Philips Medical Systems, Cleveland, USA). FIG. 53 schematically illustrates the combined parallel slice imaging MAMBA $B_0$ step field coil located inside the four-channel phased array coil together with the positions of the two simultaneously excited slices. The diameter of the MAMBA coil was 105 mm and the approximate diameter of the flex body array coil was 380 mm although the coil was positioned in a slightly elliptical configuration, which meant two of the coil elements, were closer to the arm than the other two. The effects of this can be seen in the sensitivity maps where two of the coils have significantly worse SNR than the others. Only five of the seven MAMBA current loops are shown for clarity.

The MAMBA coil was positioned so induced eddy currents were minimised by cancellation of effects from positive and negative gradient fields about iso-centre of the magnet. Current of 1 A was supplied to the coil using a regulated laboratory power supply on a filtered mains outlet within the screened room with supply leads looped around ferrite filters to protect the power supply from RF induced transients and a 12 Ohm series resistor to limit induced low frequency currents.

Multiple slice axial T1 weighted images of the arm of a human volunteer were acquired with a dual slice excitation spin echo sequence (TR/TE=300/16 ms, Matrix=128×256, 1 (dual) slice, SLT=5 mm, FOV=150×300 mm, 15.6 KHz acquisition bandwidth, NEX=1). For demonstration purposes, the phase encoding gradient was increased relative to the frequency encode gradient to produce an asymmetric spatial resolution (2:1 aspect ratio) to ensure phase aliasing after under sampling of the data but retaining sufficient frequency bandwidth to accommodate the two frequency shifted slices. The phase direction was sampled normally but then reduced by factors of two or four by eliminating two or three out of four lines in k-space to produce simulated SENSE acceleration. Data acquisition was performed in the presence of the stepped $B_0$ fields to acquire two excited slices simultaneously in a single excitation without aliasing. The MAMBA coil produced only positive field shifts and so both slices moved in to one half of the FOV, effectively limiting the frequency direction to 128 pixels of the FOV. SENSE image reconstruction was performed using in-house software written in Matlab (Mathworks Inc, Natick, Mass.) based on the algorithm of Pruessman, but without fitting of the sensitivity maps (Pruessmann K P, Weiger M, Scheidegger M B, Boesiger P. SENSE: sensitivity encoding for fast MRI. Magn Reson Med. 1999 November; 42(5): 952–62).

FIG. 54 shows a fully sampled axial scan that was acquired through the forearm of a volunteer in the presence of the MAMBA step $B_0$ field to create the sensitivity maps. The sum of squares image reconstructed from all four coils was used to create a noise mask by thresholding, 'closing' and 'opening' procedures (top to bottom respectively). The complex sensitivity maps were estimated from acquisition of a fully sampled data set by first creating a mask through median filtering, thresholding, dilating and eroding a sum of squares reconstructed image as shown in the figure.

Following masking, the complex image from each coil was divided by the sum of squares image created from all four coils to create the sensitivity maps as shown in FIG. 55. The under-sampled data from the four channels of a separate acquisition were then used to created an unaliased image through SENSE reconstruction (Pruessmann K P, Weiger M, Scheidegger M B, Boesiger P. SENSE: sensitivity encoding for fast MRI. Magn Reson Med. 1999 November; 42(5): 952–62; and Pruessmann K P, Weiger M, Bornert P, Boesiger P. Advances in sensitivity encoding with arbitrary k-space trajectories. Magn Reson Med. 2001; 46(4): 638–51). FIG. 55 shows real and imaginary sensitivity maps from all four coils created by dividing the image from each coil by the sum of squares reconstructed image and multiplying by the noise mask calculated in FIG. 54. The two slices were in different regions of $B_1$ sensitivity within the receiver array. Slice 2 shows weaker sensitivity than slice 1 as it is closer to the end of the array coil. The geometry factor 'g' thus varies across the frequency direction for B1AC-MAMBA due to the different positions of the slices visualised within the image plane. Separation of the two simultaneously excited slices could be achieved by cutting along the frequency encode axis.

Images were qualitatively assessed for artefacts, signal to noise ratio, uniformity and resolution in comparison with images reconstructed from the full data set. Written informed consent was obtained prior to acquiring the volunteer scans, which were performed in accordance with local ethical permission.

Results

FIG. 56a illustrates the aliased image reconstructed from the ×2 under sampled data set and FIG. 56b shows aliased images reconstructed from the ×4 phase under sampled data set from the four coils of the phased array. FIG. 57a shows the 'sum of squares' reconstructed image from the full data set for comparison purposes. FIGS. 57b and 57c show the ×2 and ×4 SENSE reconstructed, dual simultaneous slice images (i.e. overall R=4 and R=8) using the calculated sensitivity maps shown in FIG. 55. There is no noise in the background of these images due to the noise masking process used in reconstruction. Because of this, signal to noise ratio was determined by measuring the signal in fat and the noise standard deviation in muscle tissue, although this should only be regarded as an approximation to the true SNR. Maximum signal to noise ratios were 20:1, 14:1 and 6:1 for the SENSE R=1, R=2 and R=4 reconstructions respectively. The signal to noise ratios should follow a square root relationship i.e. 1:0.707:0.5, not taking into account the spatially dependent g-factors, which were not calculated in this preliminary study. The measured values were in the ratio 1:0.7:0.33, which show that the g-factor is significant in reducing SNR, although the estimated SNR values must be regarded with some caution.

This study has demonstrated accelerating scan throughput by a factor of up to eight using combined SENSE and MAMBA. The signal to noise ratio in MAMBA is dependent on the square root of the frequency encode bandwidth required to accommodate the offset slices. In this study, both slices were acquired within a 15.6 KHz frequency bandwidth although the positive frequency shifts from the MAMBA coils moved the centres of the two slices into one half of the frequency space thus limiting the minimum FOV that could be used. For this reason, we used an asymmetric resolution FOV produced by doubling the area of the phase encode gradient. This ensured aliasing of the hand and forearm with the higher R factor, for demonstration purposes. The signal to noise ratio is reduced in SENSE by a factor greater than the square root of the scan time reduction factor R due to reconstruction artefacts and the geometry factor 'g' of the coil array (Pruessmann K P, Weiger M, Scheidegger M B, Boesiger P. SENSE: sensitivity encoding for fast MRI. Magn Reson Med. 1999 November; 42(5): 952–62).

The ratios of measured signal to noise ratios were slightly lower than expected indicating reduction due to spatially dependent noise which can be clearly seen in FIG. 57c. The g-factor for $B_1$AC-MAMBA is complicated by the fact that the simultaneously excited slices are acquired from different regions of the coil and so there is a frequency dependent spatial sensitivity pattern over the acquired images. This can be seen from the lower SNR of slice 2 that was situated closer to the edge of the receiver coil where the sensitivity is lower. Image resolution and uniformity were qualitatively reduced compared to the images acquired from conventional fully sampled array coil scans in line with expectations from the reduced number of phase encode samples. In this preliminary feasibility study, no attempt was made to investigate the effects of noise correlation between channels.

Aliasing artefacts were relatively low for both SENSE reconstructions, although significant aliased noise can be seen in the ×4-accelerated images. Improved image quality could be achieved by creating more sophisticated sensitivity maps by fitting polynomial functions to the sensitivity images to reduce sensitivity noise to negligible levels (Pruessmann K P, Weiger M, Scheidegger M B, Boesiger P. SENSE: sensitivity encoding for fast MRI. Magn Reson Med. 1999 November; 42(5): 952–62). This would also improve edge definition of the images.

The body flex array coil used in this study was not optimal for scanning the hand and forearm, but it was the only array coil available which was large enough to fully include the stepped field coil. On the other hand, the low SNR of the coil was useful for illustrating the effects of noise on the B1AC-MAMBA reconstructions. Ideally the MAMBA coil would be located outside the RF coil so that a smaller receiver array could be used to improve SNR. However, the length of the coil would need to be sufficient to simultaneously sample multiple slices. No significant interaction was found between the stepped $B_0$ and RF coils.

An alternative to parallel slice MAMBA is to use additional sets of RF coil arrays and receiver channels to achieve simultaneous slice separation using the SENSE method. However, this requires N times more receiver channels, where N is the number of simultaneous slices excited. The combination technique introduced here removes this need for large numbers of receiver channels and RF coils. For example, a six step MAMBA $B_0$ coil combined with four receiver channels and RF coils could potentially accelerate scan throughput by a factor of ×24 using twenty fewer receiver channels and coils than an equivalent SENSE only system and with a much less complicated reconstruction procedure. The possibility of MAMBA acceleration factors between 4 and 6 has already been demonstrated (see Interleaved Pulsed MAMBA above) and SENSE with R=4 has been shown experimentally by Pruessmann (Pruessmann K P, Weiger M, Scheidegger M B, Boesiger P. SENSE: sensitivity encoding for fast MRI. Magn Reson Med. 1999 November; 42(5): 952–62) so this combination should indeed be feasible, subject to signal to noise ratio limitations. Preliminary work on phantoms has already demonstrated that 4×4 $B_1$AC-MAMBA images are feasible without significant artefacts.

The spatial balance between $B_1$ and $B_0$ coil arrays requires further study. Static stepped $B_0$ coils do not inductively couple in the same way as radio frequency $B_1$ coils, possibly making large array designs more straightforward. Improved stepped field designs using target field methods may help reduce the length to diameter ratio for MAMBA coils in future.

In summary, combination of $B_0$ and $B_1$ parallel acquisition methodologies offers a range of new options for increasing volumetric scan acquisition rates by large factors although considerable work remains to optimise both the hardware and software for optimal image quality.

FIG. 58, schematically illustrates a preferred embodiment of the main steps involved in acquiring MR images using the $B_1$AC-MAMBA technique. At step 5801 a multiple radio frequency magnetic field array system is configured for use inside or outside a pre-configured MAMBA system. The RF system is required to:

comprise a plurality of RF coils and receivers, the RF system being configured for:

generating rotating RF excitation magnetic fields $B_1$; and receiving RF signals due to precessing nuclear magnetization on multiple spatially distinct radio frequency coils and associated receiver channels, the RF system being configured to operate in accordance with a $B_1$ sensitivity encoding technique.

Depending upon the particular operational configuration (inside or outside) of the B1 array, at step 5802 a 1D MAMBA system is configured accordingly for operation either inside or outside of the pre-configured multiple B1 array system selected. That is, if the multiple B1 array system is configured for use inside the MAMBA system then the 1D MAMBA system is configured, at step 5802, for operation outside the multiple B1 array system or vice versa. Following step 5802, at step 5803 the desired number of parallel slices required is selected and at step 5804, the locations of slices of a given physical entity to be imaged are selected. Following step 5804 the scanner is configured to undertake at least a first pass and then a second pass through steps 5805 to 5810, one pass being for calibration purposes.

In a given pass, at step 5805, the scanner is configured to create required auxiliary $B_0$ magnetic field steps through the appropriate electric current being applied. Following step 5805, at step 5806 the reduced k-space factor is selected that is appropriate to the pass being undertaken. In particular those skilled in the art will appreciate that such a calibration pass is usually to be performed without a reduced k-space factor. At step 5807, the reduced k-space for multiple image slices is simultaneously acquired. Following step 5807, at step 5808 a Fourier transform process is applied to the data from each channel in the B1 array system. Following step 5808, at step 5809 B1 parallel reconstruction for each parallel slice is applied for SENSE reconstruction purposes and following step 5809, at step 5810 the separated image of each slice is displayed. Typically steps 5805 to 5810 are, in a first pass, performed once through so as to obtain the B1 array response—function or sensitivity map.

Following the first pass, the sequence of steps 5805 to 5810 are repeated in a second pass so as to perform the actual $B_1$AC-MAMBA imaging of the physical entity being imaged. The repeat of the sequence of steps 5805 to 5810 is generally indicated at 5812. It should also be noted that the order of steps 5808 and 5809 may be interchanged as indicated at 5811, depending upon the reduction technique used. It will also be readily apparent to those skilled in the art that the sequence of steps 5808 to 5810 may be undertaken in a first pass for imaging a given physical entity being imaged and in a second pass for creation of the response—function or sensitivity map. In other words calibration of the system maybe undertaken either prior to image acquisition or following actual image acquisition. Although the example given makes use of the Fourier Transform method it will be understood by those skilled in the art that various other forms of processing algorithms may be used to obtain the desired effect. In common with the process described in relation to FIG. 15, creation of the auxiliary field steps at step 5805 require it to be ensured that each auxiliary field is separated from the next by an amount greater than the imaging bandwidth.

As already described a calibration pass as regards steps 5805 to 5810 is required. The imaging pass or passes maybe undertaken prior to or after the calibration step. Either one or more imaging passes may be required depending upon the requirements of the particular imaging scenario under consideration. Typically a sequential number of scans may be required, such as for example, if it is desired to undertake a dynamic contrast uptake imaging sequence or if a sequence of images is required so as to determine the nature of changes occurring over a certain time period within the physical entity being imaged. The calibration step provides the "a priori" information about the sensitivity patterns, which are required to recreate the missing data for a given image being acquired.

By comparison with FIG. 15 it will be appreciated by those skilled in the art that steps 5806 and 5807 in $B_1AC$-MAMBA imaging replace step 1504. It will also be noted that selecting a k-space reduction factor R of R=1 in step 5806 reduces the technique to the 1D MAMBA technique of FIG. 15 since then full k-space encoding is selected. Step 5808 is substantially equivalent to step 1505 of FIG. 15 and step 5810 corresponds to step 1506. It will thus be observed that an extra step (step 5809) is included in FIG. 58 as compared with FIG. 15 and this concerns the extra step required for SENSE reconstruction.

Image Acquisition Sequence for B1AC-MAMBA

To acquire MR data using a B1AC-MAMBA imaging sequence the following operations are required in order:

a) Select multiple parallel slices using a conventional imaging gradient and a multiple band excitation pulse, either with a pulsed or a static MAMBA $B_0$ field applied. In the case of a pulsed MAMBA field, the field will be switched off during slice excitation to allow the normal slice selection process to be used and switched on for data collection. The frequencies of the excitation bands must be matched to the net field of either the gradient field alone for pulsed MAMBA (i.e. when the MAMBA field is turned off during slice selection) or the gradient plus the MAMBA field for non-pulsed MAMBA (when the MAMBA field is on during slice selection).

b) Perform phase encoding with increased phase encode step size to account for the reduced number of overall phase encoding steps used for B1 sensitivity encoding.

c) Perform parallel data acquisition from each of the RF coils in the presence of the MAMBA $B_0$ field (which maybe either pulsed or static).

The sensitivity encoding of each slice will depend on the detailed sensitivity of each RF coil at the particular slice location and may vary from slice to slice within the MAMBA field steps. The phase of the signal will also depend on the phase of the RF coil at a particular location as well as the phase induced by the $B_0$ inhomogeneity of the MAMBA coil at a particular location.

As will be understood by those skilled in the art the combination of $B_0$ and $B_1$ encoding requires use of sensitivity maps which take into account the variable radio frequency sensitivities of the receiver coils and residual field inhomogeneity of the stepped fields as a function of the slice offset position. Optimal combination of data sets in the presence of stepped $B_0$ fields also requires specific reconstruction and correction algorithms which account for these residual artefacts, including phase mapping and unwrapping methods.

Combination of $B_0$ and $B_1$ encoding also requires special design of the pulsed $B_0$ and radio frequency $B_1$ coils and supply circuits so they do not interact electromagnetically. Filtered supplies and amplifiers are required so that eddy currents or transient circulating currents are not induced which can potentially generate artefacts on the MR signal.

The increased speed of image acquisition provided by the $B_1AC$-MAMBA technique described is as those skilled in the art will readily appreciate due to:

a. using the 1D MAMBA technique to acquire parallel slices at the same time; and b. using a $B_1$ sensitivity encoding technique to reduce the number of phase encode steps and thereby to reduce the scan time by the equivalent factor.

For the sake of clarity, those skilled in the art will also realise that in relation to the above description of the $B_1AC$-MAMBA technique and the reception step (step 5) detailed in the list of required conditions for detection of an NMR signal (given earlier in the section entitled "Background to the Invention") the following terminology has been used for convenience: the reception process and receiver coils have also been referred to by $B_1$ to denote the fact that they are orthogonal to $B_0$ and are magnetic oscillations corresponding to radio frequency signals. Of course normally $B_1$ is used for denoting the transmit process of step 2.

The $B_1AC$-MAMBA apparatus may, in a preferred embodiment, thus be considered to comprise:

a main magnetic flux source for providing a uniform fixed magnetic field, $B_0$;

an RF system comprising an array of RF coils and receivers, the RF system configured for:

generating at least one rotating RF excitation magnetic field $B_1$; and receiving RF signals due to precessing nuclear magnetization on multiple spatially distinct radio frequency coils and associated receiver channels, the RF system being configured to operate in accordance with a $B_1$ sensitivity encoding technique;

an auxiliary magnetic field means such as the example schematically illustrated in FIG. 53 that is capable of producing at least one auxiliary uniform $B_0$ step magnetic field imaging region within the main $B_0$ magnetic field, the auxiliary magnetic field means configured to operate in combination with the RF coil system and the $B_1$ sensitivity encoding technique, the imaging apparatus thereby providing faster image acquisition than that attributed to the speed up factor provided solely by the $B_1$ sensitivity encoding technique;

a control processor for controlling imaging functionality, collecting image data and effecting data processing of the captured image data the control processor being configured with post processing capability for the $B_1$ sensitivity encoding technique; and an image display means, such as a VDU, for displaying processed image data as resultant images.

Similarly a preferred embodiment of the $B_1AC$-MAMBA method of imaging maybe considered to comprise the steps of:

in relation to the MRI imaging apparatus positioning a physical entity to be imaged in an imaging position;

subjecting the physical entity to the uniform main $B_0$ magnetic field;

selecting the number of parallel slices required and selecting the slice locations;

creating auxiliary $B_0$ step fields to enable simultaneous data acquisition for each of the selected slices;

selecting an acceleration factor for the reduced data set scheme of the $B_1$ sensitivity encoding technique;

substantially simultaneously acquiring the reduced data set for the selected slices by applying a $B_1$ excitation scheme and collecting resultant data signals from the receiver channels;

processing the acquired data from each channel in the $B_1$ RF system such as, for example, using a Fourier Transform based method;

applying $B_1$ parallel reconstruction for each slice; and displaying the frequency separated images of the selected slices.

The sequence of steps associated with operation of the $B_1$AC-MAMBA method and apparatus may be operated interactively under the control of a suitably programmed computer or by hard wired logic circuitry or by a combination of the two.

Those skilled in the art will realize that the examples, test results, preferred embodiments and the like presented above are intended to inform those skilled in the art of the wide range of possibilities for using the techniques which underpin and form part of the present invention.

Furthermore those skilled in the art will appreciate that the techniques described may be applied to image nuclei other than Hydrogen such as, for example 31P, 23Na, 3He, 19F and 129Xe, with the required calculations taking into account the gyromagnetic ratio of the nucleus concerned.

What is claimed is:

1. A parallel magnetic resonance imaging (MRI) apparatus configurable to image a physical entity, said apparatus comprising:

a main magnetic flux source for providing a uniform fixed magnetic field, $B_0$;

an RF array system comprising a plurality of RF coils and receivers, said RF system configured for:

generating at least one rotating RF excitation magnetic field $B_1$; and receiving RF signals due to precessing nuclear magnetization on multiple spatially distinct radio frequency coils and associated receiver channels, said RF system being configured to operate in accordance with a $B_1$ sensitivity encoding technique;

a control processor for controlling imaging functionality, collecting image data and effecting data processing of said captured image data said control processor being configured with post processing capability for said $B_1$ sensitivity encoding technique;

an image display means for displaying processed image data as resultant images; and an auxiliary magnetic field means capable of producing at least one auxiliary uniform $B_0$ step magnetic field imaging region within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique.

2. The apparatus according to claim 1, wherein RF array system is configured outside said auxiliary $B_0$ magnetic field means.

3. The apparatus according to claim 1, wherein said RF array is configured inside said auxiliary $B_0$ magnetic field means.

4. The apparatus according to claim 1, wherein said said auxiliary $B_0$ magnetic field means is configured to generate a plurality of auxiliary uniform $B_0$ step magnetic field imaging regions within said main $B_0$ magnetic field, said auxiliary magnetic field means configured to operate in combination with said $B_1$ RF system and said $B_1$ sensitivity encoding technique.

5. The apparatus according to claim 1, wherein said apparatus comprises means for performing the steps:
(1) selecting the number of parallel slices required and selecting the slice locations;
(2) selecting an acceleration factor for the reduced data set scheme of said $B_1$ sensitivity encoding technique;
(3) substantially simultaneously acquiring the reduced data set for said selected slices by applying $B_1$ excitation scheme and collecting resultant data signals from said receiver channels;
(4) processing said acquired data from each said channel in said $B_1$ system; and
(5) applying $B_1$ parallel reconstruction for each said slice.

6. The apparatus according to claim 1, wherein said $B_1$ sensitivity encoding technique comprises the SENSE technique.

7. The apparatus according to claim 1, wherein said $B_1$ sensitivity encoding technique comprises the SMASH technique.

8. The apparatus according to claim 1, wherein said apparatus comprises means for performing the steps:
(1) selecting the number of parallel slices required and selecting the slice locations;
(2) selecting an acceleration factor for the reduced data set scheme of said $B_1$ sensitivity encoding technique;
(3) substantially simultaneously acquiring the reduced data set for said selected slices by applying $B_1$ excitation scheme and collecting resultant data signals from said receiver channels;
(4) processing said acquired data from each said channel in said $B_1$ system; and
(5) applying $B_1$ parallel reconstruction for each said slice, said steps being for providing required calibration data from the set comprising: [a $B_1$ array sensitivity map; and a $B_1$ response function].

9. The apparatus according to claim 1, wherein a slice selector is provided, said slice selector comprising using a conventional imaging gradient and a multiple band excitation pulse.

10. The apparatus according to claim 1, wherein said apparatus is configured to generate a pulsed MAMBA $B_0$ field is and during application of said $B_1$ excitation scheme said pulsed MAMBA $B_0$ field is configured to be switched off.

11. A parallel magnetic resonance imaging (MRI) apparatus configurable to image a physical entity, said apparatus comprising:

a main magnetic flux source for providing a uniform fixed magnetic field, $B_0$;

a combined parallel RF and auxiliary $B_0$ magnetic field system comprising:

a plurality of RF coils and receivers for generating at least one rotating RF excitation magnetic field $B_1$ and for receiving fields due to processing nuclear magnetization, said RF system being configured to operate in accordance with a $B_1$ sensitivity encoding technique; and an auxiliary magnetic field means capable of producing at least one auxiliary uniform $B_0$ step magnetic field imaging region within said main $B_0$ magnetic field, said auxiliary magnetic field means configure to operate in combination with said RF coil system and said $B_1$ sensitivity encoding technique, said imaging apparatus thereby providing faster image acquisition than that attributed to the speed up factor provided solely by the $B_1$ sensitivity encoding technique;

a control processor for controlling imaging functionality, collecting image data and effecting data processing of said captured image data said control processor being configured with post processing capability for said $B_1$ sensitivity encoding technique; and an image display means for displaying processed data as resultant images.

12. In a parallel magnetic resonance imaging (MRI) apparatus configurable to image a physical entity, said apparatus comprising:

a main magnetic flux source for providing a uniform fixed magnetic field, $B_0$;

an RF system comprising an array of RF coils and receivers, said RF system configured for:

generating at least one rotating RF excitation magnetic field $B_1$; and receiving RF signals due to precessing nuclear magnetization on multiple spatially distinct radio frequency coils and associated receiver channels, said RF system being configured to operate in accordance with a $B_1$ sensitivity encoding technique;

an auxiliary magnetic field means capable of producing at least one auxiliary uniform $B_0$ step magnetic field imaging region within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;

a control processor for controlling imaging functionality, collecting image data and effecting data processing of said captured image data said control processor being configured with post processing capability for said $B_1$ sensitivity encoding technique; and an image display means for displaying processed image data as resultant images, a method of imaging comprising the steps of:

in relation to said imaging apparatus positioning said physical entity in an imaging position;

subjecting said physical entity to said uniform main $B_0$ magnetic field;

selecting the number of parallel slices required and selecting the slice locations;

creating auxiliary $B_0$ step fields to enable simultaneous data acquisition for each of said slices;

selecting an acceleration factor for the reduced data set scheme of said $B_1$ sensitivity encoding technique;

substantially simultaneously acquiring the reduced data set for said selected slices by applying a $B_1$ excitation scheme and collecting resultant data signals from said receiver channels;

processing said acquired data from each said channel in said $B_1$ system;

applying $B_1$ parallel reconstruction for each said slice; and displaying the frequency separated images of said selected slice.

13. The method according to claim 12, wherein said RF array system is configured outside said auxiliary $B_0$ magnetic field means.

14. The method according to claim 12, wherein said RF array is configured inside said auxiliary $B_0$ magnetic field means.

15. The method according to claim 12, wherein said said auxiliary $B_0$ magnetic field means is configured to generate a plurality of auxiliary uniform $B_0$ step magnetic field imaging regions within said main $B_0$ magnetic field, said auxiliary magnetic field means configured to operate in combination with said RF coil system and said $B_1$ sensitivity encoding technique.

16. The method according to claim 12, wherein said $B_1$ sensitivity encoding technique comprises the SENSE technique.

17. The method according to claim 12, wherein said $B_1$ sensitivity encoding technique comprises the SMASH technique.

18. The method according to claim 12, wherein said step of processing said acquired data from each channel in said $B_1$ RF system comprises applying a two dimensional Fourier Transform.

19. The method according to claim 12, wherein said steps of: selecting an acceleration factor for the reduced data set scheme of said $B_1$ sensitivity encoding technique;

substantially simultaneously acquiring the reduced data set for said selected slices;

processing said acquired data from each channel in said $B_1$ system; and applying $B_1$ parallel reconstruction for each said slice;

are undertaken to provide required calibration data.

20. The method according to claim 12, wherein said steps of:

selecting an acceleration factor for the reduced data set scheme of said $B_1$ sensitivity encoding technique:

substantially simultaneously acquiring the reduced data set for said selected slices;

processing said acquired data from each channel in said $B_1$ system; and applying $B_1$ parallel reconstruction for each said slice;

are undertaken to provide required calibration data in the for of a $B_1$ array sensitivity map.

21. The method according to claim 12, wherein said steps of: selecting an acceleration factor for the reduced data set scheme of said $B_1$ sensitivity encoding technique;

substantially simultaneously acquiring the reduced data set for said selected slices;

processing said acquired data from each channel in said $B_1$ system; and applying $B_1$ parallel reconstruction for each said slice;

are undertaken to provide required calibration data in the for of a $B_1$ array response function.

22. The method according to claim 12, wherein:

said step of selecting an acceleration factor for the reduced data set scheme of said $B_1$ sensitivity encoding technique comprises selecting a reduce k-space factor common to all said slices; and said step of substantially simultaneously acquiring the reduced data set for said selected slices comprises acquiring the reduced k-space.

23. The method according to claim 12, wherein said slice selection step comprises use of a conventional imaging gradient and a multiple band excitation pulse.

24. The method according to claim 12, wherein a pulsed MAMBA $B_0$ field is applied and during application of said $B_1$ excitation scheme said pulsed MAMBA $B_0$ field is switched off.

25. The method according to claim 12, wherein said step of selecting the number of parallel slices required comprises selecting two and the step of creating auxiliary $B_0$ step fields to enable simultaneous data acquisition or each of said slices comprises establishing one $B_0$ step field.

26. A parallel magnetic resonance imaging (MRI) apparatus configurable to image a physical entity, said apparatus comprising:
   a main magnetic flux source for providing a uniform fixed magnetic field, $B_0$;
   a combined parallel RF and auxiliary $B_0$ magnetic field system comprising:
      a plurality of RF coils and receivers for generating at least one rotating RF excitation magnetic field $B_1$ and for receiving fields due to processing nuclear magnetization, said RF system being configured to operate in accordance with a $B_1$ sensitivity encoding technique; and
      an auxiliary magnetic field means capable of producing a plurality of interleaved auxiliary uniform $B_0$ step magnetic field imaging regions within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;
   a control processor for controlling imaging functionality, collecting image data and effecting data processing of said captured image data said control processor being configured with post processing capability for said $B_1$ sensitivity encoding technique; and
   an image display means for displaying processed data as resultant images.

27. In a parallel magnetic resonance imaging (MRI) apparatus configurable to image a physical entity, said apparatus comprising:
   a main magnetic flux source for providing a uniform fixed magnetic field, $B_0$;
   an RF system comprising an array of RF coils and receivers, said RF system configured for:
   generating at least one rotating RF excitation magnetic field $B_1$; and
   receiving RF signals due to precessing nuclear magnetization on multiple spatially distinct radio frequency coils and associated receiver channels, said RF system being configured to operate in accordance with a $B_1$ sensitivity encoding technique;
   an auxiliary magnetic field means capable of producing a plurality of interleaved uniform auxiliary $B_0$ step magnetic field imaging regions within said main $B_0$ magnetic field, said auxiliary magnetic field means configured to operate in comb nation with said RF coil system and said $B_1$ sensitivity encoding technique, said imaging apparatus thereby providing faster image acquisition than that attributed to the speed up factor provided solely by the $B_1$ sensitivity encoding technique;
   a control processor for controlling imaging functionality, collecting image data and effecting data processing of said captured image data said control processor being configured with post processing capability for said $B_1$ sensitivity encoding technique; and
   an image display means for displaying processed image data as resultant images, a method of imaging comprising the steps of:
   in relation to said imaging apparatus positioning said physical entity in an imaging position;
   subjecting said physical entity to said uniform main $B_0$ magnetic field;
   selecting the number of parallel slices required and selecting the slice locations;
   creating auxiliary $B_0$ step fields to enable simultaneous data acquisition for each of said slices;
   selecting an acceleration factor for the reduced data set scheme of said $B_1$ sensitivity encoding technique;
   substantially simultaneously acquiring the reduced data set for said selected slices by applying a $B_1$ excitation scheme and collecting resultant data signals from said receiver channels;
   processing said acquired data from each said channel in said $B_1$ system;
   applying $B_1$ parallel reconstruction for each said slice; and
   displaying the frequency separated images of said selected slice.

28. A computer program configured for use with a parallel magnetic resonance imaging (MRI) apparatus wherein said apparatus comprises:
   a main magnetic flux source for providing a uniform fixed magnetic field, $B_0$;
   an RF system comprising an array of RF coils and receivers, said RF system configured for:
   generating at least one rotating RF excitation magnetic field $B_1$; and receiving RF signals due to precessing nuclear magnetization on multiple spatially distinct radio frequency coils and associated receiver channels, said RF system being configured to operate in accordance with a $B_1$ sensitivity encoding technique;
   an auxiliary magnetic field means capable of producing at least one auxiliary uniform $B_0$ step magnetic field imaging region within said main $B_0$ magnetic field, said auxiliary magnetic field means configured to operate in combination with said RF coil system and said $B_1$ sensitivity encoding technique, said imaging apparatus thereby providing faster image acquisition than that attributed to the speed up factor provided solely by the $B_1$ sensitivity encoding technique;
   a control processor for controlling imaging functionality, collecting image data and effecting data processing of said captured image data said control processor being configured with post processing capability for said $B_1$ sensitivity encoding technique; and
   an image display means for displaying processed image data as resultant images,
   said computer program configured to interactively control in relation to the imaging method steps of:
   positioning said physical entity in an imaging position;
   subjecting said physical entity to said uniform main $B_0$ magnetic field;
   selecting the number of parallel slices required and selecting the slice locations;
   creating auxiliary $B_0$ step fields to enable simultaneous data acquisition for each of said slices;
   selecting an acceleration factor for the reduced data set scheme of said $B_1$ sensitivity encoding technique;
   substantially simultaneously acquiring the reduced data set for said selected slices by applying a $B_1$ excitation scheme and collecting resultant data signals from said receiver channels;

processing said acquired data from each said channel in said $B_1$ system:

applying $B_1$ parallel reconstruction for each said slice; and displaying the frequency separated images of said selected slice.

29. An MRI apparatus configured to provide three-dimensional MR imaging, said apparatus comprising:

a 1D Multiple Acquisition Micro $B_0$ (MAMBA) array of imaging elements configured to provide a plurality of main auxiliary $B_0$ step field regions within the main $B_0$ magnetic field, said main auxiliary $B_0$ step field regions being spatially configured along the direction of the main magnetic field; and a plurality of 2D Multiple Acquisition Micro $B_0$ arrays of imaging elements, each said 2D Multiple Acquisition Micro $B_0$ array being configured to operate in conjunction with a said main auxiliary $B_0$ step field region, wherein:

said imaging elements of said arrays are each associated with a different absolute resonance frequency.

30. An imaging apparatus according to claim 29, wherein each said 2D array is configured to operate in relation to a different imaging element of said 1D MAMBA array.

31. An imaging apparatus according to claim 29, wherein each said 2D array is located substantially within a 1D array imaging element.

32. An imaging apparatus according to claim 29, wherein said 1D array is formed from a coil configured to conduct electric current.

33. An imaging apparatus according to claim 29, wherein said imaging elements of a said 2D array each comprise an electric current carrying coil.

34. An imaging apparatus according to claim 29, wherein said plurality of main auxiliary $B_0$ step field regions is interleaved.

35. A method of three dimensional MR imaging comprising the steps of:

configuring a 1D Multiple Acquisition Micro $B_0$ (MAMBA) array of imaging elements to provide a plurality of main auxiliary $B_0$ step field regions within the main $B_0$ magnetic field, said main auxiliary $B_0$ step field regions being spatially configured along the direction of the main magnetic field;

configuring a plurality of 2D Multiple Acquisition Micro $B_0$ arrays of imaging elements, each said 2D Multiple Acquisition Micro $B_0$ array being configured to operate in conjunction with a said main auxiliary $B_0$ step field region; and ensuring that said imaging elements of said arrays are each associated with a different absolute resonance frequency.

36. A three-dimensional imaging apparatus for use in conjunction with an MRI scanner in imaging a physical entity, said apparatus comprising:

a first array of 1D MAMBA imaging elements configured to provide a plurality of main auxiliary uniform $B_0$ step magnetic field imaging regions within the main $B_0$ magnetic field of said scanner; and a plurality of 2D imaging element arrays, wherein:

each said 2D array is associated with a said 1D MAMBA imaging element, a said 2D array functioning to provide sub-auxiliary $B_0$ magnetic field steps within a said main auxiliary field step; and each said element of a said 2D array is associated with a unique magnetic resonance frequency corresponding to a pre-determined physical location of a particular imaging element of a said 2D array.

37. An apparatus according to claim 36, wherein said $B_0$ sub-auxiliary magnetic field steps are distributed within the x-y imaging plane.

* * * * *